(12) United States Patent
Pacala et al.

(10) Patent No.: US 12,072,237 B2
(45) Date of Patent: Aug. 27, 2024

(54) MULTISPECTRAL RANGING AND IMAGING SYSTEMS

(71) Applicant: Ouster, Inc., San Francisco, CA (US)

(72) Inventors: Angus Pacala, San Francisco, CA (US); Mark Frichtl, San Francisco, CA (US)

(73) Assignee: Ouster, Inc., San Francisco, CA (US)

( * ) Notice: Subject to any disclaimer, the term of this patent is extended or adjusted under 35 U.S.C. 154(b) by 0 days.

(21) Appl. No.: 18/328,479

(22) Filed: Jun. 2, 2023

(65) Prior Publication Data

US 2023/0384153 A1 Nov. 30, 2023

Related U.S. Application Data

(60) Continuation of application No. 17/929,876, filed on Sep. 6, 2022, now Pat. No. 11,733,092, which is a
(Continued)

(51) Int. Cl.
*G01J 1/42* (2006.01)
*G01J 3/02* (2006.01)
(Continued)

(52) U.S. Cl.
CPC ........... *G01J 1/4204* (2013.01); *G01J 3/0224* (2013.01); *G01J 3/46* (2013.01); *G01J 3/51* (2013.01);
(Continued)

(58) Field of Classification Search
CPC ...... G01J 1/4204; G01J 3/0205; G01J 3/0208; G01J 3/0229; G01J 3/0243; G01J 3/0294;
(Continued)

(56) References Cited

U.S. PATENT DOCUMENTS 4,358,851 A 11/1982 Scifres et al.
4,634,272 A 1/1987 Endo
(Continued)

FOREIGN PATENT DOCUMENTS

CN 102317951 A 1/2012
CN 102483353 A 5/2012
(Continued)

OTHER PUBLICATIONS

"Aperture", Wikipedia, Available online at: https://en.wikipedia.org/w/index.php?title=Aperture&oldid=844039834, Jun. 2, 2018, pp. 1-9.
(Continued)

*Primary Examiner* — Kevin K Pyo
(74) *Attorney, Agent, or Firm* — Kilpatrick Townsend & Stockton LLP

(57) ABSTRACT

A multispectral sensor array can include a combination of ranging sensor channels (e.g., LIDAR sensor channels) and ambient-light sensor channels tuned to detect ambient light having a channel-specific property (e.g., color). The sensor channels can be arranged and spaced to provide multispectral images of a field of view in which the multispectral images from different sensors are inherently aligned with each other to define an array of multispectral image pixels. Various optical elements can be provided to facilitate imaging operations. Light ranging/imaging systems incorporating multispectral sensor arrays can operate in rotating and/or static modes.

16 Claims, 43 Drawing Sheets

Related U.S. Application Data division of application No. 16/534,855, filed on Aug. 7, 2019, now Pat. No. 11,473,969.

(60) Provisional application No. 62/877,778, filed on Jul. 23, 2019, provisional application No. 62/744,540, filed on Oct. 11, 2018, provisional application No. 62/726,810, filed on Sep. 4, 2018, provisional application No. 62/716,900, filed on Aug. 9, 2018.

(51) Int. Cl.
| | |
|---|---|
| *G01J 3/46* | (2006.01) |
| *G01J 3/51* | (2006.01) |
| *G01S 7/481* | (2006.01) |
| *G01S 7/4863* | (2020.01) |
| *G01S 7/4865* | (2020.01) |
| *G01S 17/86* | (2020.01) |
| *G01S 17/89* | (2020.01) |
| *G01S 17/931* | (2020.01) |
| *H01L 31/02* | (2006.01) |
| *G01S 17/88* | (2006.01) |

(52) U.S. Cl.
CPC .......... *G01S 7/4815* (2013.01); *G01S 7/4817* (2013.01); *G01S 7/4863* (2013.01); *G01S 7/4865* (2013.01); *G01S 17/86* (2020.01); *G01S 17/89* (2013.01); *G01S 17/931* (2020.01); *H01L 31/02027* (2013.01); *G01S 17/88* (2013.01)

(58) Field of Classification Search
CPC ............ G01J 3/2803; G01J 2003/2813; G01S 7/4816; G01S 7/4863; G01S 17/88; G01S 17/894; G01S 17/90
See application file for complete search history.

(56) References Cited

U.S. PATENT DOCUMENTS

| | | |
|---|---|---|
| 4,676,599 A | 6/1987 | Cruz |
| 4,702,600 A | 10/1987 | Handrich et al. |
| 4,744,667 A | 5/1988 | Fay et al. |
| 4,851,664 A | 7/1989 | Rieger |
| 5,267,016 A | 11/1993 | Meinzer et al. |
| 5,288,992 A | 2/1994 | Fohl |
| 5,760,899 A | 6/1998 | Eismann |
| 5,982,552 A | 11/1999 | Nakama et al. |
| 6,014,232 A | 1/2000 | Clarke |
| 6,133,989 A | 10/2000 | Stettner et al. |
| 6,255,133 B1 | 7/2001 | Ormond et al. |
| 6,374,024 B1 | 4/2002 | Tijima |
| 6,414,746 B1 | 7/2002 | Stettner et al. |
| 6,690,019 B2 | 2/2004 | Stettner et al. |
| 6,721,262 B1 | 4/2004 | Jordache et al. |
| 7,091,462 B2 | 8/2006 | Wilson et al. |
| D531,525 S | 11/2006 | Dold et al. |
| 7,170,542 B2 | 1/2007 | Hanina et al. |
| 7,295,298 B2 | 11/2007 | Willhoeft et al. |
| 7,345,271 B2 | 3/2008 | Boehlau et al. |
| 7,421,159 B2 | 9/2008 | Yang et al. |
| 7,433,042 B1 | 10/2008 | Cavanaugh et al. |
| 7,808,706 B2 | 10/2010 | Fadel et al. |
| 7,848,478 B1 | 12/2010 | Huffman et al. |
| 7,969,558 B2 | 6/2011 | Hall |
| 8,013,983 B2 | 9/2011 | Lin et al. |
| 8,089,618 B2 | 1/2012 | Yang |
| 8,130,367 B2 | 3/2012 | Stettner et al. |
| 8,139,116 B2 | 3/2012 | Murayama |
| D659,030 S | 5/2012 | Anselment et al. |
| 8,319,949 B2 | 11/2012 | Cantin et al. |
| 8,330,840 B2 | 12/2012 | Lenchenkov |
| 8,374,405 B2 | 2/2013 | Lee et al. |
| 8,384,997 B2 | 2/2013 | Shpunt et al. |
| 8,494,252 B2 | 7/2013 | Freedman et al. |
| 8,633,431 B2 | 1/2014 | Kim |
| 8,675,181 B2 | 3/2014 | Hall |
| 8,717,488 B2 | 5/2014 | Shpunt et al. |
| 8,742,325 B1 | 6/2014 | Droz et al. |
| 8,743,176 B2 | 6/2014 | Stettner et al. |
| 8,761,495 B2 | 6/2014 | Freedman et al. |
| 8,767,190 B2 | 7/2014 | Hall |
| 8,829,406 B2 | 9/2014 | Akerman et al. |
| 8,836,922 B1 | 9/2014 | Pennecot et al. |
| 8,848,039 B2 | 9/2014 | Spektor et al. |
| 8,901,541 B2 | 12/2014 | Nishiyama et al. |
| 9,041,915 B2 | 5/2015 | Earhart et al. |
| 9,063,549 B1 | 6/2015 | Pennecot |
| 9,071,763 B1 | 6/2015 | Templeton et al. |
| 9,086,273 B1 | 7/2015 | Gruver et al. |
| 9,111,444 B2 | 8/2015 | Kaganovich |
| 9,157,790 B2 | 10/2015 | Shpunt et al. |
| 9,164,511 B1 | 10/2015 | Ferguson et al. |
| 9,176,051 B2 | 11/2015 | Mappes et al. |
| 9,229,109 B2 | 1/2016 | Stettner et al. |
| 9,264,676 B2 | 2/2016 | Cohen et al. |
| 9,285,464 B2 | 3/2016 | Pennecot et al. |
| 9,285,477 B1 | 3/2016 | Smith et al. |
| 9,299,731 B1 | 3/2016 | Lenius et al. |
| 9,354,369 B2 | 5/2016 | Hendrix et al. |
| 9,368,936 B1 | 6/2016 | Lenius et al. |
| 9,369,689 B1 | 6/2016 | Tran et al. |
| 9,383,753 B1 | 7/2016 | Templeton et al. |
| 9,425,654 B2 | 8/2016 | Lenius et al. |
| 9,435,891 B2 | 9/2016 | Oggier |
| 9,470,520 B2 | 10/2016 | Schwarz et al. |
| 9,489,601 B2 | 11/2016 | Fairfield et al. |
| 9,525,863 B2 | 12/2016 | Nawasra et al. |
| 9,529,079 B1 | 12/2016 | Droz et al. |
| 9,551,791 B2 | 1/2017 | Van Den Bossche et al. |
| 9,992,477 B2 | 6/2018 | Pacala et al. |
| 10,063,849 B2 | 8/2018 | Pacala et al. |
| 10,183,541 B2 | 1/2019 | Van Den Bossche et al. |
| 10,222,458 B2 | 3/2019 | Pacala et al. |
| 10,222,475 B2 | 3/2019 | Pacala et al. |
| 10,750,136 B2 | 8/2020 | Kaizu et al. |
| 2002/0072684 A1 | 6/2002 | Stearns |
| 2003/0006676 A1 | 1/2003 | Smith et al. |
| 2003/0047752 A1 | 3/2003 | Campbell et al. |
| 2004/0061502 A1 | 4/2004 | Hasser |
| 2004/0223071 A1 | 11/2004 | Wells et al. |
| 2005/0030409 A1 | 2/2005 | Matherson et al. |
| 2006/0244851 A1 | 11/2006 | Cartlidge |
| 2007/0007563 A1 | 1/2007 | Mouli |
| 2007/0060806 A1 | 3/2007 | Hunter et al. |
| 2007/0228262 A1 | 10/2007 | Cantin et al. |
| 2008/0153189 A1 | 6/2008 | Plaine et al. |
| 2009/0016642 A1 | 1/2009 | Hart |
| 2009/0040629 A1 | 2/2009 | Bechtel et al. |
| 2009/0179142 A1 | 7/2009 | Duparre et al. |
| 2009/0295910 A1 | 12/2009 | Mir et al. |
| 2010/0008588 A1 | 1/2010 | Feldkhun et al. |
| 2010/0020306 A1 | 1/2010 | Hall |
| 2010/0110275 A1 | 5/2010 | Mathieu |
| 2010/0123893 A1 | 5/2010 | Yang |
| 2010/0204964 A1 | 8/2010 | Pack et al. |
| 2011/0025843 A1 | 2/2011 | Oggier et al. |
| 2011/0032398 A1 | 2/2011 | Lenchenkov |
| 2011/0037849 A1 | 2/2011 | Niclass et al. |
| 2011/0069189 A1* | 3/2011 | Venkataraman ....... H04N 25/74 |
| | | 348/E5.024 |
| 2011/0116262 A1 | 5/2011 | Marson |
| 2011/0216304 A1 | 9/2011 | Hall |
| 2011/0235017 A1 | 9/2011 | Iwasaki |
| 2012/0044476 A1 | 2/2012 | Earhart et al. |
| 2012/0140109 A1 | 6/2012 | Shpunt et al. |
| 2012/0154914 A1 | 6/2012 | Moriguchi et al. |
| 2012/0182464 A1 | 7/2012 | Shpunt et al. |
| 2012/0287417 A1 | 11/2012 | Mimeault |
| 2012/0320164 A1 | 12/2012 | Lipton |
| 2013/0044310 A1 | 2/2013 | Mimeault |
| 2013/0141549 A1 | 6/2013 | Beers et al. |
| 2013/0206967 A1 | 8/2013 | Shpunt et al. |

(56) References Cited

U.S. PATENT DOCUMENTS

| | | |
|---|---|---|
| 2013/0294089 A1 | 11/2013 | Freedman et al. |
| 2013/0300840 A1 | 11/2013 | Borowski |
| 2014/0118335 A1 | 5/2014 | Gurman |
| 2014/0118493 A1 | 5/2014 | Sali et al. |
| 2014/0153001 A1 | 6/2014 | Chayat et al. |
| 2014/0158900 A1 | 6/2014 | Yoon et al. |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0269796 A1 | 9/2014 | Geske et al. |
| 2014/0285628 A1 | 9/2014 | Shpunt et al. |
| 2014/0291491 A1 | 10/2014 | Shpunt et al. |
| 2014/0313519 A1 | 10/2014 | Shpunt et al. |
| 2014/0375977 A1 | 12/2014 | Ludwig et al. |
| 2014/0376092 A1 | 12/2014 | Mor |
| 2015/0002636 A1 | 1/2015 | Brown |
| 2015/0131080 A1 | 5/2015 | Retterath et al. |
| 2015/0184999 A1 | 7/2015 | Stettner |
| 2015/0192677 A1 | 7/2015 | Yu et al. |
| 2015/0292948 A1 | 10/2015 | Goldring et al. |
| 2015/0293224 A1 | 10/2015 | Eldada et al. |
| 2015/0316473 A1 | 11/2015 | Kester et al. |
| 2015/0355470 A1 | 12/2015 | Herschbach |
| 2015/0358601 A1 | 12/2015 | Oggier |
| 2015/0378241 A1 | 12/2015 | Eldada |
| 2015/0379371 A1 | 12/2015 | Yoon et al. |
| 2016/0003946 A1 | 1/2016 | Gilliland et al. |
| 2016/0047895 A1 | 2/2016 | Dussan |
| 2016/0047896 A1 | 2/2016 | Dussan |
| 2016/0047897 A1 | 2/2016 | Dussan |
| 2016/0047898 A1 | 2/2016 | Dussan |
| 2016/0047899 A1 | 2/2016 | Dussan |
| 2016/0047900 A1 | 2/2016 | Dussan |
| 2016/0047901 A1 | 2/2016 | Pacala et al. |
| 2016/0047903 A1 | 2/2016 | Dussan |
| 2016/0049765 A1 | 2/2016 | Eldada |
| 2016/0097858 A1 | 4/2016 | Mundhenk et al. |
| 2016/0150963 A1 | 6/2016 | Roukes et al. |
| 2016/0161332 A1 | 6/2016 | Townsend |
| 2016/0161600 A1 | 6/2016 | Eldada et al. |
| 2016/0218727 A1 | 7/2016 | Maki |
| 2016/0265902 A1 | 9/2016 | Nawasra et al. |
| 2016/0291134 A1 | 10/2016 | Droz et al. |
| 2016/0306032 A1 | 10/2016 | Schwarz et al. |
| 2016/0327779 A1 | 11/2016 | Hillman |
| 2016/0328619 A1 | 11/2016 | Yi et al. |
| 2017/0146640 A1 | 5/2017 | Hall et al. |
| 2017/0219426 A1 | 8/2017 | Pacala et al. |
| 2017/0219695 A1 | 8/2017 | Hall et al. |
| 2017/0269197 A1 | 9/2017 | Hall et al. |
| 2017/0269198 A1 | 9/2017 | Hall et al. |
| 2017/0269209 A1 | 9/2017 | Hall et al. |
| 2017/0269215 A1 | 9/2017 | Hall et al. |
| 2017/0289524 A1 | 10/2017 | Pacala et al. |
| 2017/0339329 A1 | 11/2017 | Lee et al. |
| 2017/0350983 A1 | 12/2017 | Hall et al. |
| 2018/0059222 A1 | 3/2018 | Pacala et al. |
| 2018/0067209 A1 | 3/2018 | Bishop et al. |
| 2018/0069838 A1 | 3/2018 | Lee et al. |
| 2018/0136042 A1 | 5/2018 | Goldring et al. |
| 2018/0143307 A1 | 5/2018 | Steinberg et al. |
| 2018/0152691 A1 | 5/2018 | Pacala et al. |
| 2018/0299554 A1 | 10/2018 | Van Dyck et al. |
| 2018/0329035 A1 | 11/2018 | Pacala et al. |
| 2018/0329060 A1 | 11/2018 | Pacala et al. |
| 2018/0329061 A1 | 11/2018 | Pacala et al. |
| 2018/0329062 A1 | 11/2018 | Pacala et al. |
| 2018/0329066 A1 | 11/2018 | Pacala |
| 2018/0359460 A1 | 12/2018 | Pacala et al. |
| 2019/0011556 A1 | 1/2019 | Pacala et al. |
| 2019/0011561 A1 | 1/2019 | Pacala et al. |
| 2019/0011562 A1 | 1/2019 | Pacala et al. |
| 2019/0011567 A1 | 1/2019 | Pacala et al. |
| 2019/0018111 A1 | 1/2019 | Pacala et al. |
| 2019/0064355 A1 | 2/2019 | Pacala et al. |
| 2019/0146088 A1 | 5/2019 | Pacala et al. |
| 2020/0116836 A1 | 4/2020 | Pacala et al. |

FOREIGN PATENT DOCUMENTS

| | | |
|---|---|---|
| CN | 102741671 A | 10/2012 |
| CN | 105704463 A | 6/2016 |
| CN | 106575035 A | 4/2017 |
| CN | 107076611 A | 8/2017 |
| CN | 107667527 A | 2/2018 |
| DE | 102014224857 A1 | 6/2016 |
| EP | 2124069 A1 | 11/2009 |
| EP | 3045935 A1 | 7/2016 |
| EP | 3002548 B1 | 9/2016 |
| EP | 3316000 A1 | 5/2018 |
| JP | 036407 A | 1/1991 |
| JP | 0749417 A | 2/1995 |
| JP | 2008008700 A | 1/2008 |
| JP | 2010035168 A | 2/2010 |
| JP | 2010249626 A | 11/2010 |
| JP | 2011199798 A | 10/2011 |
| JP | 2014195296 A | 10/2014 |
| KR | 20120110614 A | 10/2012 |
| KR | 20140111017 A | 9/2014 |
| RU | 2540154 C2 | 2/2015 |
| RU | 170789 U1 | 5/2017 |
| TW | 201634953 A | 10/2016 |
| TW | I576617 B | 4/2017 |
| WO | 9810402 A1 | 3/1998 |
| WO | 2010093806 A1 | 9/2010 |
| WO | 2011015196 A1 | 2/2011 |
| WO | 2011027260 A1 | 3/2011 |
| WO | 2011064403 A1 | 6/2011 |
| WO | 2015052616 A1 | 4/2015 |
| WO | 2015198331 A1 | 12/2015 |
| WO | 2016071909 A1 | 5/2016 |
| WO | 2016116733 A1 | 7/2016 |
| WO | 2016125165 A2 | 8/2016 |
| WO | 2016160930 A1 | 10/2016 |
| WO | 2017044204 A1 | 3/2017 |
| WO | 2017132704 A1 | 8/2017 |
| WO | 2018057084 A1 | 3/2018 |
| WO | 2018065426 A1 | 4/2018 |
| WO | 2018065427 A1 | 4/2018 |
| WO | 2018065428 A2 | 4/2018 |
| WO | 2018065429 A1 | 4/2018 |
| WO | 2018074064 A1 | 4/2018 |
| WO | 2018122415 A1 | 7/2018 |
| WO | 2018197441 A1 | 11/2018 |

OTHER PUBLICATIONS

"HDL-32E", Data Sheet 2010, Velodyne Lidar, Incorporated, Available Online at: http://pdf.directindustry.com/pdf/velodynelidar/hdl-32e-datasheet/182407-676098.html, 2017, 2 pages.

"HDL-32E", User's Manual 2010, Velodyne Lidar, Incorporated, Available Online at: https://www.yumpu.com/en/document/view/11661149/hdl-32e-manual-velodyne-lidar, Aug. 2016, 28 pages.

"HDL-32E", Velodyne Lidar, Incorporated, Available Online at: http://www.velodynelidar.com/hdl-32e.html, Dec. 6, 2017, 5 pages.

"HDL-64E", Velodyne Lidar, Incorporated, Available Online at: http://www.velodynelidar.com/hdl-64e.html, Dec. 6, 2017, 7 pages.

"HDL-64E S2", Data Sheet, Velodyne Lidar, Inc., Available Online at: https://velodynelidar.com/lidar/products/brochure/%20HDL64E%20S2%20datasheet_2010_lowres, 2017, 2 pages.

"HDL-64E S2 and S2.1", Velodyne Lidar, Incorporated, User's Manual and Programming Guide, Firmware Version 4, 2007, 43 pages.

"HDL-64E S3", Velodyne Lidar, Incorporated, S3 User's Manual and Programming Guide Revision J, Dec. 2017, 54 pages.

"Puck Hi-Res", Data Sheet, Velodyne Lidar, Incorporated, Sep. 2016, 14 pages.

Puck Hi-Res: High Resolution Real-Time 3D LiDAR Sensor, Velodyne Lidar, Incorporated, Available Online at: http://www.velodynelidar.com/vlp-16-hi-res.html, Dec. 13, 2017, 2 pages.

(56) References Cited

OTHER PUBLICATIONS

"Puck Lite", Data Sheet, Velodyne Lidar, Incorporated, Feb. 2016, 2 pages.
"Puck Lite User Manual", Velodyne Lidar, Incorporated, Feb. 2016, 49 pages.
"Puck Lite: Light Weight Real-Time 3D LiDAR Sensor", Velodyne Lidar, Incorporated, Available Online at: http://velodynelidar.com/vlp-16-lite.html, Apr. 2016, 2 pages.
"Ultra Puck VLP-32C", Velodyne Lidar, Incorporated, Available Online at: http://velodynelidar.com/vlp-32c.html, Dec. 13, 2017, 4 pages.
"Velodyne LiDAR Puck", Velodyne Lidar, Incorporated, User's Manual and Programming Guide, 2014, 49 pages.
"VLP-16: Real-Time 3D LiDAR", Velodyne Lidar, Incorporated, Puck, 2014, 2 pages.
"VLP-16: Velodyne LiDAR Puck", Velodyne Lidar, Incorporated, Available Online at: http://www.velodynelidar.com/vlp-16.html, Dec. 6, 2017, 48 pages.
U.S. Appl. No. 15/419,053, Non-Final Office Action, Mailed on Jul. 28, 2017, 17 pages.
U.S. Appl. No. 16/534,838, Notice of Allowance, Mailed on Mar. 20, 2020, 9 pages.
U.S. Appl. No. 16/534,855, Notice of Allowance, Mailed on Jun. 2, 2022, 13 pages.
U.S. Appl. No. 16/534,885, Notice of Allowance, Mailed on Apr. 8, 2020, 10 pages.
U.S. Appl. No. 16/534,910, Notice of Allowance, Mailed on Mar. 23, 2020, 10 pages.
U.S. Appl. No. 17/929,876, Corrected Notice of Allowance, Mailed on Jun. 22, 2023, 2 pages.
U.S. Appl. No. 17/929,876, Notice of Allowance, Mailed on Mar. 2, 2023, 8 pages.
Bronzi et al., "100000 Frames/s 64×32 Single Photon Detector Array for 2-D Imaging and 3-D Ranging", Institute of Electrical and Electronics Engineers Journal of Selected Topic in Quantum Electronics, vol. 20, No. 6, Aug. 17, 2014, 10 pages.
Charbon et al., "SPAD-Based Sensors", TOF Range-Imaging Cameras, Apr. 9, 2013, pp. 11-38.
Application No. CN202110480647.9, Office Action, Mailed on Nov. 21, 2022, 5 pages.
Application No. CN202110480647.9, Office Action, Mailed on Dec. 9, 2021, 9 pages.
Cova et al., "Single-Photon Counting Detectors", Institute of Electrical and Electronics Engineers Photonics Journal, vol. 3, No. 2, Apr. 2011, pp. 274-277.
El Gamal et al., "CMOS Image Sensors", Institute of Electrical and Electronics Engineers Circuits and Devices Magazine, vol. 21, No. 3, May-Jun. 2005, pp. 6-20.
Application No. EP19847809.1, Extended European Search Report, Mailed on Mar. 10, 2022, 10 pages.
Guerrieri et al., "Two-Dimensional SPAD Imaging Camera for Photon Counting", Institute of Electrical and Electronics Engineers Photonics Journal, vol. 2, No. 5, Aug. 16, 2010, pp. 759-774.
Itzler et al., "Geiger-Mode Avalanche Photodiode Focal Plane Arrays for Three-Dimensional Imaging LADAR", Proceedings of SPIE—The International Society for Optical Engineering, vol. 7808, Aug. 27, 2010, pp. 78080C-1-78080C-14.
Application No. JP2021-506647, Office Action, Mailed on May 9, 2023, 5 pages.
Kilpela et al., "Precise Pulsed Time-of-Flight Laser Range Finder for Industrial Distance Measurements", Review of Scientific Instruments, vol. 72, No. 4, Apr. 2001, pp. 2197-2202.
Kim et al., "A 1.5Mpixel RGBZ CMOS Image Sensor for Simultaneous Color and Range Image Capture", IEEE International Solid-State Circuits Conference, Available online at: http://download.semiconductor.samsung.com/resources/others/A%201.5Mpixel%20RGBZ%20CMOS%20Image%20Sensor%20for%20Simultaneous%20Color%20and%20Range%20Image%20Capture.pdf, 2012, pp. 392-394.
Lapray et al., "Multispectral Filter Arrays: Recent Advances and Practical Implementation", Sensors, vol. 14, No. 11, Nov. 2014, pp. 21626-21659.
Application No. PCT/US2017/039306, International Search Report and Written Opinion, Mailed on Nov. 7, 2017, 21 pages.
PCT/US2017/0393.06, "Invitation to Pay Additional Fees and, Where Applicable, Protest Fee", Aug. 31, 2017, 2 pages.
Application No. PCT/US2017/048379, International Search Report and Written Opinion, Mailed on Nov. 2, 2017, 12 pages.
Application No. PCT/US2019/045783, International Search Report and Written Opinion, Mailed on Dec. 4, 2019, 24 pages.
PCT/US2019/045783, "Invitation to Pay Additional Fees and, Where Applicable, Protest Fee", Sep. 30, 2019, 2 pages.
Application No. RU2021105654, Notice of Decision to Grant, Mailed on Jan. 28, 2022, 25 pages.
Tobin et al., "Comparative Study of Sampling Strategies for Sparse Photon Multispectral Lidar Imaging: Towards Mosaic Filter Arrays", Journal of Optics, vol. 19, No. 9, Aug. 23, 2017, pp. 1-12.
Application No. TW108128284, Office Action, Mailed on May 4, 2023, 14 pages.
Application No. JP2021-506647, Notice of Decision to Grant, Mailed on Dec. 21, 2023, 4 pages.
Application No. EP19847809.1, Office Action, Mailed on Jan. 23, 2024, 4 pages.
Application No. IL280547, Notice of Allowance, Mailed on Jan. 24, 2024, 3 pages.
Application No. KR10-2021-7007171, Office Action, Mailed on Feb. 16, 2024, 12 pages.
AU2019319946, "First Examination Report", May 13, 2024, 7 pages.
TW108128284, "Notice of Decision to Grant", May 2, 2024, 8 pages.

* cited by examiner

MULTISPECTRAL RANGING AND IMAGING SYSTEMS

CROSS-REFERENCE TO RELATED APPLICATIONS

This application is a continuation of U.S. application Ser. No. 17/929,876, filed Sep. 6, 2022, which is a divisional of U.S. application Ser. No. 16/534,855, filed Aug. 7, 2019 (now U.S. Pat. No. 11,473,969), which claims the benefit of the following four provisional applications: U.S. Application No. 62/716,900, filed Aug. 9, 2018; U.S. Application No. 62/726,810, filed Sep. 4, 2018; U.S. Application No. 62/744,540, filed Oct. 11, 2018; and U.S. Application No. 62/877,778, filed Jul. 23, 2019. The disclosures of all four of these provisional applications are incorporated herein by reference.

This application is also related to the following four U.S. patent applications filed on Aug. 7, 2019: U.S. application Ser. No. 16/534,838 (now U.S. Pat. No. 10,739,189); U.S. application Ser. No. 16/534,885 (now U.S. Pat. No. 10,760,957); U.S. application Ser. No. 16/534,895 (now U.S. Pat. No. 11,473,970); and U.S. application Ser. No. 16/534,910 (now U.S. Pat. No. 10,732,032). The disclosures of these four applications are incorporated herein by reference.

BACKGROUND

The present disclosure relates generally to optical imaging systems and in particular to sensor systems with multiple sensor channels tuned to different light characteristics or properties and that include sensor channels usable for ranging.

Light imaging, detection and ranging (LIDAR) systems measure distance to a target by illuminating the target with a pulsed laser light and measuring the reflected pulses with a sensor. Time-of-flight measurements can then be used to make a digital 3D-representation of the target. LIDAR systems can be used for a variety of applications where 3D depth images are useful including archaeology, geography, geology, forestry, mapping, construction, medical imaging, and military applications, among others. Autonomous vehicles can also use LIDAR for obstacle detection and avoidance as well as vehicle navigation.

In applications such as vehicle navigation, depth information (e.g., distance to objects in the environment) is extremely useful but not sufficient to avoid hazards and navigate safely. It is also necessary to identify specific objects, e.g., traffic signals, lane markings, moving objects that may intersect the vehicle's path of travel, and so on. Accordingly, systems such as autonomous vehicles may include both a LIDAR system and another imaging system, such as a visible-light camera that can capture ambient light, including reflected light from objects in the environment as well as direct light from any light source that may be present in the environment. Each imaging system (LIDAR and visible-light) independently provides an image containing either depth or spectral data. For some applications, it is beneficial to align the different images with each other, e.g., by performing image registration to identify the position of the same object in different images. Image registration can be a complex and computationally intensive task. For instance, different imaging systems may have different resolutions and/or frame boundaries, and the alignment between independently constructed and/or independently controlled imaging systems may be inexact.

SUMMARY

Certain embodiments of inventions described herein relate to multispectral sensor arrays that incorporate multiple sensor channel types, including depth channels (e.g., LIDAR sensor channels) and one or more different ambient-light sensor channels, in the same sensor array (which can be, e.g., a monolithic ASIC sensor array). Since the channels of different types are in the same sensor array, the channels can be inherently aligned with each other to high precision. Different channels can be tuned (e.g., using optical filters) to be sensitive to light having specific properties, such as a particular range of wavelengths (which can be a wide or narrow band as desired), a particular polarization property (e.g., linearly polarized in a certain direction, circularly polarized, etc.), or the like. The sensor array can be used in combination with imaging optics to generate images that contain pixel data corresponding to each channel type. Images produced from different sensor types in the same sensor array are "inherently" registered to each other by virtue of the channel alignment in the sensor array. That is, the spatial relationship between pixels (or channels) of different types is established in the design of the sensor array and can be used to map pixel data from different sensor types onto the same pixel location within a field of view.

In some embodiments, some or all of the channel can have a channel-specific (or channel-type-specific) compensating micro-optic that depends on the location of the channel in the array and/or the particular wavelength range to which the channel is tuned. Such micro-optics can be used, e.g., to compensate for chromatic aberration, focal plane curvature, or other optical properties of the bulk imaging optics.

In some embodiments, different ambient-light sensor channels can be tuned to different overlapping wavelength bands (e.g., using optical filters with overlapping passbands), and arithmetic logic circuits can be used to determine light intensity in various wavelength bands based on the measurements in the overlapping wavelength bands.

In some embodiments, a ranging/imaging system can scan a field of view using a multispectral sensor array, e.g., by rotating the sensor array about an axis transverse to the rows. During this motion, a given location in space can be successively imaged by each of the channel types, thereby providing a multispectral image set with inherent registration between imaging modalities (or channels). The spatial relationship of the channels in the array, optical properties of the imaging optics (e.g., a focal length distortion profile of a bulk imaging optic), and the imaging rate relative to motion (e.g., rotation) of the sensor array can be selected so that the data from different channels maps easily onto a uniform grid of pixels representing the field of view.

In some embodiments where the multispectral sensor array is scanned, a group of two or more ambient-light sensor channels in a row can have the same type of optical filter and apertures of subpixel size that are positioned differently for different ambient-light sensor channels in the group. Based on light-intensity measurements (e.g., photon counts) from the ambient-light sensor channels in the group, an ambient-light image with increased resolution in the scanning and/or non-scanning directions can be obtained.

In some embodiments, a "2D" (two-dimensional) multispectral sensor array can be provided, where the array includes a two-dimensional arrangement of multispectral pixels. Each multispectral pixel can include a depth channel along with one or more ambient-light sensor channels. Such arrays can be used in moving (e.g., rotating) ranging/imaging systems as well as in "static" systems, where imaging of the field of view is accomplished without moving the sensor array.

Some embodiments relate to a sensor array with sensor channels arranged in a number of sensor rows. Each sensor row can include a ranging sensor channel (e.g., LIDAR sensor channel) and a set of one or more ambient-light sensor channels. Each ambient-light sensor channel can include an aperture (e.g., to define a field of view for the channel), a photosensor (e.g., one or more single-photon avalanche diodes), a channel-specific optical filter that selectively passes light having a channel-specific property (e.g., a desired color, polarization state, or the like). In some embodiments, some or all of the sensor channels can include a channel-specific micro-optic element to direct light having the channel-specific property through the aperture and toward the photosensor, e.g., compensating for chromatic aberration in a bulk imaging optic that may be placed in front of the array. In some embodiments, the ambient-light sensor channels are multispectral channels that include multiple photosensors tuned (e.g., using patterned optical filters) to detect light having different properties. In some embodiments, the sensor array can include a 2D array of "hybrid" sensor channels that include one group of photosensors configured for depth operation (e.g., LIDAR sensing) and one or more other groups of photosensors configured for sensing of ambient light having various characteristics. Sensor arrays of the kind described herein can be incorporated into light ranging/imaging systems and/or other optical systems.

Some embodiments relate to a light-sensor array having an arrangement of sensor channels and a corresponding arrangement of apertures in an aperture plane. A bulk optic module can be used to direct and focus light from a region being imaged onto the sensor array. If the bulk optic module has a curved focal plane, channel-specific micro-optic elements of varying prescription and/or varying offset distance from the aperture plane can be placed in front of the apertures to correct for an offset between the location of the aperture and a corresponding location on the curved focal plane. Similarly, a light-emitter array can have an arrangement of emitter channels (e.g., narrow-band emitters that produce light at wavelengths usable for LIDAR applications) and a corresponding arrangement of apertures in an aperture plane. A bulk optic module can be used to direct emitted light that passes through the apertures into a region being imaged. If the bulk optic module has a curved focal plane, channel-specific micro-optic elements of varying prescription and/or varying offset distance from the aperture plane can be placed in front of the apertures to correct for an offset between the location of the aperture and a corresponding location on the curved focal plane. In such embodiments, the prescription (e.g., focusing power) and/or a standoff distance of the channel-specific micro-optic elements from the aperture plane can be varied, e.g., as a function of a radial distance from the optical axis in the aperture plane. This can improve the efficiency of light emission and/or light collection. Channel-specific micro-optics to correct for focal plane curvature of a bulk optic module can be employed in light receiving modules and/or light transmitting modules, regardless of the particular characteristics of the light emitters or sensors. In some embodiments where different channels are tuned to emit or receive light of different wavelengths, the channel-specific micro-optic elements can correct for both focal plane curvature and chromatic aberration that may be present in a bulk optic module.

Some embodiments relate to a sensor array having sensor rows. Each sensor row includes a LIDAR sensor channel and a set of one or more ambient-light sensor channels (e.g., one, three, five, six or more). Each ambient-light sensor channel includes a channel input aperture, a photosensor, and a channel-specific optical filter that selectively passes light having a channel-specific property to the photosensor. The photosensor of each ambient-light sensor channel can be, for example, one or more photodiodes, such as one or more single-photon avalanche diodes (SPADs) operated in a photon-counting mode. In some embodiments, each LIDAR sensor channel can also include one or more SPADs operated in a photon-counting mode, and the same type of photosensors can be used for both LIDAR sensor channels and ambient-light sensor channels.

In some embodiments, the set of ambient-light sensor channels can include at least two ambient-light sensor channels, each having a different channel-specific optical filter. For example, the set of ambient-light sensor channels can include a red channel in which the channel-specific optical filter selectively passes red light, a green channel in which the channel-specific optical filter selectively passes green light, and a blue channel in which the channel-specific optical filter selectively passes blue light. As another example, the set of ambient-light sensor channels includes at least five different color channels, wherein the channel-specific optical filter for each of the at least five different color channels selectively passes light having a different range of wavelengths (referred to as a passband). Different channel-specific optical filters can have overlapping passbands or non-overlapping passbands as desired, and a particular optical filter can have a broad passband (e.g., the entire visible light spectrum) or a narrow passband (e.g., 25 nm or less, such as a passband corresponding to the emission spectrum of a typical light-emitting diode (LED)). For instance, a first color channel may have an optical a first channel-specific optical filter that selectively passes light having a first range of wavelengths while a second color channel has a second channel-specific optical filter that selectively passes light having a second range of wavelengths. The second range can correspond to an absorption band of a particular substance, and data from the two color channels can be used in identifying substances.

In some embodiments, ambient-light sensor channels can also be selectively sensitive to properties of light other than wavelength. For example, the set of ambient-light sensor channels can include one or more polarization channels in which the channel-specific optical filter selectively passes light having a particular polarization property. Color channels and polarization channels can be provided in combination to provide information about both spectral and polarization properties of ambient light.

In some embodiments, the ambient-light sensor channels of a row can include a "multispectral" sensor channel, which can include multiple photosensors and a patterned optical filter, with different portions of the patterned optical filter selectively passing light having different properties to different subsets of the photosensors in the multispectral sensor channel. The different portions of the patterned optical filter can include, e.g., a first portion that passes light in a first wavelength band and a second portion that passes light in a second wavelength band (which may be partially overlapping wavelength bands), a portion that passes light having a particular polarization property, and so on.

Sensor channels in the array can be arranged as desired. For example, in embodiments where the set of one or more ambient-light sensor channels includes at least two ambient-light sensor channels, each having a different channel-specific optical filter, the ambient-light sensor channels in a given sensor row can be spaced apart from each other by a uniform pitch. The LIDAR sensor channel in a given sensor row can be spaced apart from a nearest one of the ambient-light sensor channels in the given sensor row by the uniform pitch or by a distance that is an integer multiple of the uniform pitch. Adjacent sensor rows can also be spaced apart from each other by the uniform pitch. This can allow for uniform sampling of object space when the sensor array is used in a scanning operation.

In some embodiments, the sensor array is fabricated as a single ASIC. The ASIC may also include other components, such as a data buffer disposed within the ASIC and configured to store data from two or more of the LIDAR sensor channels and two or more of the ambient-light sensor channels and/or a processing circuit disposed within the ASIC and configured to perform an image processing operation on the data stored in the data buffer.

Some embodiments relate to a ranging/imaging system having a stationary base, a sensor array rotationally coupled to the stationary base, a bulk optical module, and a controller. The sensor array can be a sensor array that includes sensor rows, where each sensor row has a LIDAR sensor channel and a set of one or more ambient-light sensor channels with channel-specific optical filtering. The bulk optical module can be disposed in front of the sensor array and configured to focus incident light on an aperture plane common to the LIDAR sensor channels and the ambient-light sensor channels. The controller can synchronize rotation of the sensor array and operation of the photosensors such that a given location in space relative to the stationary base is successively imaged by the LIDAR sensor channel and each of the ambient-light sensor channels in one of the sensor rows. The controller can also be configured to generate multispectral image pixel data that includes per-pixel light intensity data determined using the ambient-light sensor channels of the sensor array and per-pixel depth data determined using the LIDAR sensor channels of the sensor array. In some embodiments, the ambient-light sensor channels in a given sensor row are spaced apart from each other by a uniform pitch, and the controller is further configured to rotate the ranging/imaging system such that successive imaging operations occur at angular positions separated by a pitch angle corresponding to the uniform pitch. The LIDAR sensor channel in a given sensor row can be spaced apart from a nearest one of the ambient-light sensor channels in the given sensor row by the uniform pitch or by a distance that is an integer multiple of the uniform pitch. In some embodiments, adjacent sensor rows are also spaced apart from each other by the uniform pitch.

Some embodiments relate to a sensor array having a two-dimensional array of hybrid sensor pixels. Each hybrid sensor pixel can include a LIDAR sensor channel and a set of one or more ambient-light sensor channels, with each ambient-light sensor channel being tuned to selectively measure intensity of light having a sensor-specific property. The sensor array can also include readout electronics coupled to each hybrid sensor pixel in the two-dimensional array, and the readout electronics for each hybrid sensor pixel can include: timing circuitry coupled to the LIDAR sensor channel and configured to time arrival of photons at the LIDAR sensor channel and to store data representing photon arrival times in a memory; and counter circuitry coupled to the ambient-light sensor channel and configured to count a number of photons detected at the ambient-light sensor channel and to store photon counts in the memory.

In some embodiments, the two-dimensional array of hybrid sensor pixels is formed as a single ASIC. Each hybrid sensor pixel can include a planar array of photosensors and a patterned optical filter, where different portions of the patterned optical filter selectively pass light having different properties to different subsets of the photosensors in the planar array. The patterned optical filter can be arranged such that a first subset of the photosensors receives infrared light within a narrow passband matched to a wavelength of a LIDAR emitter, thereby providing the LIDAR sensor channel, and a second subset of the photosensors receives visible light from at least a portion of a visible light spectrum, thereby providing one of the ambient-light sensor channels. In some embodiments, the first subset of the photosensors is located in a central region within a pixel area of the hybrid sensor pixel and the second subset of the photosensors are located in a peripheral region around the central region within the pixel area. In some embodiments, the second subset of the photosensors includes two or more photosensors, and the patterned optical filter is further arranged such that each of the two or more photosensors in the second subset receives light having a different property, such as different ranges of wavelengths or different polarization properties.

In some embodiments, the LIDAR sensor channels for the two-dimensional array of hybrid sensor channels are formed as a first ASIC, and the ambient-light sensor channels are formed as a second ASIC that is overlaid on and aligned with the first ASIC. The second ASIC can have a plurality of apertures formed therein to allow light to pass into the LIDAR sensor channels.

Some embodiments relate to a ranging/imaging system that includes a sensor array having a two-dimensional array of hybrid sensor pixels and a controller. Each hybrid sensor pixel can include a planar array of photosensors and a patterned optical filter, where different portions of the patterned optical filter selectively pass light having different properties to different subsets of the photosensors in the planar array. The patterned optical filter can be arranged such that a first subset of the photosensors receives infrared light within a narrow passband matched to a wavelength of a LIDAR emitter, thereby providing the LIDAR sensor channel, and a second subset of the photosensors receives visible light from at least a portion of a visible light spectrum, thereby providing one of the ambient-light sensor channels. The controller can be configured to operate the LIDAR sensor channels and the ambient-light sensor channels such that a given location within a field of view is imaged by the LIDAR sensor channel and the ambient-light sensor channels of one of the hybrid sensor pixels. In some embodiments, the ranging/imaging system also includes an emitter to emit light detectable by the LIDAR sensor channels, and the controller can be further configured to coordinate operation of the emitter with operation of the LIDAR sensor channels to determine a depth measurement for each hybrid sensor pixel. The controller can also be configured to operate the emitter and the LIDAR sensor channels to perform electronic scanning of a field of view such that different portions of the field of view are imaged by different ones of the LIDAR sensor channels at different times.

Some embodiments relate to an imaging system that has a stationary base, a sensor array rotationally coupled to the stationary base, a bulk optical module, and a controller. The sensor array can have a plurality of sensor rows, each sensor row including a set of one or more ambient-light sensor channels, each of which can include a channel input aperture, a photosensor, and a channel-specific optical filter that selectively passes light having a channel-specific property to the photosensor. The bulk optical module can be disposed in front of the sensor array and configured to focus incident light on an aperture plane common to the ambient-light sensor channels. The controller can be configured to synchronize rotation of the sensor array and operation of the photosensors to generate image pixel data that includes light intensity data determined using the ambient-light sensor channels. In some embodiments, the set of one or more ambient-light sensor channels includes at least two ambient-light sensor channels, with different ambient-light sensor channels having different channel-specific optical filters. The ambient-light sensor channels in a given sensor row are spaced apart from each other by a uniform pitch. In some embodiments, adjacent sensor rows are also spaced apart from each other by the same uniform pitch. This can facilitate uniform sampling of a field of view. In some embodiments, the imaging system can also include: a data buffer disposed within the ASIC and configured to store data from two or more of the ambient-light sensor channels; and a processing circuit disposed within the ASIC and configured to perform an image processing operation on the data stored in the data buffer.

Some embodiments relate to an imaging system that includes a sensor array, a bulk optic module, a controller, and multiple channel-specific micro-optic elements. The sensor array can have sensor channels arranged to receive light through corresponding apertures in an aperture plane. The bulk optic module can be disposed in front of the sensor array and configured to focus incident light on the aperture plane to form an image of a field of view. The controller can operate the sensor array to generate image data for the field of view. Each of the channel-specific micro-optic element can be disposed in front of a different one of the apertures and can have an optical prescription that is different for different sensor channels. The optical prescription for a particular one of the channel-specific micro-optic elements can be based at least in part on an optical property of the bulk optic module, such as chromatic aberration (for sensor channels that are color-selective) and/or focal plane curvature (in which case the optical prescription can be a function of radial distance from the optical axis of the bulk optic module). Optical prescriptions can include focal length (or focusing power) and/or standoff distance.

In some embodiments, the sensor channels are arranged in sensor rows, with each sensor row including a LIDAR sensor channel and a set of one or more ambient-light sensor channels, where each ambient-light sensor channel includes a channel input aperture, a photosensor, and a channel-specific optical filter that selectively passes light having a channel-specific property to the photosensor. Channel-specific micro-optic elements can be provided for at least some of the ambient-light sensor channels. For instance, the channel-specific micro-optic element for each ambient-light sensor channel can have a prescription that is based at least in part on the channel-specific optical filter, e.g., to compensate for chromatic aberration of the bulk optic module.

In some embodiments, the sensor channels include LIDAR sensor channels, and at least some of the LIDAR sensor channels can have corresponding channel-specific micro-optic elements with respective optical prescriptions based in part on a LIDAR operating wavelength and in part on an optical characteristic of the bulk optical module.

Some embodiments relate to a LIDAR transmitter device that includes an emitter array, a bulk optic module, and channel-specific micro-optic elements. The emitter array can have a plurality of emitter channels arranged to emit light through a corresponding plurality of apertures in an aperture plane. The bulk optic module can be disposed in front of the emitter array and configured to direct light from the aperture plane into a field of view. The channel-specific micro-optic elements can each be disposed in front of a different one of the apertures and each can have an optical prescription that is different for different emitter channels. The optical prescriptions of the channel-specific micro-optic elements can be based at least in part on an optical property of the bulk optic module. For instance, if the bulk optic module has a curved focal plane, the optical prescription of each of the channel-specific micro-optic elements can compensate for an offset between a location of the aperture and a corresponding location on the curved focal plane, e.g., by using an optical prescription for each channel-specific micro-optic element that is a function of a radial distance in the aperture plane from an optical axis of the bulk optic module to the corresponding aperture. Optical prescriptions can include focal length (or focusing power) and/or standoff distance; accordingly, the channel-specific micro-optic elements disposed in front of different apertures can have optical prescriptions with different focusing power and/or different standoff distances from the aperture plane.

Some embodiments relate to a scanning imaging system for providing an image having a fixed resolution in a scanning direction. The scanning imaging system can include a sensor array, a rotary control system, and a bulk optic module. The sensor array can include a set of sensor channels arranged in two dimensions, where each sensor channel is configured to detect light (with the same characteristics or different characteristics). The rotary control system can be configured to rotate the sensor array in a scanning direction through a sequence of angular measurement positions to obtain a frame of data that represents an image of a field of view, such as a grid of image pixels that are spaced in the scanning direction according to a uniform angular pitch. The bulk optic module can be configured to focus the light toward the sensor array and can have a focal length and a focal length distortion profile that are both tuned to the arrangement of the set of sensor channels such that rotating the sensor array through the uniform angular pitch along the scanning direction shifts a location where a ray is incident on the sensor array from one sensor channel to an adjacent sensor channel.

The set of sensor channels can include various combinations of channel types. For instance, the set of sensor channels can includes a staggered grid of LIDAR sensor channels defining a column that extends in a direction transverse to the scanning direction. In addition (or instead), the set of sensor channels can include one or more ambient-light sensor channel disposed along the scanning direction relative to each of the LIDAR sensor channels.

In some embodiments, the sensor array has a fixed pitch between adjacent sensor channels along the scanning direction, and the bulk optic module has either an F θ focal length distortion profile or an F tan θ focal length distortion profile.

In other embodiments, the sensor array may have a variable distance between adjacent sensor channels. For example, if the focal length distortion profile of the bulk optic module exhibits barrel distortion, a distance between adjacent sensor channels in the sensor array can increase from an edge to a center of the sensor array. Similarly, if the focal length distortion profile of the bulk optic module exhibits pincushion distortion, a distance between adjacent sensor channels in the sensor array can decrease from an edge to a center of the sensor array. Such arrangements can provide uniform sampling of the object space.

Some embodiments relate to a scanning imaging system for providing an image having a fixed resolution in a scanning direction. The scanning imaging system can include a sensor array, a mirror subsystem, and a bulk optic module. The sensor array can include a set of sensor channels arranged in one or two dimensions, each sensor channel being configured to detect light (with the same characteristics or different characteristics). The mirror subsystem can be configured to direct light from different portions of a field of view onto the sensor array at different times such that the sensor array obtains a frame of data representing an image of the field of view, where the frame of data can be, e.g., a grid of image pixels spaced in a scanning direction according to a uniform angular pitch. The bulk optic module can be configured to focus the light toward the sensor array and can have a focal length and a focal length distortion profile that are both tuned to the arrangement of the set of sensor channels such that rotating the sensor array through the uniform angular pitch along the scanning direction shifts a location where a ray is incident on the sensor array from one sensor channel to an adjacent sensor channel.

The set of sensor channels can include various combinations of channel types. For instance, the set of sensor channels can includes a staggered grid of LIDAR sensor channels defining a column that extends in a direction transverse to the scanning direction. In addition (or instead), the set of sensor channels can include one or more ambient-light sensor channel disposed along the scanning direction relative to each of the LIDAR sensor channels.

In some embodiments, the sensor array has a fixed pitch between adjacent sensor channels along the scanning direction, and the bulk optic module has either an F θ focal length distortion profile or an F tan θ focal length distortion profile.

In other embodiments, the sensor array may have a variable distance between adjacent sensor channels. For example, if the focal length distortion profile of the bulk optic module exhibits barrel distortion, a distance between adjacent sensor channels in the sensor array can increase from an edge to a center of the sensor array. Similarly, if the focal length distortion profile of the bulk optic module exhibits pincushion distortion, a distance between adjacent sensor channels in the sensor array can decrease from an edge to a center of the sensor array. Such arrangements can provide uniform sampling of the object space.

Some embodiments relate to a raster-scanning imaging system for providing an image having a fixed resolution by scanning in two dimensions. The raster-scanning imaging system can include a sensor array, a raster scanning mechanism, and a bulk optic module. The sensor array can include a set of sensor channels arranged in one or two dimensions, with each of the sensor channels being configured to detect light. The raster scanning mechanism can be configured to perform a raster scan in one or two dimensions that directs light from different portions of a field of view onto the sensor array at different times such that the sensor array obtains a frame of data representing an image of the field of view, where the frame of data can be, e.g., a two-dimensional grid of image pixels spaced in each of the two dimensions according to a uniform pitch, with both dimensions of the grid of image pixels being larger than the dimensions of the sensor array. The bulk optic module can be configured to focus the light toward the sensor array and can have a focal length and a focal length distortion profile that are both tuned to the arrangement of the set of sensor channels such that the sensor array uniformly samples the field of view.

In some embodiments, the raster scanning can operate by moving the sensor array in two dimensions to point the sensor channels at different portions of the field of view. In other embodiments, the raster scanning mechanism can include a tip-tilt mirror movable in two dimensions to direct light from different portions of a field of view onto the sensor array at different times.

The set of sensor channels can include various combinations of channel types. In some embodiments, the sensor channels include LIDAR sensor channels and may also include ambient-light sensor channels of various types. In other embodiments, the sensor channels can include one or more "hybrid" sensor channels, where each hybrid sensor channel has multiple photosensors and a patterned optical filter wherein different portions of the patterned optical filter selectively pass light having different properties, the patterned optical filter being arranged such that different photosensors receive light having different properties. The patterned optical filter can be further arranged such that a first subset of the plurality of photosensors receives infrared light within a narrow passband matched to a wavelength of a LIDAR emitter and a second subset of the plurality of photosensors receives visible light from at least a portion of a visible light spectrum. As another example, hybrid sensor channels can include: a LIDAR sensor channel disposed on a first sensor channel layer; an aperture layer overlying the first sensor channel layer and having an aperture therein to allow light to enter the LIDAR sensor channel; and ambient-light sensor channels disposed on at least a portion of the aperture layer around the aperture, each ambient-light sensor channel including a photosensor and an optical filter that selectively passes light having a specific property, where the optical filters of different ones of the ambient-light sensor channels selectively pass light having different properties.

In some embodiments, the sensor array of the raster-scanning imaging system has a fixed pitch between sensor channels, and the bulk optic module has either an F tan θ focal length distortion profile or an F θ focal length distortion profile.

Some embodiments relate to a sensor array having multiple sensor rows, a logic circuit, and a controller. Each sensor-row can include a group of two or more enhanced-resolution ambient-light sensor channels sensitive to a range of wavelengths, and each enhanced-resolution ambient-light sensor channel in the group can include: a channel-specific input aperture, wherein the channel-specific input apertures of different enhanced-resolution ambient-light sensor channels in the group expose different portions of a channel area; and a photosensor. The logic circuit can determine multiple subpixel light intensity values based on intensity data from the photosensors in the group of enhanced-resolution ambient-light sensor channels. The controller can be configured to perform a scanning operation that exposes the sensor array to different areas within a field of view at different times such that each ambient-light sensor channel in the group of two or more enhanced-resolution ambient-light sensor channels in a particular row is exposed to a same pixel area within the field of view at different times.

In some embodiments, each enhanced-resolution ambient-light sensor channel in the group can include an optical filter that selectively passes light having a specific property, with the specific property being the same for every enhanced-resolution ambient-light sensor channel in the group.

In some embodiments, the different portions of the channel area exposed by the apertures of different enhanced-resolution ambient-light sensor channels in the group are non-overlapping portions of the channel area. For instance, the group of enhanced-resolution ambient-light sensor channels can include four enhanced-resolution ambient-light sensor channels and the non-overlapping portions can correspond to different quadrants of the channel area.

In other embodiments, the different portions of the channel area exposed by the apertures of different enhanced-resolution ambient-light sensor channels in the group can include overlapping portions of the channel area. An arithmetic logic circuit can be provided to decode intensity values for a set of non-overlapping portions of the channel area based on sensor data from the group of two or more enhanced-resolution ambient-light sensor channels. To facilitate decoding, one (or more) of the enhanced-resolution ambient-light sensor channels in the group can have an aperture that exposes the entire channel area.

In some embodiments, each sensor row further comprises a LIDAR sensor channel spatially registered with the group of enhanced-resolution ambient-light sensor channels. The LIDAR sensor channels can provide a depth image having a first resolution while the enhanced-resolution ambient-light sensor channels provide an intensity image having a second resolution higher than the first resolution in the row-wise direction and/or in a direction transverse to the sensor rows.

Some embodiments relate to a scanning imaging system that includes a sensor array, an arithmetic logic circuit, and a controller. The sensor array can include a group of two or more enhanced-resolution ambient-light sensor channels sensitive to a range of wavelengths, each of which can include: a channel-specific input aperture, where the channel-specific input apertures of different enhanced-resolution ambient-light sensor channels in the group expose different portions of a channel area; a photosensor; and two or more registers to accumulate photon counts from the photosensor during a time interval that is subdivided into two or more time bins, where each of the registers accumulates photon counts during a different one of the time bins. The arithmetic logic circuit can compute a plurality of subpixel light intensity values based on the photon counts accumulated in the plurality of registers of all of the enhanced-resolution ambient-light sensor channels in the group. The controller can be configured to perform a scanning operation that exposes the sensor array to different areas within a field of view at different times such that each ambient-light sensor channel in the group of two or more enhanced-resolution ambient-light sensor channels is exposed to a same pixel area within the field of view at different times.

In some embodiments, each enhanced-resolution ambient-light sensor channel in the group can include an optical filter that selectively passes light having a specific property, with the specific property being the same for every enhanced-resolution ambient-light sensor channel in the group.

In some embodiments, the scanning imaging system can also include a LIDAR sensor channel spatially registered with the group of enhanced-resolution ambient-light sensor channels. The LIDAR sensor channels can provide a depth image having a first resolution while the enhanced-resolution ambient-light sensor channels provide an intensity image having a second resolution higher than the first resolution in one or two dimensions.

The different portions of the channel area exposed by the apertures of different enhanced-resolution ambient-light sensor channels in the group can include overlapping and/or non-overlapping portions of the channel area. For example, the group of two or more enhanced-resolution ambient-light sensor channels can include four ambient-light sensor channels, the two or more registers can include four registers, and the arithmetic logic circuit can compute sixteen subpixel light intensity values. If, for instance, the channel-specific input aperture of a first one of the enhanced-resolution ambient-light sensor channels exposes a quarter of the channel area and wherein the respective channel-specific input apertures of a second, a third, and a fourth one of the enhanced-resolution ambient-light sensor channels each exposes a different portion of the quarter of the channel area, the sixteen subpixel light intensity values can provide a four-by-four grid corresponding to the channel area.

Some embodiments relate to a sensor array having multiple sensor rows. Each sensor row can include a set of at least two ambient-light sensor channels, and each ambient-light sensor channel in the set can include a channel input aperture, a photosensor, and a channel-specific optical filter that selectively passes light having a channel-specific property to the photosensor. The set of at least two ambient-light sensor channels in each sensor row can include at least two overlapping ambient-light sensor channels having respective channel-specific optical filters for which the channel-specific property of the light overlaps. The sensor array can also include an arithmetic logic circuit that can decode signals from the three or more ambient-light sensor channels into respective light intensity levels for light having a plurality of non-overlapping properties.

In some embodiments, channel-specific property includes a wavelength range of light. The set of at least two overlapping ambient-light sensor channels includes a first color channel having a first channel-specific optical filter that selectively passes light having a first range of wavelengths, a second color channel having a second channel-specific optical filter that selectively passes light having a second range of wavelengths, and a third color channel having a third channel-specific optical filter that selectively passes light having a third range of wavelengths, where the first range of wavelengths and the second range of wavelengths are partially overlapping, and wherein the third range of wavelengths encompasses both of the first range of wavelengths and the second range of wavelengths. For example, the third wavelength band can correspond to the visible light spectrum.

In some embodiments, the channel-specific property can be a different property such as a polarization property of light.

In some embodiments, each sensor row further comprises a LIDAR sensor channel, and depth data determined from the LIDAR sensor channels can be inherently registered with intensity data determined from the ambient-light sensor channels.

Some embodiments relate to an imaging system that includes a sensor array, a controller, and an arithmetic logic circuit. The sensor array can have a plurality of sensor rows. Each sensor row can include a set of at least two ambient-light sensor channels, with each ambient-light sensor channel including: a channel input aperture; a photosensor; and a channel-specific optical filter that selectively passes light having a channel-specific property to the photosensor. The set of at least two ambient-light sensor channels in each sensor row can include at least two overlapping ambient-light sensor channels having respective channel-specific optical filters for which the channel-specific property of the light overlaps. The controller can operate the sensor array such that each of the three or more ambient-light sensor channels is exposed to light from a same portion of a field of view. The arithmetic logic circuit can decode signals from the at least two overlapping ambient-light sensor channels into respective light intensity levels for light having a plurality of non-overlapping properties.

Some embodiments relate to a sensor array that includes multiple sensor channels including multispectral sensor channels. Each multispectral sensor channel can have: a channel input aperture; at least three photosensors; and a patterned optical filter having at least three different portions, wherein different portions of the patterned optical filter selectively pass light having different properties to different subsets of the at least three photosensors. The different portions of the patterned optical filter can include at least a first portion that passes light to a first subset of the at least three photosensors and a second portion that passes light to a second subset of the at least three photosensors, where respective properties of light passed by the first and second portions overlap. An arithmetic logic circuit can decode signals from the first and second subsets of the photosensors into respective light intensity levels for light having a plurality of non-overlapping properties. As in other embodiments, the properties can include a wavelength range and/or a polarization property.

In some embodiments, the sensor channels can include plurality of LIDAR sensor channels disposed such that each LIDAR sensor channel forms a sensor row with a different one of the multispectral sensor channels, and depth data determined from the LIDAR sensor channels can be inherently registered with intensity data determined from the ambient-light sensor channels.

In some embodiments, each multispectral sensor channel can include a LIDAR photosensor and the patterned optical filter can include a fourth portion that selectively passes light having a wavelength corresponding to a LIDAR emitter to the LIDAR photosensor.

The following detailed description will provide a better understanding of the nature and advantages of the claimed invention.

BRIEF DESCRIPTION OF THE DRAWINGS

FIG. 31A is a simplified top view and FIG. 31B is a simplified side view.

DETAILED DESCRIPTION

1. Multispectral Sensor Arrays

As used herein, a multispectral sensor array refers to an array of sensors, each of which is configured to image a portion (pixel) of a field of view at a different wavelength. Data from different sensors that image the same pixel can be combined to provide a multispectral pixel for an image. Examples of multispectral sensor arrays will now be described. These examples illustrate and embody various principles and concepts related to the construction of multispectral sensor arrays. It will become apparent that many other implementations of a multispectral sensor array are possible, and the examples provided are not intended to be limiting.

1.1. Sensor Channel Examples

Figure 1A:
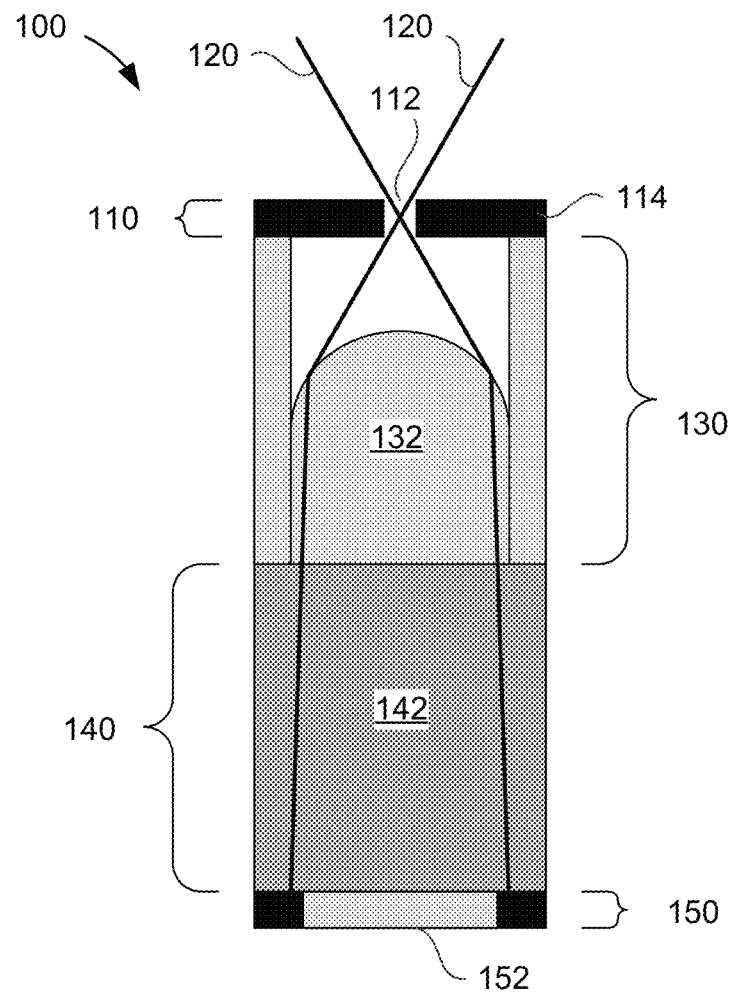
FIGS. 1A and 1B show simplified cross-section views of a single micro-optic sensor channel that can be included in a sensor array according to one or more of the embodiments described herein.

Examples of multispectral sensor arrays described herein include arrays constructed from sensor channels formed or arranged on a monolithic semiconductor device, such as an application-specific integrated circuit (ASIC). FIG. 1A shows a cross-section of a single micro-optic sensor channel 100 that can be used in some embodiments of a multispectral sensor array. Sensor channel 100 accepts an input cone of light potentially containing a wide range of wavelengths, filters out all but a selected subset of the wavelengths (with the selected subset depending on the particular channel), and allows a photosensor 152 (sometimes referred to as a "pixel") to detect only or substantially only photons within the selected subset of wavelengths. Embodiments of the invention are not limited to any particular configuration for sensor channels, and sensor channel 100 is just one example of a sensor channel that can be implemented in sensor array 200.

In some embodiments, sensor channel 100 includes an input aperture layer 110 including an optically-transparent aperture 112 and optically-non-transparent stop region 114. As used herein, the term "optically transparent" refers to a material that allows most or all incident light to pass through. As used herein, the term "optically non-transparent" refers to a material that allows little to no light to pass through, e.g., a reflecting or absorbing surface. Aperture 112 is shaped and sized to define a narrow field of view when placed at the focal plane of an imaging optic, examples of which are described below. Aperture layer 110 is configured to receive an input light cone as indicated by input marginal ray lines 120. In a multispectral sensor array, examples of which are described below, aperture layer 110 may include an array of optically-transparent apertures and optically-non-transparent stop regions built upon a single monolithic piece such as an optically-transparent substrate. In some embodiments, aperture layer 110 can be formed from a optically non-transparent material that forms stop regions 114 and apertures 112 can be holes or openings in layer 110.

In some embodiments, sensor channel 100 includes an optical lens layer 130 including a collimating lens 132 characterized by a focal length. Collimating lens 132 can be offset from the plane of aperture 112 and stop region 114 by its focal length and aligned axially with aperture 112 (i.e., the optical axis of the collimating lens is aligned with the center of the aperture). In this manner collimating lens 132 can be configured to collimate light rays passed by aperture 112 such that the light rays are travelling approximately parallel to the optical axis of collimating lens 132. Optical lens layer 130 may optionally include apertures, optically-non-transparent regions and tube structures to reduce cross talk between nearby sensor channels 100 in a sensor array.

In some embodiments, sensor channel 100 includes an optical filter layer 140 including an optical filter 142. In some embodiments, optical filter layer 140 is disposed on a detector side of optical lens layer 130 (opposite the aperture side). Optical filter layer 140 can be configured to pass normally incident photons at a specific operating wavelength and passband. Optical filter layer 140 may contain any number of optical filters 142. The optical filter(s) in a particular instance of sensor channel 100 can be selected based on the intended use of that particular instance of sensor channel 100, e.g., as described below. Optical filter layer 140 may optionally include apertures, optically-non-transparent regions and tube structures to reduce cross talk.

In some embodiments, sensor channel 100 includes a photosensor layer 150 including one or more individual photosensors 152 disposed behind optical filter layer 140. Each photosensor 152 can be a photosensor capable of detecting photons with a detector active area made of, e.g., one or more standard photodiodes, avalanche photodiodes (APDs), single-photon avalanche diodes (SPADs), RCPs (Resonant Cavity Photodiodes), optical nanoantennas, microbolometers, or other suitable photodetectors. Photosensor 152 may be composed of several photon detector areas (e.g., each a different SPAD) cooperating together to act as a single sensor, often with higher dynamic range, faster response time, or other beneficial properties as compared to a single large photon detection area. In addition to photosensors 152 for any number of sensor channels, photosensor layer 150 can include optional structures to improve detection efficiency and reduce cross talk with neighboring sensor channels. Photosensor layer 150 may optionally include diffusers, converging lenses, apertures, optically-non-transparent tube spacer structures, optically-non-transparent conical spacer structures, etc.

Stray light may be caused by roughness of optical surfaces, imperfections in transparent media, back reflections, and so on, and may be generated at many features within sensor channel 100 or external to sensor channel 100. The stray light can be directed through optical filter layer 140 along a path non-parallel to the optical axis of collimating lens 132; reflecting between aperture layer 110 and collimating lens 132; and generally taking any other path or trajectory possibly containing many reflections and refractions. If multiple receiver channels are arrayed adjacent to one another, stray light in one receiver channel may be absorbed by a photosensor in another channel, thereby contaminating the timing, phase, intensity, or other information pertaining to received photons. Accordingly, sensor channel 100 may also feature structures to reduce crosstalk and increase signal between receiver channels. Examples of such structures and other suitable receiver channels are described in U.S. patent application Ser. No. 15/979,295 entitled "Micro-optics for Imaging Module with Multiple Converging Lenses per Channel," filed on May 14, 2018, the disclosure of which is hereby incorporated by reference in its entirety for all purposes.

Figure 1B:
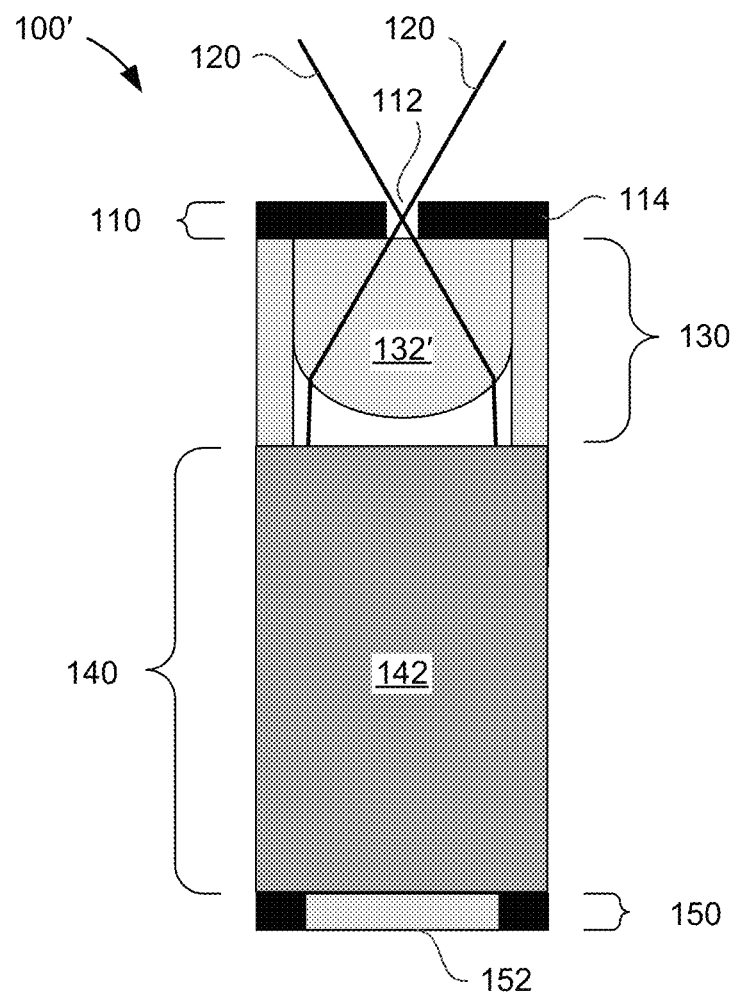

The components and arrangement of sensor channel 100 can be modified as desired. By way of illustration, FIG. 1B shows a cross-section of a single micro-optic sensor channel 100' that can be used in some embodiments of a multispectral sensor array. Micro-optic sensor channel 100' is generally similar to micro-optic sensor channel 100 of FIG. 1A, and parts have been given corresponding numbers. In this example, lens element 132' has a different configuration from lens 132 shown in FIG. 1A, with a planar surface oriented toward the aperture and a convex surface oriented toward optical filter layer 140. Similarly to lens element 132, lens element 132' collimates incident light and directs the collimated light into optical filter layer 140, as indicated by marginal rays 120. It is to be understood that other modifications are also possible. For instance, optical lens layer 130 may include light guides in addition to or instead of lens elements, optical filters may be placed on the aperture side of optical lens layer 130, and so on. As another example, a sensor channel need include any micro-optic elements and may be as simple as a photosensor (or group of photosensors) with an optical filter disposed thereon. In some instances, optical filters may be fabricated within the metal layers of the photosensor (e.g., in the case of polarization channels described below). Additional examples of alternative sensor channel configurations are shown below. It is also to be understood that different sensor channels in the same sensor array can have different configurations.

1.2. Example Multispectral Sensor Arrays

In some embodiments, a multispectral sensor array incorporates a group of aligned sensor channels fabricated on a common substrate. Sensor channels tuned to different wavelengths or wavelength ranges (also referred to herein as "sensor types") can be arranged at different locations on the substrate, with the locations selected such that a given portion of the field of view can be viewed by different sensor channels either at the same time or at different times. Many specific arrangements are possible; examples will now be described.

1.2.1. Row-Based Multispectral Sensor Arrays

Figure 2:
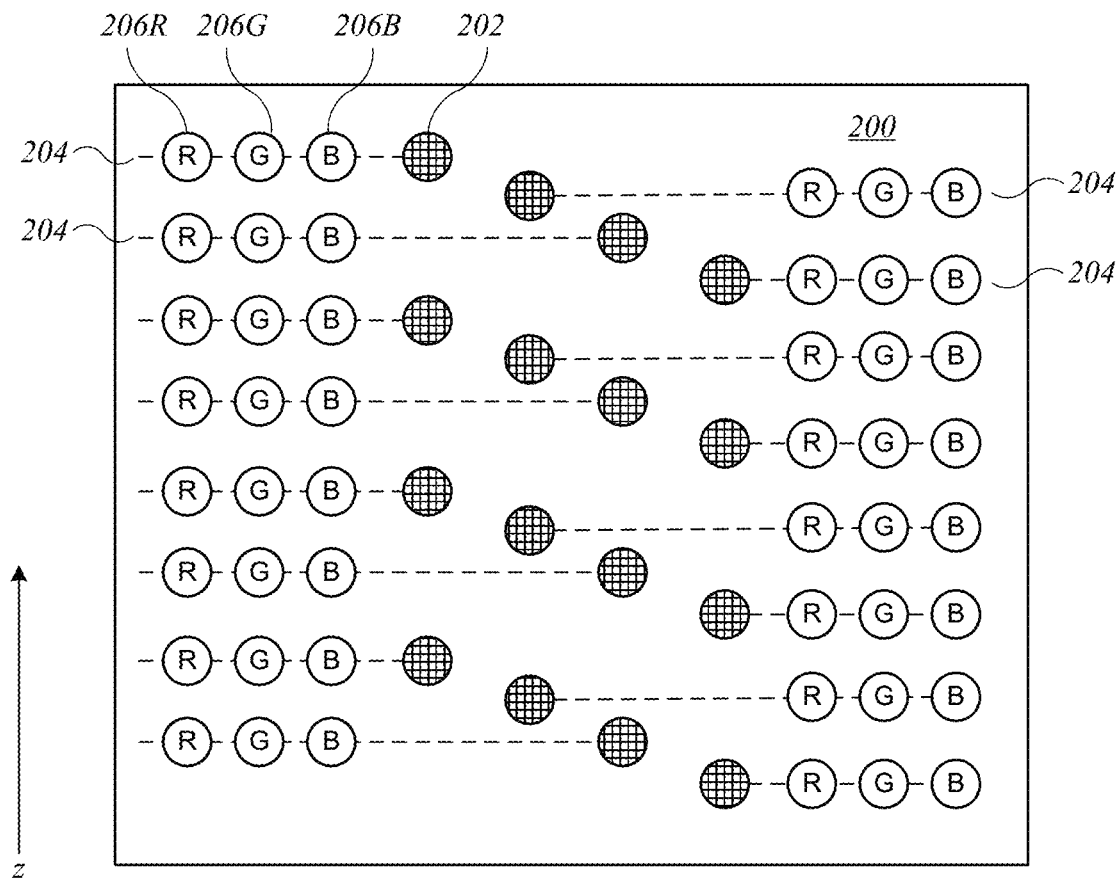
FIG. 2 shows a simplified front view of a sensor array according to one or more of the embodiments described herein.

FIG. 2 shows a simplified front view of a sensor array 200 according to an embodiment of the present invention. Sensor array 200 can include a number of LIDAR sensor channels 202; this example shows sixteen LIDAR sensor channels 202, but any number of LIDAR sensor channels 202 can be included. In this example, LIDAR sensor channels 202 are arranged in a staggered fashion; however, this is not required, and in some embodiments, LIDAR sensor channels 202 can be arranged in a single column (in this example, columns run parallel to the z axis shown at the left side of FIG. 2).

In this example, each LIDAR sensor 202 is associated with a "row" 204 of sensor array 200. (The term "row" here is used to indicate a linear or approximately linear arrangement of elements; rows in FIG. 2 are indicated by dashed lines.) In addition to a LIDAR sensor 202, each row of sensor array 200 includes one or more ambient-light sensor channels 206. In this example, ambient-light sensor channels 206R detect red light, ambient-light sensor channels 206G detect green light, and ambient-light sensor channels 206B detect blue light; however, any number and combination of ambient-light sensor channels can be used. Additional examples are described below. Each row can include a complete set of sensors for generating a multispectral pixel, and sensor arrays such as sensor array 200 are referred to herein as "row-based" or "1D" sensor arrays.

Figure 3:
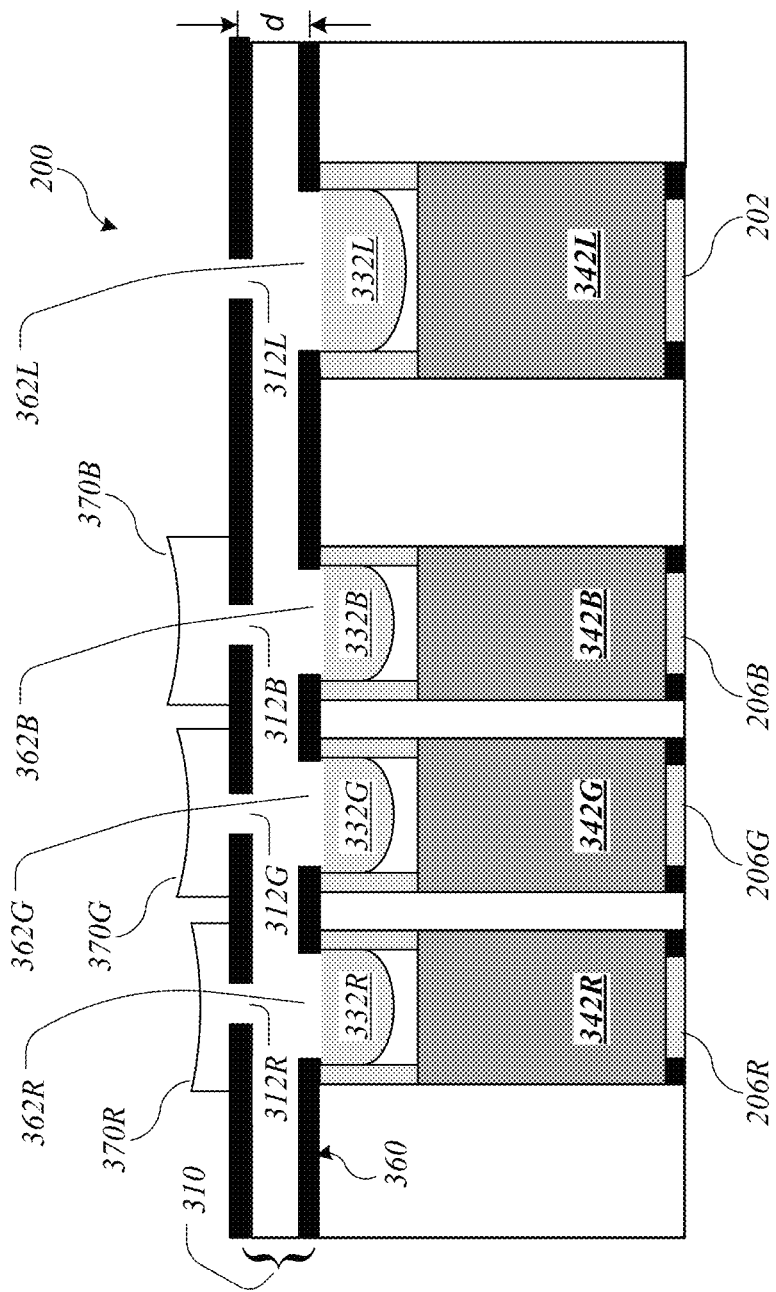
FIG. 3 shows a simplified side cross-section view of a sensor row of the sensor array of FIG. 2.

FIG. 3 shows a simplified side cross-section view of a row 204 of sensor array 200 of FIG. 2. Each sensor channel 206R/G/B, 202 of sensor array 200 can be implemented as a separate instance of sensor channel 100 described above. In some embodiments, different sensor channels 206R/G/B, 202 differ in having different optical filters. For instance, optical filter 342L for a LIDAR sensor channel 202 can include, e.g., a Bragg reflector type filter or the like to pass light at the LIDAR signaling wavelength with a narrow passband. The optical filter for a given ambient-light sensor channel can include a bandpass filter that passes light within a given region of the spectrum and blocks light outside the bandpass region. For instance, for red-light sensor channel 206R, optical filter 342R can pass light having wavelengths in the red region of the spectrum (e.g., wavelengths from about 620 nm to about 750 nm); for green-light sensor channel 206G, optical filter 342G can pass light having wavelengths in the green region (e.g., wavelengths from about 495 nm to about 570 nm); and for blue-light sensor channel 206B, optical filter 342B can pass light having wavelengths in the blue region (e.g., wavelengths from about 450 nm to about 495 nm). Those skilled in the art will appreciate that the particular bandpass filter for a given color can be selected as desired, and different embodiments can include sensor channels "tuned" (by application of appropriate optical filters) to any desired range of light wavelengths, including non-visible light wavelengths such as ultraviolet, near infrared (NIR), shortwave infrared (SWIR), midwave infrared (MWIR), or longwave infrared (LWIR, i.e., thermal imaging), and the different wavelength ranges associated with different types of sensor channels in a given sensor array may or may not overlap. Optical systems of the kind described herein can operate in wavelength ranges extending from 300 nm to 20 µm, provided that the optical elements are selected to function at the operational wavelengths and the photosensors are capable of sensing electromagnetic energy at those same wavelengths. Materials and sensors suitable for all wavelengths in this range are known in the art, and the same optical principles (ray optics, refraction, etc.) apply. Other ambient-light sensor channels can be tuned to detect other properties of light; examples are described below.

Input aperture layer 310 can correspond to input aperture layer 110 of FIG. 1A (or FIG. 1B), and a single input aperture layer 310 can provide an aperture 312R/GB, 312L for each sensor channel 206R/GB, 202 of sensor array 200 such that these apertures are in the same plane. In some embodiments, aperture layer 310 can have a thickness d, and apertures 312R/G/B/L can be formed with tapered openings such that, at exit surface 360 of aperture layer 310, the exit aperture width can be wider than the aperture, e.g., as wide as the respective sensor channels (as shown at 362R/GB/L). Alternatively, the direction of taper can be reversed so that the aperture is widest at the input side and narrows toward the sensor channel. The aperture can follow the ray cone defined by the marginal rays of each channel, thereby defining a numeric aperture for the channel that is matched to the numeric aperture of the channel optics 332 and a bulk optical element that directs light onto the sensor array (examples of which are described below). The particular thickness and structure of aperture layer 310 can be varied as desired.

In some embodiments, channel-specific compensating micro-optic elements 370R, 370G, and 370B can be placed directly in front of input apertures 312R/GB. As described below, such channel-specific micro-optic elements can provide improved light collection efficiency, e.g., by compensating for chromatic aberration in a bulk optic of the system.

In some embodiments, sensor array 200 can be fabricated as part of a monolithic device on a single substrate using, for example, CMOS technology. The monolithic device can include an array of photosensors 152 together with a processor and a memory (not shown in FIGS. 2-3) for processing the raw signals from individual photosensors 152 (or groups of photosensors 152) in sensor array 200. The monolithic device including sensor array 200, processor, and memory can be fabricated as a dedicated ASIC. In some embodiments, sensor array 200 can be fabricated using 3D stacking technology and can include two or more monolithic devices, each fabricated on a single substrate and stacked with electrical connections running between them. The top monolithic device can include an array of photosensors 152 and be tuned for optimal light sensing while the underlying substrate can include a processor and memory and be optimized for digital logic. In some embodiments, sensor array 200 can be split into multiple monolithic devices, each optimized for sensing a different wavelength (or multiple different wavelengths) of light or optimized for depth sensing vs ambient-light imaging; the monolithic devices may be arranged side-by-side and associated with different channels of the sensor array shown in FIG. 3.

In some embodiments, sensor array 200 can also include micro-optical components (e.g., micro-optics 332R/G/B/L and/or channel-specific compensating micro-optic elements 370R/GB) as part of the monolithic structure. In such instances, micro-optical components can be formed on the same ASIC with sensor array 200 or fabricated on separate wafer substrates and bonded to the sensor array ASIC at the wafer level so that they become part of the monolithic structure with separate substrate layers for each layer of the sensor channel. For example, a compensating micro-optic layer, an aperture layer, a collimating lens layer, an optical filter layer and a photodetector layer can be stacked and bonded to multiple ASICs at the wafer level before dicing. The aperture layer can be formed by laying a non-transparent substrate on top of a transparent substrate or by coating a transparent substrate with an opaque film. In such an embodiment, the dicing step forms multiple ASICs, each with its own micro-optic structure bonded directly thereto. As another example, the micro-optical components can be formed as a separate monolithic structure that can be bonded directly to an ASIC after the ASIC is separated from a larger wafer via a dicing process. In this manner, the ASIC and micro-optic structure can be bonded together to form a single monolithic structure. In yet other embodiments one or more components of sensor array 200 may be external to the monolithic structure. For example, aperture layer 310 may be implemented as a separate metal sheet with pin-holes.

Figure 4:
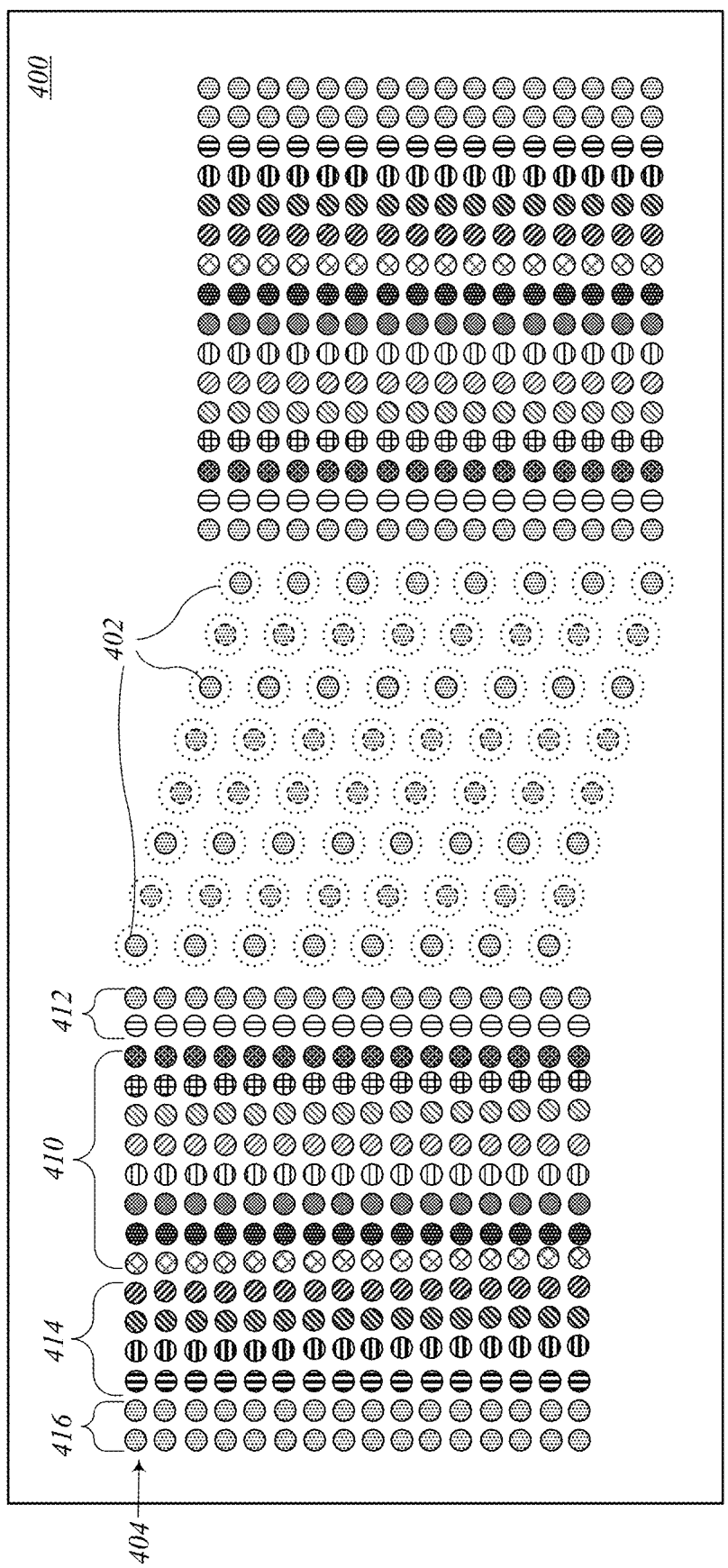
FIG. 4 shows a simplified top view of another sensor array according to one or more embodiments.

In examples described above, three ambient light channels (tuned for red, green, and blue light respectively) are provided. This is for ease of illustration, and embodiments of the invention are not limited to any particular number or combination of ambient light channels. In some embodiments, a sensor row can have fewer than three ambient light channels; for instance, a sensor row may have one ambient-light channel with an optical filter that passes "white light" (e.g., encompassing the entire visible-light spectrum) or with no optical filter (in which case the spectral selectivity is determined by the sensitivity of the photosensor). In other embodiments, a sensor row can have more than three ambient light channels. By way of illustration, FIG. 4 shows a simplified top view of a sensor array 400 according to an embodiment of the present invention that has a larger number of ambient light channels in each row to provide additional multispectral imaging capability. Again, the number and combination of sensor channels is for purposes of illustration.

Sensor array 400 includes 64 LIDAR sensor channels 402. In this example, LIDAR sensor channels 402 are arranged in a staggered grid, but this arrangement is not required. Thirty-two of the 64 LIDAR sensor channels have an associated row 404 of ambient light sensors 406, but in other embodiments every LIDAR sensor channel 404 can have an associated row of ambient light sensors 406. In this example, the ambient light sensors 406 in each row include eight spectral color channels 410, each defined by a different bandpass filter; two IR-band color channels 412; four polarization channels 414; and two ultra-narrow absorption-band channels. Each channel can have an internal structure as described above with reference to FIG. 1A or 1B, and sensor array 400 can be fabricated using techniques described above or other techniques.

Spectral color channels 410 can be created by using appropriate bandpass filters as optical filter 142. In addition to red, green, and blue channels, spectral color channels 410 in this example include channels tuned to wavelength ranges corresponding to orange, yellow, cyan, indigo, and violet. Other examples of spectral channels can include infrared, ultraviolet, and/or white (e.g., broad spectrum) channels, as well as channels tuned to any portion of the visible, infrared, or ultraviolet light spectrum. In some embodiments, each spectral color channel 410 may have a compensating channel-specific micro-optic element (similar to micro-optic elements 370R/GB in FIG. 3) whose optical properties are based at least in part on the wavelength range to which the channel is tuned; examples of channel-specific micro-optics are described below.

IR-band color channels 412 can be additional spectral color channels with bandpass filters tuned to infrared portions of the spectrum. In some embodiments, it may be desirable to avoid the LIDAR operating frequency so that stray LIDAR radiation is not conflated with ambient IR. In some embodiments, each IR-band color channel 412 may have a channel-specific compensating micro-optic element whose optical properties are based at least in part on the wavelength range to which the channel is tuned.

Polarization channels 414 can be created by using an optical polarization filter, such as a grating, instead of or in addition to an optical bandpass filter 142. The polarization filters in each channel of group 414 can be tuned to a different angle for linearly polarized light by orienting the polarization filters for different channels at different angles. In one embodiment, four polarization channels 414 have respective orientations of 0 degrees, 90 degrees, 45 degrees, and 135 degrees. Polarization filters may also be tuned to other forms of polarization, such as circular and/or spiral polarization. The polarization filters may be applied to different surfaces of micro-optic sensor channel 200 in a similar manner to bandpass filters, or they may be fabricated as a metal grating directly within the metal layers of the photosensor(s) 152. In some embodiments, each polarization channel 414 may have a channel-specific compensating micro-optic element. In some cases, e.g., where polarization channels 414 are not restricted to a particular wavelength band, compensating micro-optic elements may be omitted or may be tuned to a central wavelength in the band.

Absorption-band channels 416 can each be defined by a narrowband optical filter corresponding to an absorption band that is characteristic of a particular substance of interest. In this case, absence of a signal in the absorption-band channel can be interpreted (e.g., in conjunction with information from other spectral color channels) as indicating the presence of a substance that absorbs light in that band. For example, in some applications it may be useful to distinguish foliage (e.g., trees, grass, other plants) from other categories of objects (e.g., cars, buildings). Chlorophyll, which is generally associated with foliage, has multiple narrow absorption bands in the IR spectrum, and absorption-band channels may be tuned to some or all of these bands. As another example, many gases have absorption bands in the shortwave, midwave, and longwave IR regions, and absorption band channels may be tuned to those bands to identify gaseous atmospheric contaminants. Because the system also provides distance to objects, in the case of gas absorption detection, this distance information can be used to calculate the distance through the atmosphere over which the absorption measurement was taken, which can help with determining a confidence level for the detection and/or concentration of the contaminant. As with other channels, in some embodiments each absorption-band channel 416 may have a channel-specific compensating micro-optic element whose optical properties are based at least in part on the band to which the channel is tuned.

These examples of ambient-light sensor channels are illustrative and can be modified. The qualifier ambient-light, as applied to sensors or sensor channels, should be understood as referring generally to sensors that operate to measure the amount (intensity) of incident light having the characteristic(s) for which the channel is tuned (e.g., wavelength range and/or polarization). Ambient-light sensor channels do not rely on intentional illumination of the field of view (in contrast to the LIDAR sensor channels, which are designed to detect intentionally emitted light); however, intentional illumination (e.g., using an automobile headlight or camera flash) is not precluded.

A row of a sensor array can include a LIDAR sensor channel (or multiple LIDAR sensor channels, each operating at a different wavelength), plus any number and combination of ambient-light sensor channels, including one or more visible-light sensor channels tuned to any desired color or range of colors, one or more polarization sensor channels, one or more infrared light sensor channels, one or more ultraviolet light sensor channels, one or more absorption-band sensor channels, and so on. As another example, the ambient-light sensor channels in a given row can include two or more sensor channels tuned to the same wavelength range but with different attenuation filters, allowing for higher dynamic range in the image.

Further, it is not required that every LIDAR sensor channel in a sensor array have an associated row of ambient-light sensor channels or that every row of ambient-light sensor channels has an associated LIDAR sensor channel. As described below, the arrangement of a LIDAR sensor channel and a set of ambient light sensor channels in a single row can facilitate registration between images captured at various wavelengths and depth data during a scanning operation, but as long as the offset between different sensor channels is fixed and known, interpolation can be used to generate multispectral image pixels.

1.2.2. Sensor Arrays with Multispectral Sensor Channels

In embodiments described above, each sensor type for a multispectral pixel is provided as a separate sensor channel. It is also possible to combine multiple sensor types in a single sensor channel. For example, a LIDAR sensor channel may use multiple SPADs as a photosensor, with depth measurements based on how many of the SPADs trigger in a given time interval. An ambient-light channel may use a single SPAD or standard photodiode, which occupies a smaller area of a semiconductor device. Accordingly, some embodiments may include one or more "multispectral" sensor channels in a row of sensors.

Figure 5:
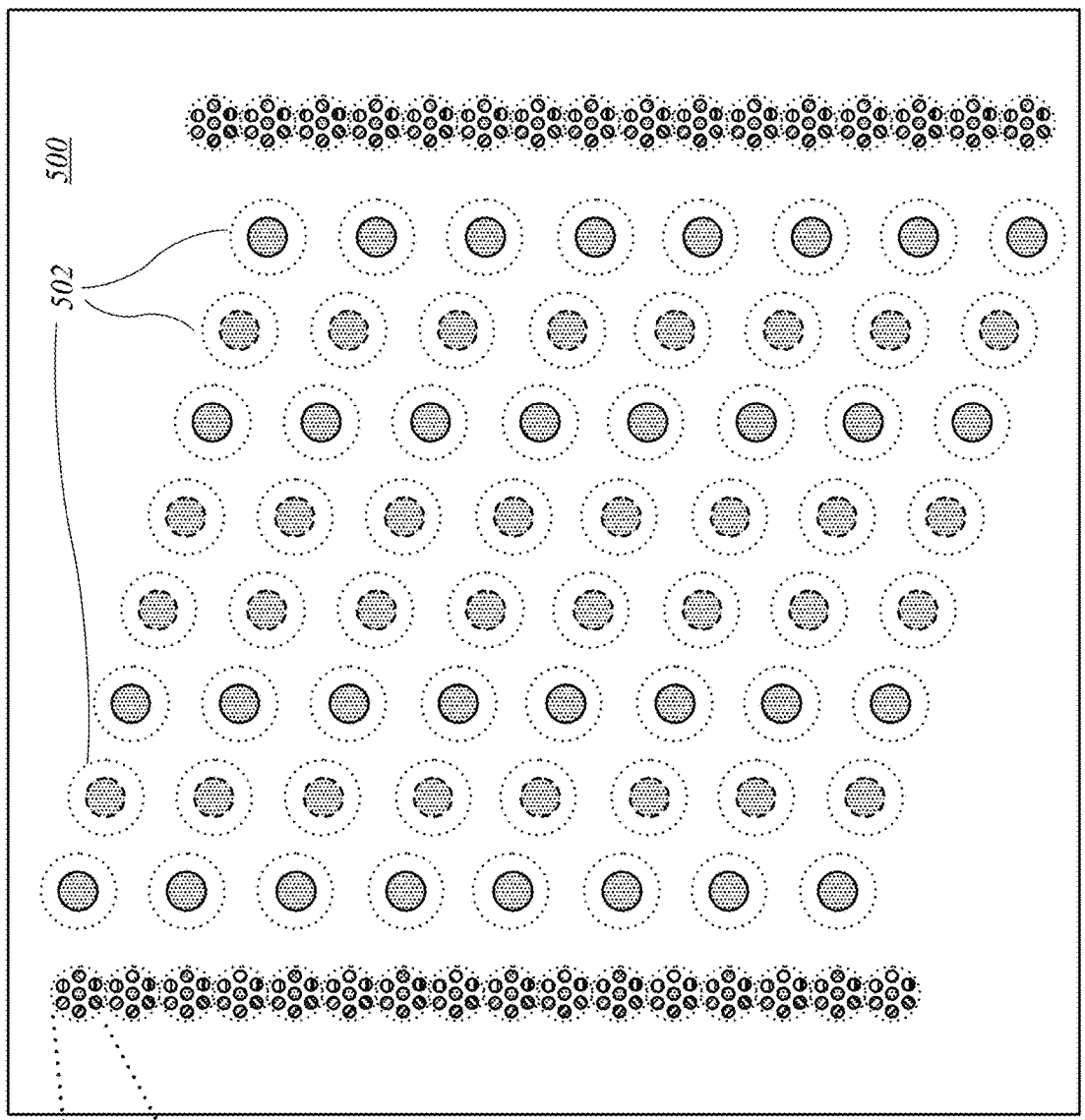
FIG. 5 shows a simplified top view of another sensor array according to one or more embodiments.
Figure 5:
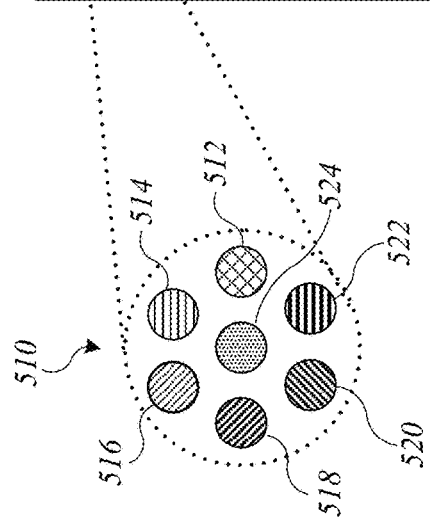

FIG. 5 shows a simplified top view of a sensor array 500 that incorporates multispectral sensor channels according to an embodiment of the present invention. Sensor array 500 includes 64 LIDAR sensor channels 502. In this example, LIDAR sensor channels 502 are arranged in a staggered grid, but this arrangement is not required. Thirty-two of the 64 LIDAR sensor channels have an associated multispectral sensor channel 506, but in other embodiments every LIDAR sensor channel 504 can have an associated multispectral sensor channel 506. In this example, as seen in inset 510, multispectral sensor channel 506 can incorporate a red color sensor 512, a green color sensor 514, a blue color sensor 516, polarization sensors 518, 520, 522, and an IR-band color channel 524.

In some embodiments, each multispectral sensor channel 506 can be implemented as a single instance of a sensor channel as described above with reference to FIG. 1A or 1B. Photosensor layer 150 can include a different photosensor 152 for each type of light to be detected. In this context, each photosensor 152 can be, for example, a standard photodiode with an amplifier, coupled to a capacitive charge bucket and read out using an analog-to-digital converter (ADC). Alternatively, each photosensor 152 can be one or more SPADs with an analog front end and an integration register to count photons. One or more patterned optical filters can be used in optical filter layer 140 to direct light having desired properties onto a particular photosensor 152. Each photosensor 152 can be separately read out (using appropriate electronics), thereby providing multiple outputs. The term "multispectral sensor channel" as used herein refers to a configuration where a single optical channel provides separate data outputs for different photosensors disposed therein, each of which can be tuned (e.g., via optical filters) to detect light having different characteristics. As can be seen, use of multispectral sensor channels can reduce the area consumed by a given set of sensor types.

It should be understood that the particular number and combination of sensor types included in a multispectral sensor channel can be varied from that shown. For instance, a multispectral sensor channel can include any or all of the ambient-light sensor types described above, including visible, ultraviolet, infrared, polarization, wideband, and/or narrowband sensors. In some embodiments, a row in a sensor array such as sensor array 500 can include, in addition to one or more LIDAR sensor channels (operating at different wavelengths), any number of multispectral sensor channels, each incorporating a different combination of sensor types. A row in a sensor array such as sensor array 500 also can include one or more "single-type" ambient-light sensor channels (such as any of the sensor channels shown in FIG. 4) in combination with one or more multispectral sensor channels.

1.2.3. Sensor Arrays with Hybrid Sensor Channels

In sensor array 500 of FIG. 5, LIDAR (ranging) sensor channels are separate from the multispectral sensor channels (which measure ambient light). In other embodiments, a sensor array can include channels that incorporate both ranging (e.g., LIDAR) sensors and one or more ambient-light sensors. Such channels are referred to herein as "hybrid sensor channels" or "hybrid sensor pixels."

Figure 6:
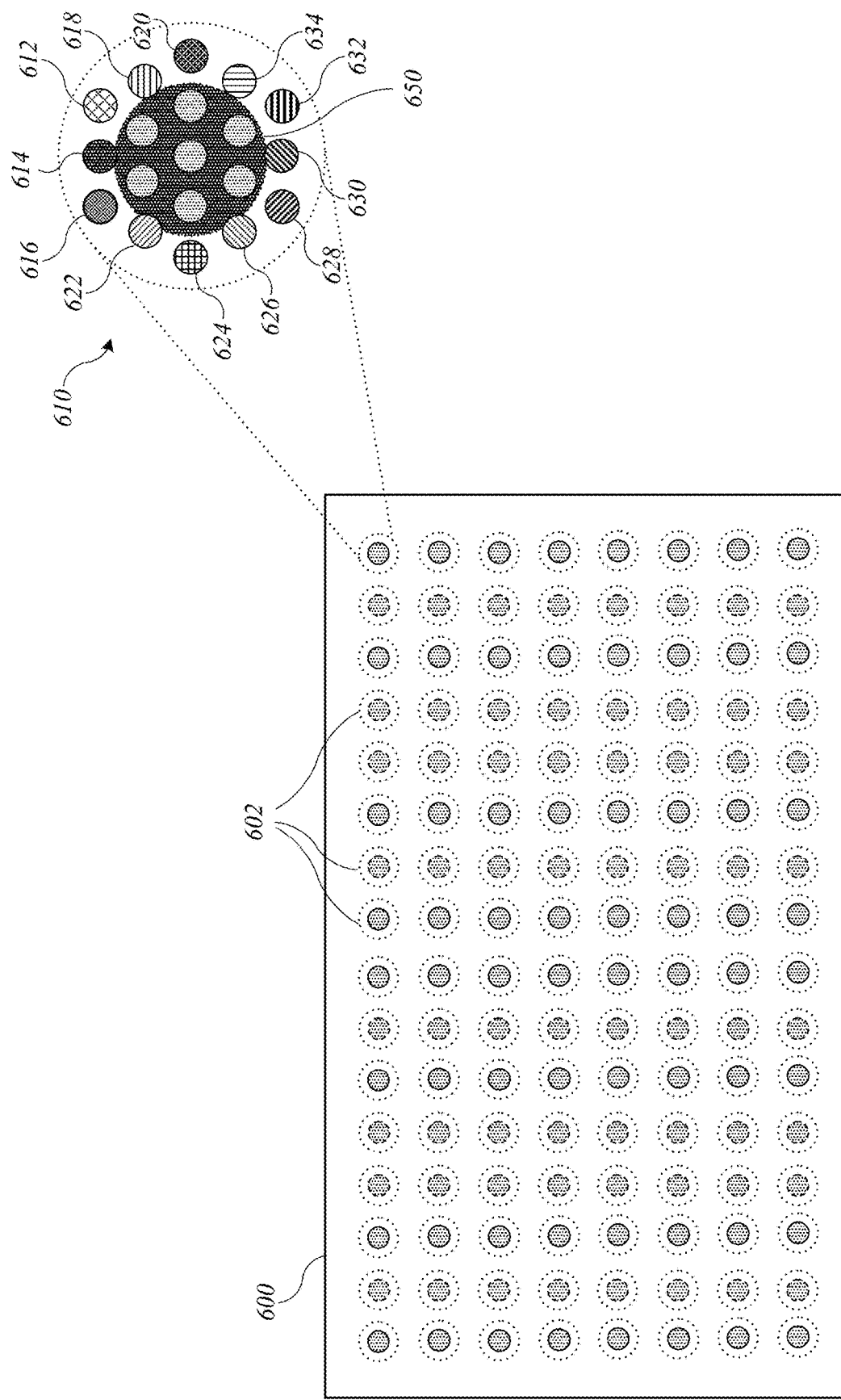
FIG. 6 shows a simplified top view of another sensor array according to one or more embodiments.

FIG. 6 shows a simplified top view of a sensor array 600 that incorporates hybrid sensor channels according to an embodiment of the present invention. Sensor array 600 includes 128 hybrid sensor channels 602 arranged in a rectilinear grid. It is to be understood that the number and arrangement of sensor channels can be varied.

As shown in inset 610, each hybrid sensor channel 602 can include a set of LIDAR photosensor elements 650, as well as a number of ambient-light photosensors tuned (e.g., using optical filters) to detect light having a particular property. In this examples, the ambient-light photosensors include a red color sensor 612, an orange color sensor 614, a yellow color sensor 616, a green color sensor 618, an ultraviolet color sensor 620, a cyan color sensor 622, a violet color sensor 624, a blue color sensor 626, polarization sensors 628, 630, 632, and an IR-band color sensor 634. In the example shown, LIDAR photosensor elements 650 occupy a central region within the channel area of hybrid sensor channel 602, while the ambient-light photosensors are arranged in a peripheral region of the channel area surrounding the central region. Other configurations are also possible.

In some embodiments, similarly to multispectral sensor channels 506, each hybrid sensor channel 602 can be implemented as a single instance of a sensor channel as described above with reference to FIG. 1A or 1B. Photosensor layer 150 can include a different photosensor 152 (or grouping of photosensors 152) for each type of light to be detected. One or more patterned optical filters can be used in optical filter layer 140 to direct light having the desired properties onto a particular photosensor 152 (or grouping of photosensors 152). Each photosensor 152 (or grouping of photosensors 152) can be separately read out using appropriate electronics, thereby providing multiple outputs.

Figure 7:
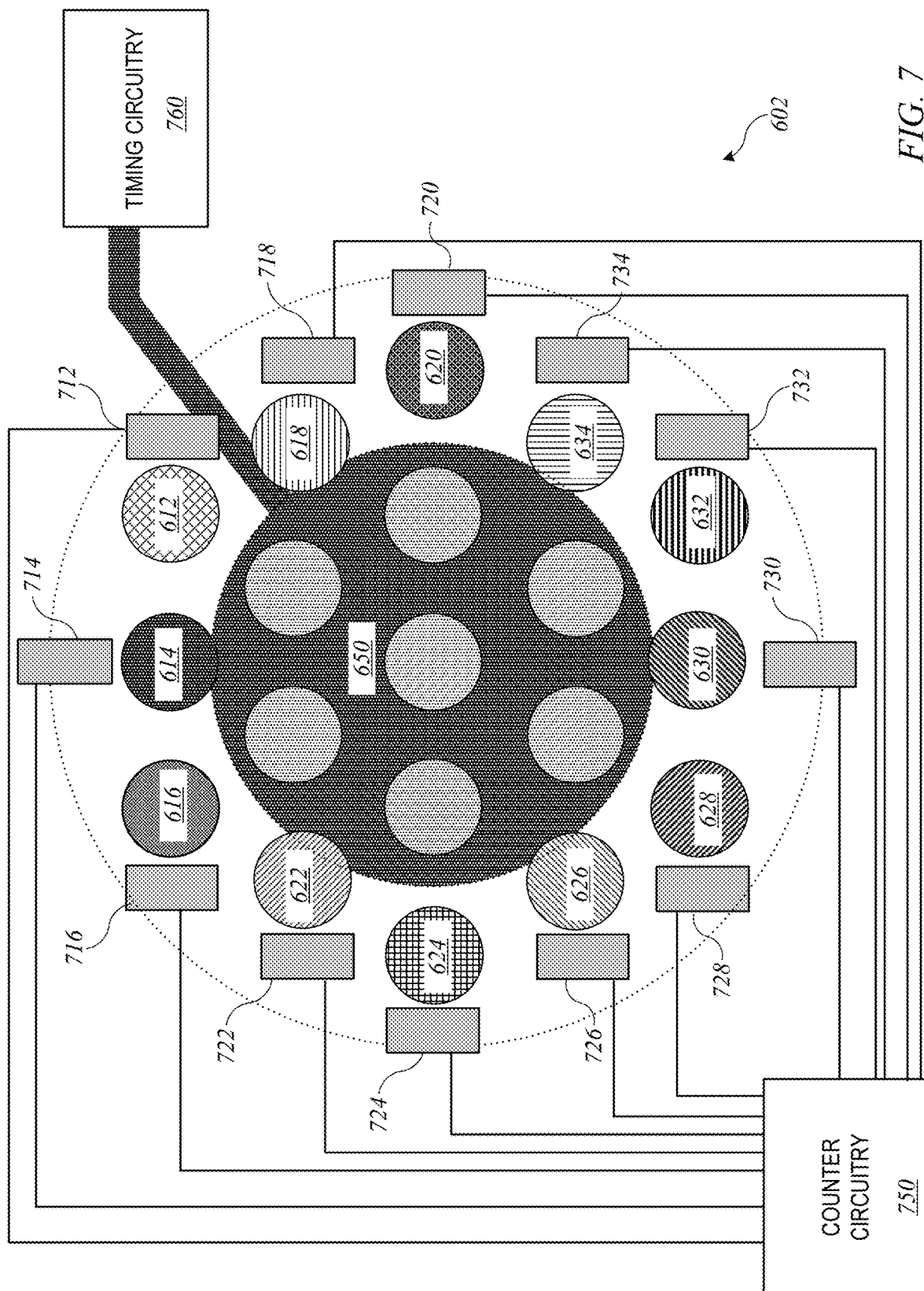
FIG. 7 shows a simplified top view of a multispectral sensor channel that can be included in the sensor array of FIG. 6.

A "hybrid sensor channel" can be understood as a special case of a multispectral sensor channel that includes photosensors and associated readout circuitry configured for determining time of flight of emitted/reflected light as well as other photosensors and associated readout circuitry configured for measuring light intensity. FIG. 7 shows a simplified schematic view of a hybrid sensor channel 602, indicating the associated readout circuitry. In this example, each ambient-light photosensor 612-634 is implemented using a standard photodiode with an amplifier coupled to a capacitive charge bucket 712-734. Capacitive charge buckets 712-734 are each connected to multichannel counter circuitry 750, which can determine a count of photons detected (e.g., during a shutter interval) by each ambient-light photosensor 612-634.

LIDAR photosensor elements 650 in this example can be implemented using SPADs connected to timing circuitry 760, which is capable of timing the arrival of photons and storing the arrival times in a memory bank of photons over time, thereby enabling depth measurements.

Figure 8:
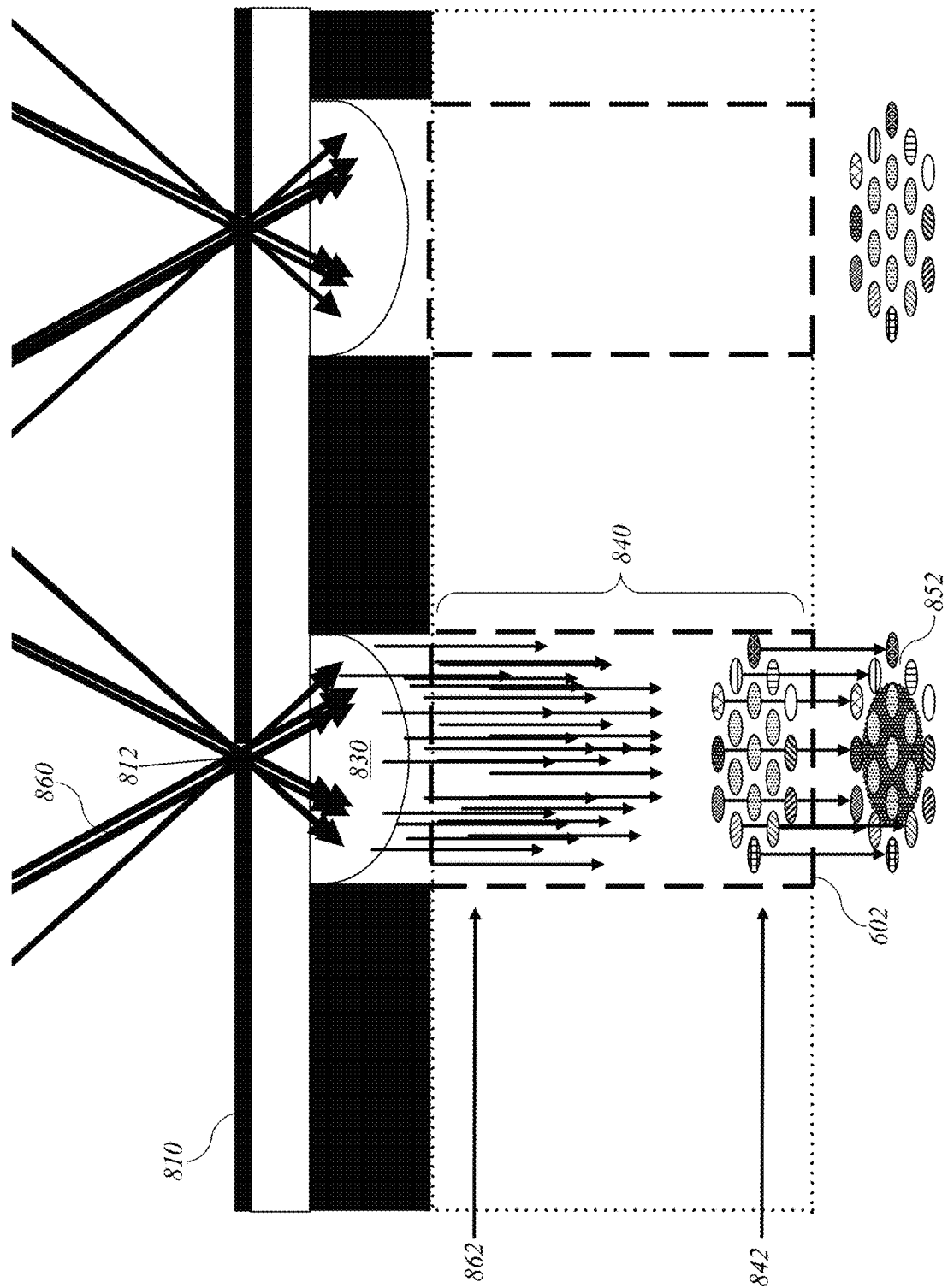
FIG. 8 shows a schematic side view of a portion of the sensor array of FIG. 6.

As noted above, each hybrid sensor channel 602 can be implemented as a single instance of sensor channel 100 of FIG. 1A (or sensor channel 100' of FIG. 1B). FIG. 8 is a simplified schematic side view of a portion of sensor array 600 showing the channel structure. Each hybrid sensor channel 602 has an aperture 812 (in aperture layer 810), optical layer 830, filter layer 840, and photosensor layer 850 (shown in oblique view for clarity of illustration). Filter layer 840 can include patterned filters 842 (shown in oblique view for clarity of illustration), which can be located on the filter wafer or directly deposited on the photosensor ASIC on top of the appropriate photosensor elements.

In operation, light 860 is directed into aperture 812 and propagates through channel 602 as shown by arrows 862. Patterned filters 842 direct light having desired properties onto individual photosensors 852 in photosensor layer 850. As described above, the appropriate readout electronics can be used to extract time-of-arrival information from the LIDAR photosensors, as well as accumulated photon counts in color, polarization, and/or other ambient-light photosensors.

It should be understood that the particular number and combination of sensor types included in a hybrid sensor channel can be varied from that shown. For instance, a hybrid sensor channel can include, in addition to LIDAR sensors, any or all of the ambient-light sensor types described above, including visible, ultraviolet, infrared, polarization, wideband, and/or narrowband sensors. Further, while sensor array 600 is shown as a 2D array of identical sensor channels 602, this is not required. Hybrid sensor channels could be included in a 1D array or in a row with other sensor types similarly to sensor array 400 of FIG. 4 or sensor array 500 of FIG. 5. The arrangement and configuration of sensor channels can be varied as desired.

1.2.4. Dual-Plane Multispectral Sensor Arrays

In embodiments described above, it is assumed that the photosensors for various channel types are arranged in one plane. In other embodiments, different photosensors can be in different planes.

Figure 9:
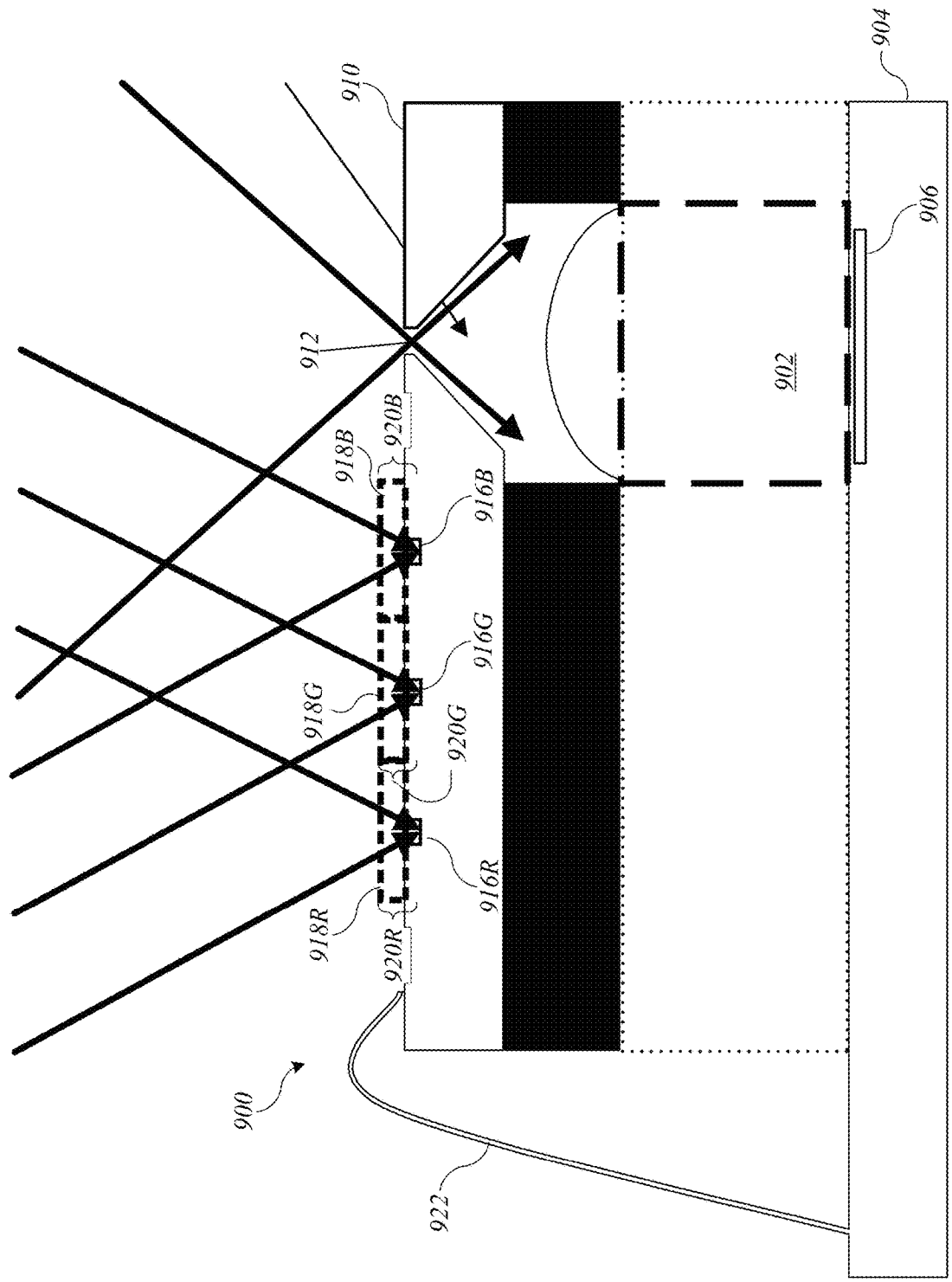
FIG. 9 shows a simplified side cross section view of a portion of a sensor array according to an embodiment of the present invention.

By way of example, FIG. 9 shows a simplified side cross-section view of a portion of another embodiment of a sensor array 900. Sensor array 900 includes one or more LIDAR channels 902, each of which can be a separate instance of sensor channel 100 of FIG. 1A (or sensor channel 100' of FIG. 1B). LIDAR channel 902 is fabricated on an ASIC 904, which includes one or more photosensors 906 for each LIDAR channel 902. An aperture layer 910 overlies LIDAR channels 902 and has an aperture 912 formed therein to direct light into each LIDAR channel 902. In these respects, sensor array 900 can be similar to other embodiments described above.

In this example, aperture layer 910 is a second ASIC that has photosensors 916R, 916G, 916B fabricated or otherwise disposed in or on its top surface, in locations that do not obstruct aperture 912. Photosensors 916R/GB are located in the same plane as aperture 912, which can be the focal plane of a bulk imaging optic for the sensor array. Color filters 918R, 918G, 918B, each of which can be a bandpass filter admitting light within a different wavelength band (red, green, and blue in this example), are placed over photosensors 916R, 916B, 916G. This arrangement provides ambient-light sensor channels 920R, 920G, 920B. Aperture layer 910 can be electrically connected to readout and/or control circuitry (e.g., a processor and memory) located in ASIC 904, as indicated schematically by wire bond 922. (It should be understood that wire-bonding is not required; other techniques for establishing electrical connections between ASICs can be substituted, or the two ASICs can each be connected to readout and control circuitry located on another device.)

Figure 10:
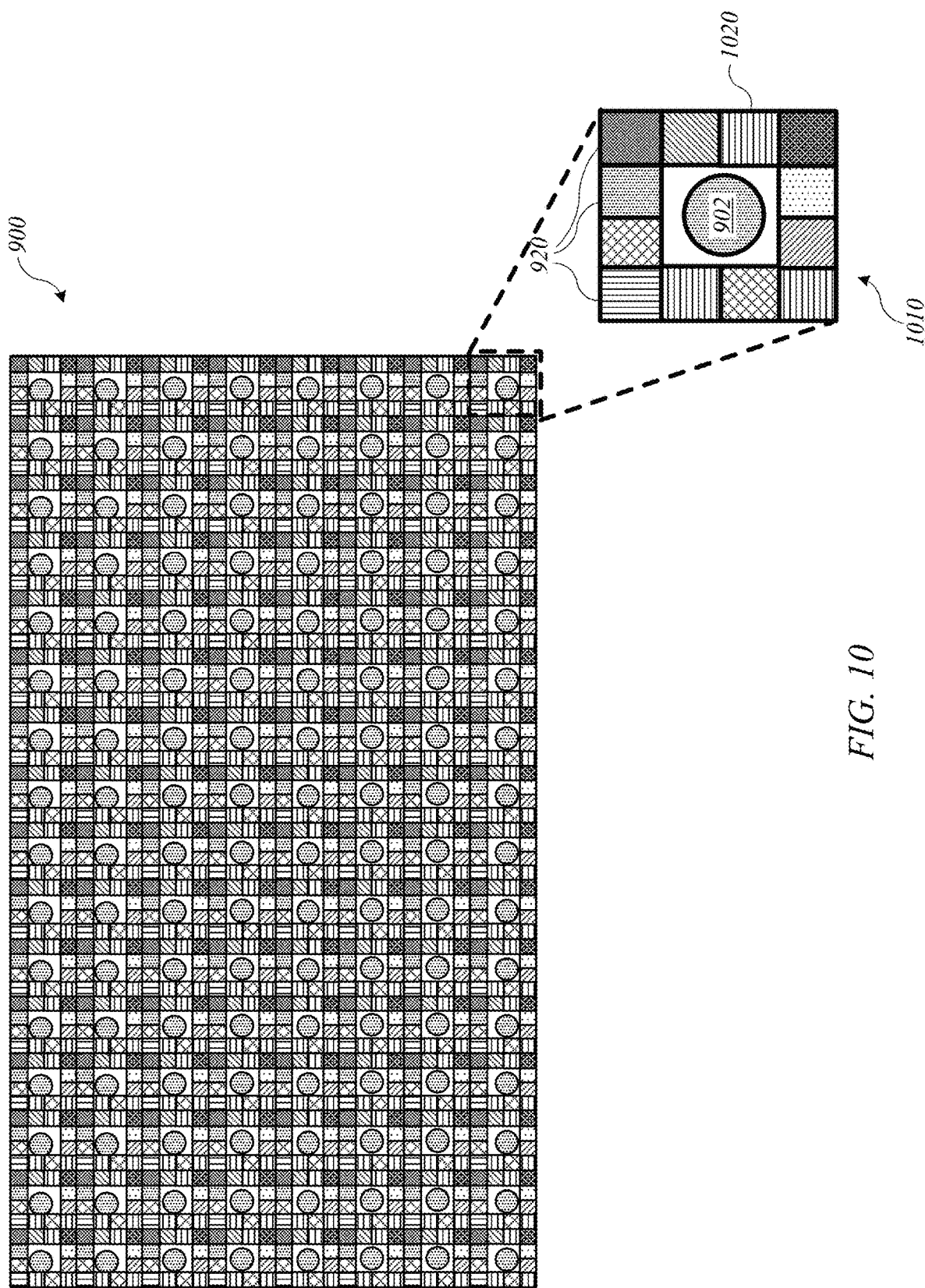
FIG. 10 shows a simplified top view of the sensor array of FIG. 9.

FIG. 10 shows a simplified top view of sensor array 900. Sensor array 900 provides a 2D array of multispectral pixels 1020. The size and dimension of sensor array 900 can be varied as desired. As shown in inset 1010, each multispectral pixel 1020 can include a LIDAR sensor channel 902 and one or more ambient-light sensor channels 920. Ambient-light sensor channels 920 can be fabricated in an ASIC that overlies and provides an aperture for LIDAR sensor channel 902 (as shown in FIG. 9). Any number and combination of ambient-light sensor channels 920 can be provided, including any of the specific channel types described above (e.g., color channels, including infrared, visible-light, and/or ultraviolet channels; polarization channels; narrowband absorption channels; and so on).

In some embodiments, aperture-layer ASIC 910 can have a significantly higher density of photosensors (or channels) 920 than the "base" ASIC 904 that supports LIDAR sensor channels 902. For instance, the LIDAR sensor channels may have spacing of 100-400 μm and apertures of 30 μm in diameter. The sensor channels (photosensors or pixels) in aperture layer ASIC 910 can be significantly smaller (e.g., in the 1-10 μm size range), meaning that each hybrid pixel 1020 can include a large number of ambient-light pixels. This can allow for a larger number of sensor types per multispectral pixel and/or multispectral pixels that have higher resolution in the ambient-light imaging channels than in the LIDAR channels.

Multispectral images obtained using aperture layer ASIC 910 may include gaps corresponding to the locations of apertures 912 or LIDAR channels 902. In some embodiments, interpolation can be used to fill the gaps.

1.2.5. Multispectral Pixels with Encoded Spectrally-Selective Passbands

Figure 11:
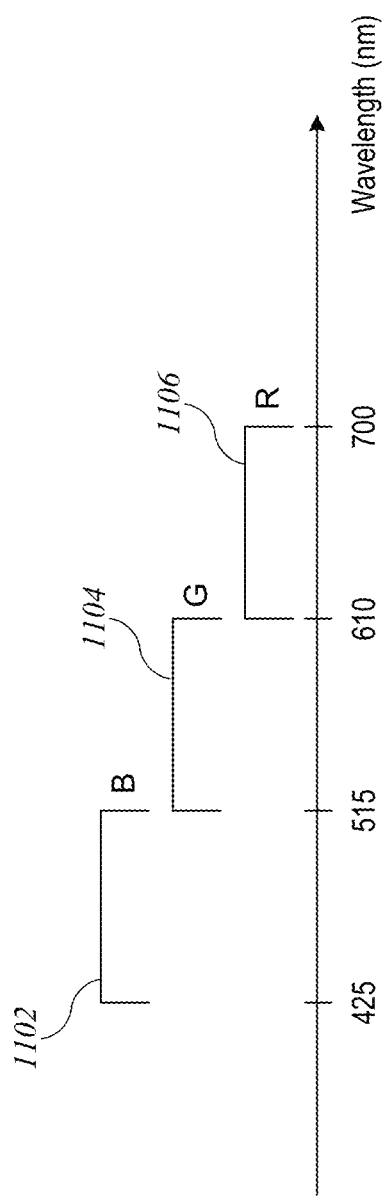
FIG. 11 shows an example of non-overlapping passbands for three filters that can be used to provide ambient-light intensity measurements in some embodiments.

In examples described above, different ambient-light sensor channels may include optical filters with different passbands. In some embodiments, the passbands for different ambient-light sensor channels may be generally non-overlapping so that different ambient-light sensor channels sample different portions of the optical spectrum (including infrared, visible, and/or ultraviolet light). FIG. 11 shows an example of non-overlapping passbands for three filters that can be used to provide ambient-light intensity measurements in some embodiments, e.g., in the multispectral sensor array of FIG. 2. In this example, a "blue" (B) filter 1102 has a passband from about 425 nm to about 515 nm; a "green" filter (G) 1104 has a passband from about 515 nm to about 610 nm, and a "red" (R) filter 1106 has a passband from about 610 nm to about 700 nm. It is to be understood that these ranges and boundaries are illustrative and can be varied. In some embodiments, the passbands of different filters may have some overlap. For instance, B filter 1102 might have a passband from about 410 nm to about 510 nm while G filter 1104 has a passband from about 490 nm to about 620 nm and R filter 1106 has a passband from about 600 nm to about 700 nm. As another example, B filter 1102 might have a passband from about 410 nm to about 440 nm while G filter 1104 has a passband from about 490 nm to about 620 nm and R filter 1106 has a passband from about 600 nm to about 700 nm. Other variations are also possible. The filter set shown in FIG. 11 can provide "R," "G," and "B" spectral intensity measurements for a multispectral pixel. (The names R, G, and B are used here as suggestive of red, green, and blue, but the passbands of filters having these names need not correspond to passbands associated with any particular color.)

Figure 12:
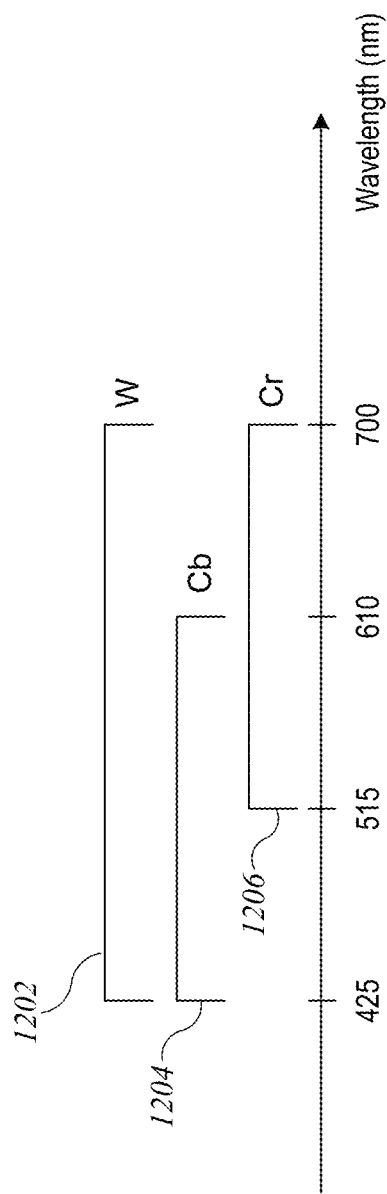
FIG. 12 shows an example of overlapping passbands for three filters that can be used to provide ambient-light intensity measurements with encoded spectral information in some embodiments.

In some embodiments, different ambient-light sensor channels may have overlapping passbands that are selected to encode spectral information. FIG. 12 shows an example of overlapping passbands for three filters that can be used to provide ambient-light intensity measurements with encoded spectral information in some embodiments. In this example a first filter 1202 has a "W" passband that encompasses roughly the entire visible-light spectrum (wavelengths from about 425 nm to about 700 nm). A second filter 1204 has a "Cb" passband from about 425 nm to about 610 nm, and a third filter 1204 has a "Cr" passband from about 515 nm to about 700 nm. Intensity measurements from ambient-light sensor channels having the passbands shown in FIG. 12 can be used to extract R, G, and B spectral information corresponding to the spectral measurements from the filter set of FIG. 11. For example, if the intensity measurements from filters 1202, 1204, and 1206 are denoted as W, Cb, and Cr, respectively, then intensity in the R, G, and B bands identified in FIG. 11 can be computed as:

$$R = W - Cb \tag{1a}$$

$$B = W - Cr \tag{1b}$$

$$G = W - (R+B) = Cb + Cr - W \tag{1c}$$

These computations can be implemented, e.g., using arithmetic logic circuits of conventional design, which can be fabricated on the same ASIC as the sensor array.

In this manner, either the non-overlapping filter set of FIG. 11 or the spectrally-encoded filter set of FIG. 12 can provide equivalent spectral information. The encoding scheme of FIG. 12 allows each channel to accept more light, which may improve measurement accuracy.

Figure 13:
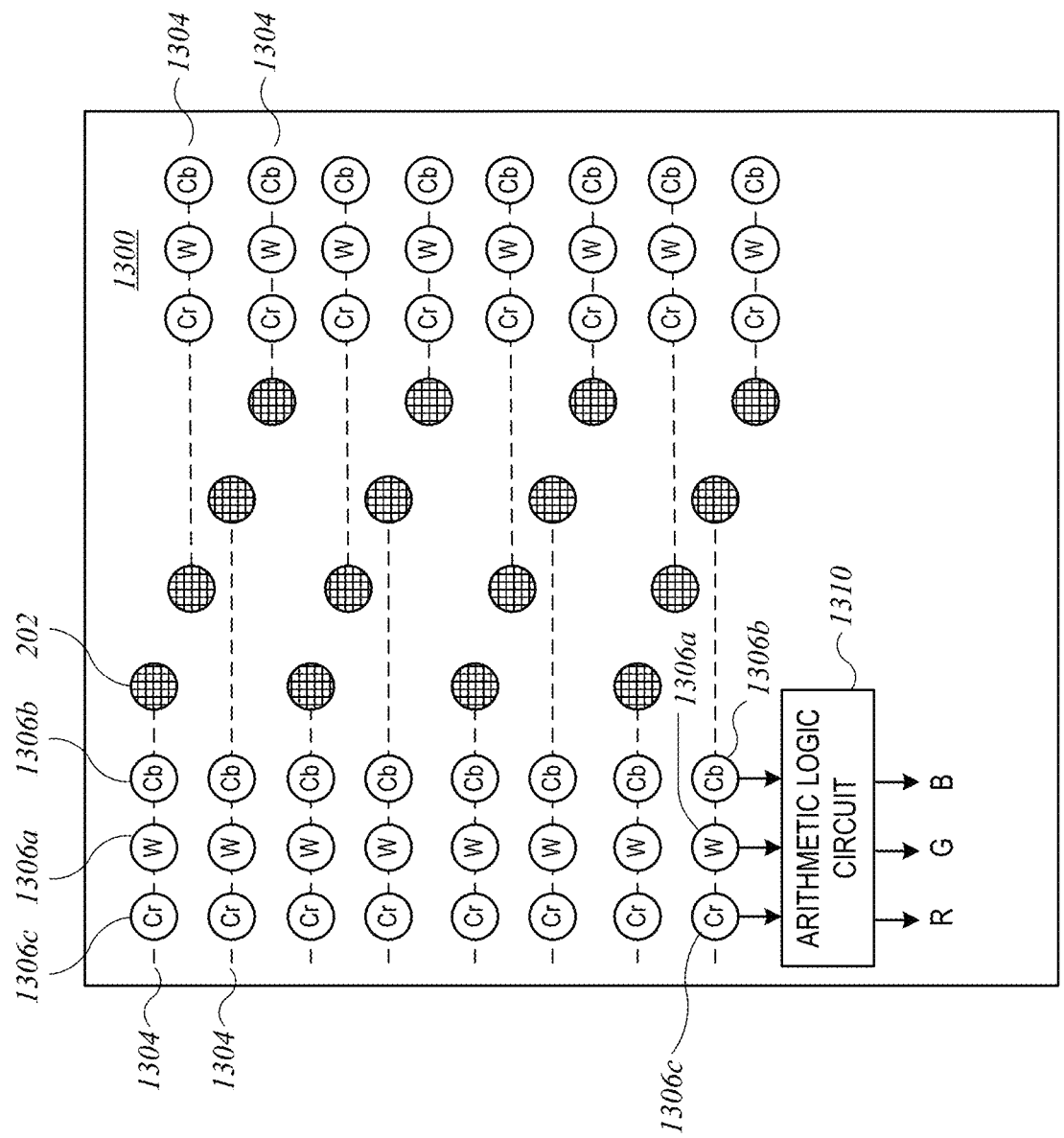
FIG. 13 shows a simplified front view of a sensor array according to some embodiments.

The filter set of FIG. 12 can be incorporated into various multispectral sensor arrays. FIG. 13 shows a simplified front view of a sensor array 1300 according to some embodiments. Sensor array 1300 can be similar to sensor array 200 of FIG. 2 and can include LIDAR sensor channels 202 (as described above), each of which can be associated with a row 1304 that includes ambient-light sensor channels 1306a (W passband), 1306b (Cb passband), and 1306c (Cr passband), where the W, Cb, and Cr passbands are defined as shown in FIG. 12. Sensor data from ambient-light sensor channels 1306a, 1306b, 1306c of a given row 1304 can be provided to an on-chip arithmetic logic circuit 1310 that implements Eqs. (1a)-(1c) to produce R, G, and B output signals. It should be understood that the sensor rows 1304 can also include other types of ambient-light sensor channels, e.g., as described above with reference to FIG. 4.

Figure 14A:
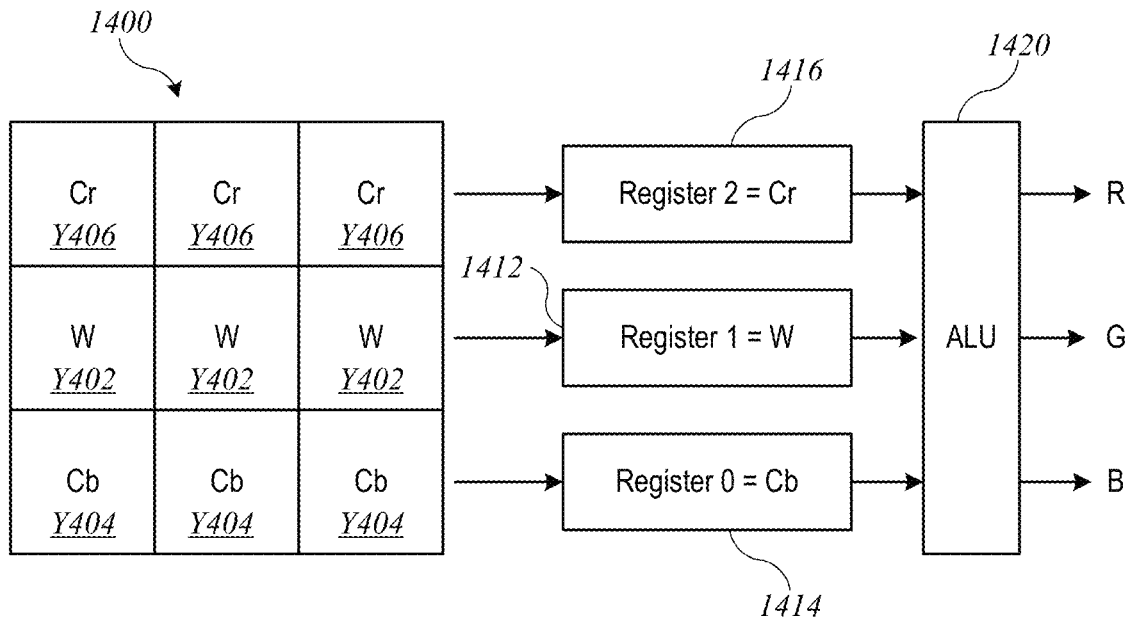
FIGS. 14A and 14B show examples of a multispectral sensor channel having a patterned optical filter according to some embodiments.

Spectrally-encoded passbands can also be implemented in sensor arrays having multispectral sensor channels or hybrid sensor channels. FIG. 14A shows a simplified front view of a multispectral sensor channel 1400 according to some embodiments. Multispectral sensor channel 1400 has a patterned optical filter that includes regions 1402 having a W passband (as shown in FIG. 12), regions 1404 having a Cb passband, and regions 1406 having a Cr passband. In this example, the regions are square, but no particular filter geometry is required. A separate photosensor (e.g., one or more SPADs) can be placed behind each region, as described above with reference to FIG. 5. While FIG. 14A shows three regions for each passband, it is to be understood that any number of regions can be provided for a given passband (as long as a separate photosensor is provided for each region).

Figure 14B:
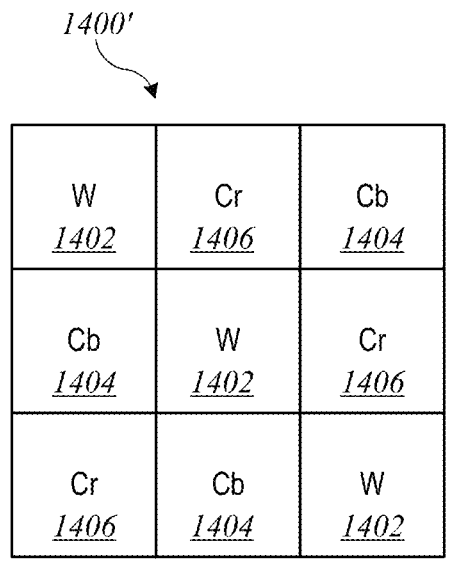

All photosensors associated with the same passband can provide ambient-light intensity measurements (e.g., in the form of electronic signals representing photon counts) to the same integration register. Thus, for example, register 1412 can accumulate (or integrate) photon counts from photosensors in regions 1402, register 1414 can accumulate photon counts from photosensors in regions 1404, and register 1416 can accumulate photon counts from photosensors in regions 1406. Registers 1412, 1414, and 1416 can provide accumulated photon counts as inputs to an on-chip arithmetic logic circuit 1420 that implements Eqs. (1a)-(1c) to produce R, G, and B output signals. It should be understood that multispectral sensor channel 1400 can also include other regions having different types of optical filters, e.g., as described above with reference to FIG. 5. Further, while FIG. 14A shows optical filters with the same passband occupying contiguous regions within the channel area, this is not required. For example, FIG. 14B shows an alternative patterned optical filter 1400' in which regions 1402, 1404, 1406 having the same passband are distributed across the channel area, which may further improve measurement accuracy. As in FIG. 14A, intensity measurements (e.g., photon counts) from different photosensors associated with the same type of optical filter can be accumulated (or integrated) in the same integration register.

The foregoing examples of optical filters with spectrally-encoded passbands and ambient-light sensor channels incorporating such filters are illustrative and not limiting. Spectrally-encoded passbands can be incorporated into any of the multispectral sensor arrays described above, including 1D arrays, 2D arrays, arrays with multispectral pixels, and arrays with hybrid pixels. Examples herein use three passbands to encode three color channels, but it will be appreciated that any number of different optical filters having overlapping passbands can be used to encode spectral information with any granularity desired. This encoding technique is not limited to spectral characteristics of light. For instance, similar arrangements can be implemented using polarization filters (e.g., in combination with a non-polarizing filter) to encode polarization information with any granularity desired.

It should be understood that the multispectral sensor arrays described above are illustrative and that many variations and modifications are possible. A given multispectral sensor array can include any combination of depth channels (e.g., LIDAR sensor channels or hybrid sensor channels), ambient-light sensor channels, multispectral sensor channels, and/or hybrid sensor channels, which can be constructed using any of the techniques described above or other techniques. Components described with reference to one example or embodiment may be used in other embodiments.

2. Optics for Multispectral Sensor Arrays

Various sensor arrays described above operate in response to light that passes through an aperture associated with each channel. In some embodiments, optical systems are provided to direct and focus light onto the aperture plane. Examples of optical systems and optical elements that can be used in connection with multispectral sensor arrays (e.g., sensor arrays 200, 400, 500, 600, and/or 900) will now be described.

As used herein, the term bulk optic(s) refers to single lenses and/or lens assemblies that have a focal plane and transmit light from or to all micro-optic channels in an array simultaneously. In some embodiments, bulk optics may have sizes (e.g., diameters) on the order of millimeters or centimeters or greater, such as those used in commercially available camera lenses and microscope lenses. In this disclosure, the term bulk optics is contrasted with the term micro-optics which refers to optical elements or arrays of optical elements that are provided for a specific sensor channel. In some embodiments, micro-optics may have individual element diameters corresponding to the size of a single sensor channel (e.g., on the order of a few micrometers to a few millimeters in size or smaller). In general, micro-optics can modify light differently for different emitters and/or different sensor channels of an array of emitters or an array of sensor channels, whereas the bulk optics modify light for the entire array.

2.1. Bulk Optical Modules

Figure 15:
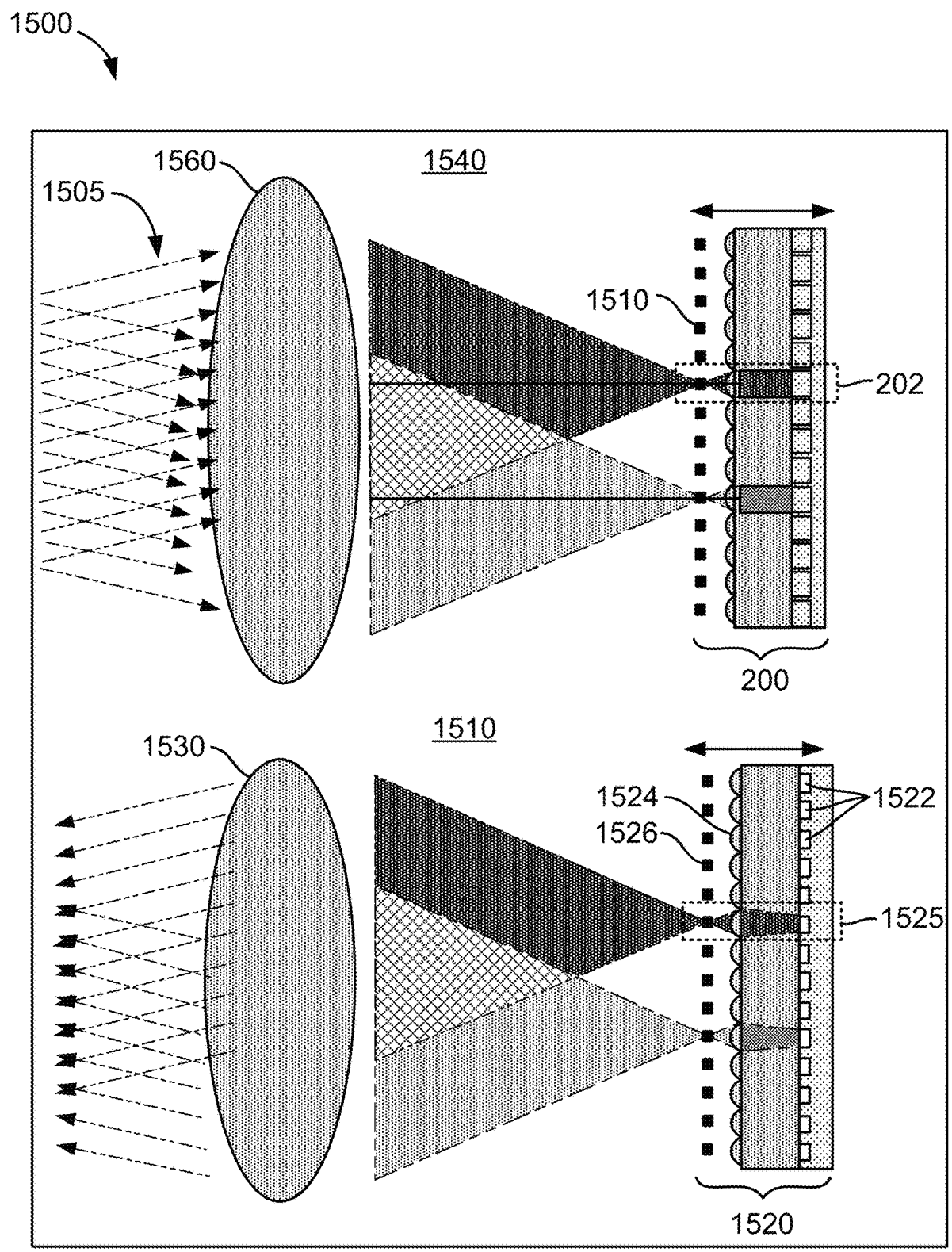
FIG. 15 shows a simplified side view of a light ranging/imaging device that can incorporate the sensor array of FIG. 2.

A multispectral sensor array (such as any of the sensor arrays described above) can be incorporated into a light ranging/imaging device 1500 as shown in FIG. 15. Light ranging/imaging device 1500 includes a light transmission (Tx) module 1510 and a light sensing (Rx) module 1540, which can include an implementation of sensor array 200 (or any other sensor array described above). Additional examples of configurations for light transmission module 1510 and light sensing module 1540 are set forth in U.S. application Ser. No. 15/979,235 entitled "Optical Imaging Transmitter with Brightness Enhancement," filed on May 14, 2018, and U.S. application Ser. No. 15/979,266 entitled "Spinning LIDAR Unit with Micro-optics Aligned behind Stationary Window," filed on May 14, 2018, the disclosures of each of which are incorporated herein by reference in their entirety for all purposes.

As shown in FIG. 15, Tx module 1510 can include a Tx-side micro-optics package 1520 and a bulk optical element 1530. Tx-side micro-optics package 1520 includes a number of light emitters 1522, and optionally includes a micro-lens layer 1524 and an aperture layer 1526. Emitters 1522 can be arranged in a one or two-dimensional array of transmitter channels, e.g., channel 1525 shown in the boxed region. Each one of the transmitter channels has one or more light emitters 1522, e.g., near-infrared (NIR) vertical cavity semiconductor lasers (VCSELs) or the like, capable of emitting narrowband light, and optionally, a micro-lens from lens layer 1524 and an aperture from aperture layer 1526.

In operation, Tx module 1510 provides active illumination of objects in the area around the LIDAR system by, e.g., transmitting pulses of narrow band light, e.g., NIR light having a spectral width of, e.g., 10 nm, 2 nm, 1 nm, 0.5 nm, 0.25 nm or less, into one or more fields of view. Rx module 1540, particularly LIDAR sensor channels 202 thereof, detects reflected portions of the transmitted narrowband light that is reflected by the objects in the scene. At the same time, each ambient-light sensing channel 206R/GB of Rx module 1540 can detect ambient light in its particular wavelength band.

Light emitted from each one of the transmitters diverges as it approaches one of the micro-optics of the Tx-side micro-optic lens layer 1524. Micro-lenses from micro-lens layer 1524 capture the diverging light and refocus it to a focal plane that is coincident with apertures in aperture layer 1526 that includes an array of apertures that correspond in position to the array of micro-optics and the array of emitters. Aperture array 1526 can reduce crosstalk in the system. After exiting the micro-lenses, the focused light again diverges in the form of cones that then encounter the Tx-side bulk imaging optics module 1530. In some embodiments, the separation between the micro-lens layer 1524 and the Tx-side bulk imaging optics module 1530 is equal to the sum of their focal lengths, such that light focused at the aperture array 1526 appears as collimated light at the output of the Tx-side bulk imaging optics module 1530 with each collimated bundle of rays exiting the Tx-side bulk imaging optics module 1530 with a different chief ray angle. Accordingly, the light from each emitter is directed to a different field of view ahead of the device. In some embodiments, the Tx-side bulk imaging optic 1530 is telecentric on the imaging side (which is the emitter side) of the lens, i.e., the chief rays on the image side of bulk imaging optic 1530 are substantially parallel to each other and normal to the image plane (which is the emitter plane) for every position on the image plane. In this configuration the emitter array advantageously operates as a telecentric source, i.e., the optics capture substantially all light produced by the emitter array, even light that is emitted from the emitters on the outer edges of the array. Without the telecentric design, light captured by the outer emitters may be reduced because only the fraction of the emitted ray cone that coincides with the lens's oblique ray cone would be captured by the lens. LIDAR sensing channels 202 of Rx module 1540 can be arranged to match Tx-side micro-optics package 1520, with a LIDAR sensor channel 202 corresponding to each micro-optic transmitter channel 1525.

Rx module 1540 includes an Rx-side bulk imaging optics module 1560 and sensor array 200. The portions of the emitted light that reflect off of objects in the field, shown as light rays 1505, enter the Rx-side bulk imaging optics module 1560 from multiple directions. The Rx-side bulk imaging optics module 1560 can include a single lens or a multi-lens group that focuses light rays 1505 at a plane that is coincident with the Rx-side input aperture layer 310, allowing the light to enter the LIDAR sensor channels 202. In some embodiments, Rx module 1540 includes a LIDAR sensor channel for each emitter 1522 with the field of view of each individual LIDAR sensor channel 202 matching the field of view of its respective emitter 1522.

Rx-side bulk imaging optics module 1560 can also collect ambient light. As used herein, "ambient" light refers to any light rays that may be propagating in the environment and that did not originate from Tx module 1510. Ambient light can include direct light from any light source that happens to be present in the environment (e.g., the sun, an artificial luminaire, a traffic signal, etc.) as well as light that has been reflected or scattered by an object in the environment (e.g., light reflected off a road sign, a vehicle, a road surface, a tree, etc.). Ambient light can propagate in any direction, and ambient light that happens to be propagating in a similar direction to light rays 1505 may enter and pass through Rx-side bulk imaging optics module 1560.

2.2. Per-Channel Compensating Micro-Optics

In some embodiments, Rx-side bulk imaging optics module 1560 can be designed as a monochromatic lens (single lens or lens group) that is optimized to focus a particular narrow wavelength band, e.g., the LIDAR operating wavelength onto a target plane, e.g., input aperture plane 310. Rx-side bulk imaging optics module 1560 may exhibit chromatic aberration (i.e., a focal length that is wavelength-dependent). This may reduce the collection efficiency of the ambient-light sensor channels: if an implementation of Rx-side bulk imaging optics module 1560 that has chromatic aberration focuses light of the LIDAR operating wavelength onto input aperture plane 310, then light of wavelengths other than the LIDAR operating wavelength would not focus at input aperture layer 310, and some of that light would be blocked by the aperture stops rather than entering ambient light sensor channels 206R/GB. Further, the amount of light lost due to this effect would be wavelength-dependent, which may complicate analysis of imaging data. In addition, the spatial resolution of these channels would be reduced (field of view would be larger and less well defined, i.e., "blurry") because the apertures 310 are not at the focal plane for their wavelength band or because the monochromatic lens is incapable of providing small focused spots for out-of-band light.

Figure 16:
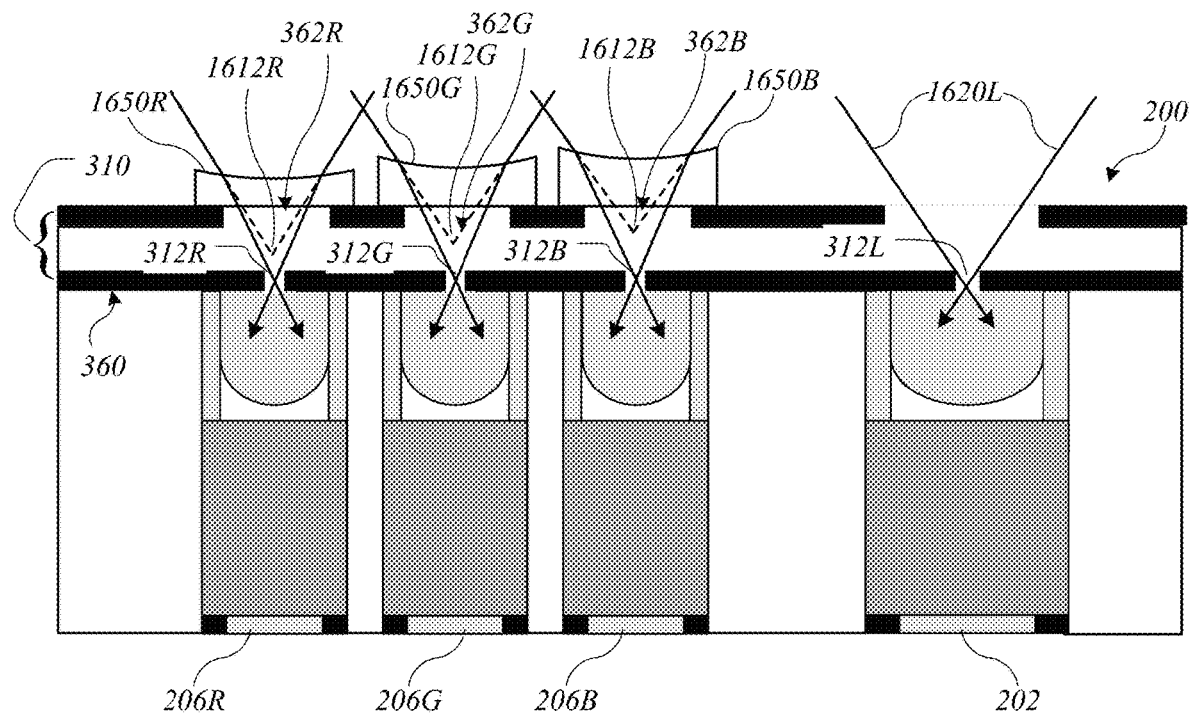
FIG. 16 is a simplified cross-sectional view of a portion of a sensor array with channel-specific compensating micro-optics according to one or more embodiments.

Accordingly, some embodiments of sensor array 200 (or other multispectral sensor arrays described herein) include channel-specific compensating micro-optics that can be placed in front of the input aperture plane to allow more efficient light capture. FIG. 16 is a simplified cross-sectional view of a portion of sensor array 200, with annotations to illustrate the behavior of incident light. (In this example, the tapering of the apertures is reversed relative to FIG. 3, so that apertures 312R/G/B/L are shown at bottom surface 360 of aperture layer 310. However, the same principles apply regardless of the exact location of the aperture plane.)

In the example of FIG. 16, the dashed lines illustrate an effect of chromatic aberration. The converging dashed lines over channels 206R, 206G, and 206B show the respective marginal rays for red, green, and blue light rays that have been focused by a bulk optic (e.g., Rx-side bulk imaging optics module 1560 of FIG. 15) that has chromatic aberration. As can be seen, LIDAR light rays 1620L converge at aperture plane 360; however, light of shorter wavelengths (visible light in this example) converges in front of aperture plane 360, with the distance depending on wavelength. Thus, in this example, focal point 1612R for red light is slightly in front of input aperture 312R, focal point 1612G for green light is farther in front of input aperture 312G, and focal point 1612B for blue light is farther still in front of input aperture 312B. In the absence of corrective optics, the focused red, green, and blue rays (dashed lines) would diverge prior to reaching aperture plane 360, leading to varying degrees of light loss at apertures 312R, 312G, and 312B.

In some embodiments, channel-specific compensating micro-optics can be used to correct for such effects. For example, as shown in FIG. 16, a first compensating micro-optic, in this example a first plano-concave lens 1650R, is placed in front of aperture layer 310, aligned with the opening 362R for red channel 206R. Plano-concave lens 1650R has an optical prescription (e.g., surface curvature or focal length) that reduces the divergence of incident light, shifting the focal point for red light from uncorrected focal point 1612R to aperture 312R. A second compensating micro-optic, in this example a second plano-concave lens 1650G, is aligned with opening 362G. Plano-concave lens 1650G has a prescription that reduces the divergence of incident light more strongly than plano-concave lens 1650R, shifting the focal point for green light from uncorrected focal point 1612G to aperture 312G. A third compensating micro-optic, in this example a third plano-concave lens 1650B, is aligned with opening 362B. Plano-concave lens 1650B has a prescription that reduces the divergence of incident light more strongly than plano-concave lens 1650G, shifting the focal point for blue light from uncorrected focal point 1612B to aperture 312B. It should be understood that each of plano-concave lenses 1650R, 1650G, 1650B in this example has a different prescription that is optimized for the wavelength (or wavelength range) that the corresponding sensor channel 206R, 206G, 206B is tuned to detect. In this example, no compensating micro-optic is provided for LIDAR channel 202 because Rx-side bulk imaging module 1560 already focuses light of the LIDAR operating wavelength into aperture 312L.

Figure 17:
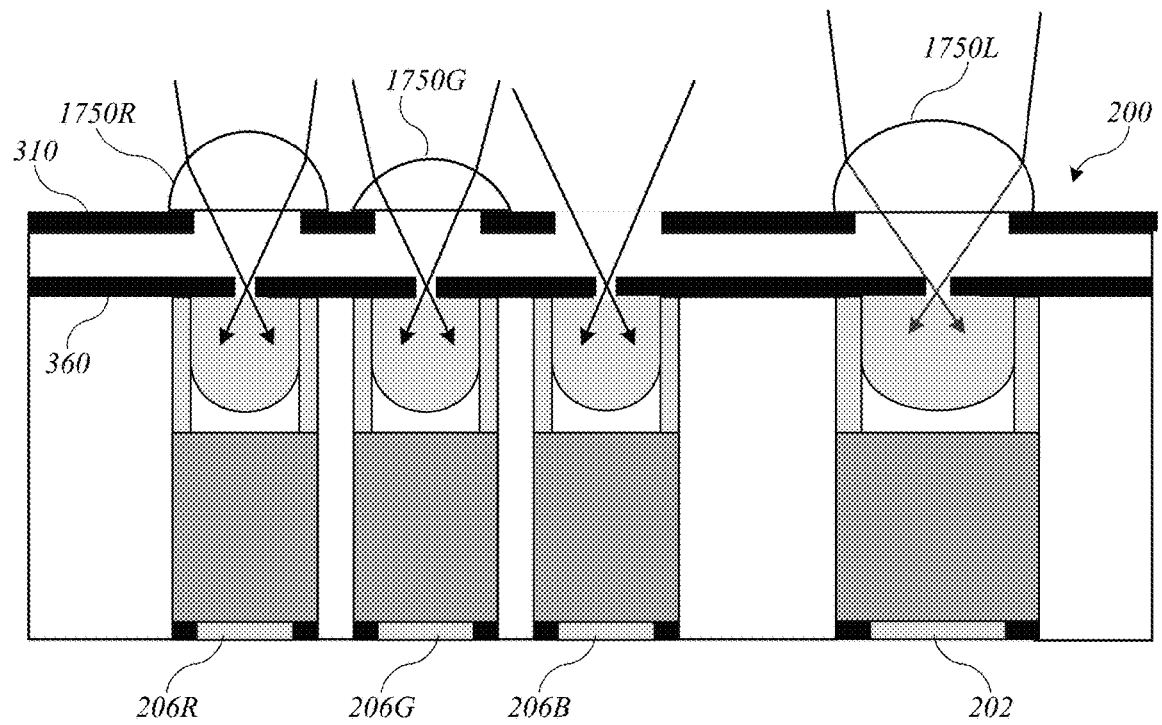
FIG. 17 is a simplified cross-sectional view of a portion of a sensor array with channel-specific compensating micro-optics according to one or more embodiments.

In other embodiments, the particular wavelength for which the Rx-side bulk imaging module focuses light onto the input aperture plane can be different. By way of illustration, FIG. 17 shows an example of channel-specific compensating micro-optics for an embodiment where an Rx-side bulk imaging module 1560 that has chromatic aberration focuses blue light onto aperture plane 360. In this example, blue channel 202B does not use any compensating micro-optic, but (due to chromatic aberration) without compensating micro-optics, the focal points for the desired light wavelengths for other channels would lie beyond aperture plane 360, again leading to wavelength-dependent amounts of light loss and spatial selectivity. To compensate for this, channel-specific compensating micro-optics, in this example plano-convex lenses 1750R, 1750G, and 1750L, can be placed in front of the channel openings for red channel 206R, green channel 206G, and LIDAR channel 202. In this example, the plano-convex lenses have prescriptions that increase the divergence of incident light, shifting the focal point in a direction toward aperture plane 360 so that, for a given senor channel, the focal point for light of the color to which that sensor channel is tuned coincides with aperture plane 360. As in the previous example, the channel-specific compensating micro-optic for each channel has a different prescription that brings the focal point for the particular channel onto aperture plane 360.

Figure 18:
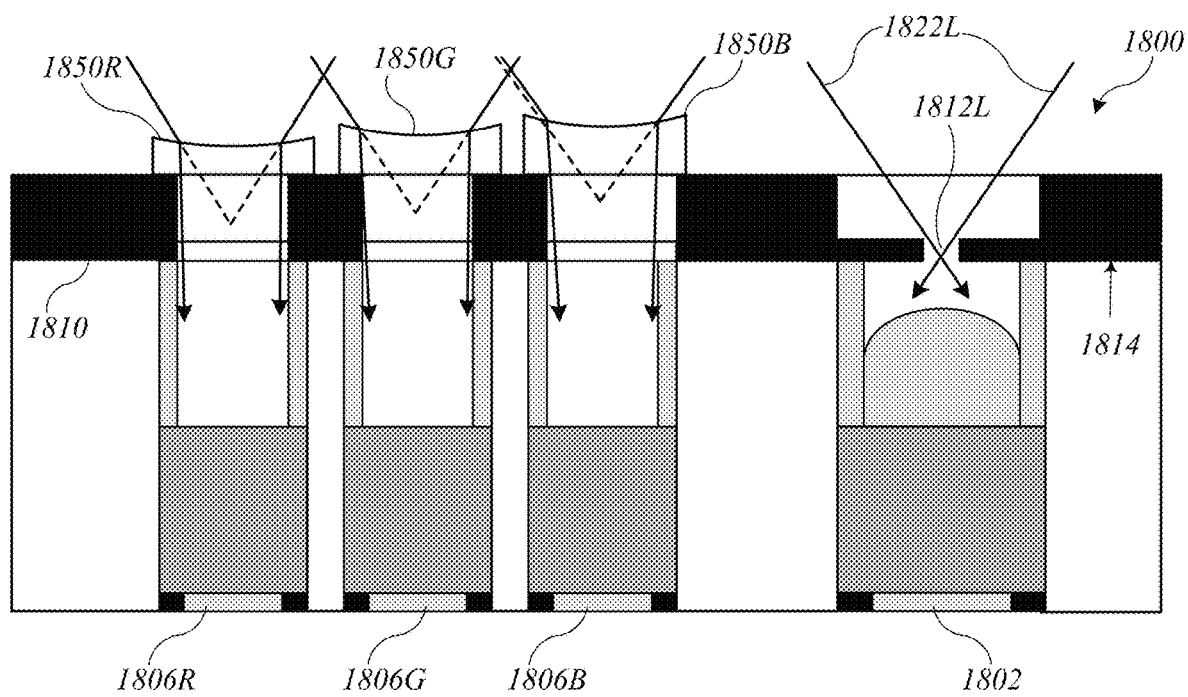
FIG. 18 is a simplified cross-sectional view of a portion of a sensor array with channel-specific compensating micro-optics according to one or more embodiments.

In the examples of FIGS. 16 and 17, light is focused onto the aperture plane, then collimated by optical elements within the sensor channel (e.g., as shown in FIG. 1A or 1B). Another option is to provide channel-specific compensating micro-optic elements for the ambient light channels that collimate light at the channel-specific wavelength. FIG. 18 shows an example of a sensor array 1800 with collimating channel-specific compensating micro-optics that can be used in some embodiments. In this example, substrate array 1800 is generally similar to substrate array 200, but the aperture 1812R, 1812G, 1812B for each ambient-light channel is substantially as wide as the channel. (Aperture 1812L for LIDAR channel 1802 can be narrower, e.g., as shown.) In this arrangement, optical element 132 (shown in FIG. 1A or 1B) can be omitted, at least for ambient light channels 1806R, 1806G, 1806B, which are otherwise similar to ambient light channels 206R, 206G, 206B described above. It should be noted that with this arrangement, ambient-light channels 1806R, 1806G, 1806B can be made smaller and packed more tightly than LIDAR channels 1802. In the ambient light channels, the narrow channel width can provide spatial selectivity without requiring an aperture narrower than the channel width; however, the collimation angle would be larger, which results in increasing the lower bound on the width of a bandpass filter.

Similarly to the example of FIG. 16, Rx-side bulk imaging module 1560 focuses light of the LIDAR operating wavelength (rays 1822L) into aperture 1812L. Light of shorter wavelengths is focused at different distances from back plane 1814, as shown by dashed lines. Plano-convex lenses 1850R, 1850G, 1850B decrease the divergence of red,
green and blue light, respectively, to collimate the light of desired wavelength as it enters the channel, as shown by the colored lines. As in the previous example, the channel-specific compensating micro-optic for different color channels has a different prescription that compensates for the wavelength-dependent focal lengths of incoming light.

These examples are illustrative and not limiting. An Rx-side bulk imaging module that has chromatic aberration can be adapted to focus light of any desired wavelength onto the aperture plane, and channels that are sensitive to other wavelengths can have compensating micro-optics with wavelength-specific (or channel-specific) positive (focusing) or negative (defocusing) prescriptions placed in front of their apertures. For ease of assembly, the compensating micro-optic elements for all channels in the sensor array (or all channels that include such elements) can be placed on the same plane (e.g., on top of the aperture layer). The particular shape of the compensating micro-optic elements can be varied; for instance, the compensating micro-optic for a given channel can include a plano-convex lens, a plano-concave lens, a biconvex lens, a biconcave lens, a convex-concave lens, freeform lenses, or a combination of multiple lenses. Different shapes can be used for different channel types as desired. As the examples above show, compensating micro-optics need not be provided for all sensor channels in a given sensor array; in some embodiments, the Rx-side bulk imaging module can be designed such that light having the desired wavelength for one of the sensor channel types is focused at the aperture for the channel. However, no particular design for the Rx-side bulk imaging module is required, and in some embodiments every sensor channel may have a channel-specific compensating micro-optic element to compensate for any aberrations in the system, for instance if the system contains a window or housing with optical power that requires correction. A sensor array can include multiple sensor channels associated with a given wavelength, e.g., as described above. In some embodiments, different sensor channels of the same channel type (e.g., wavelength range) can be designed identically so that the compensating micro-optic prescription needs to be determined only once per channel type. Alternatively, since different channels are in different locations relative to the Rx-side bulk imaging module and since aberration effects (including chromatic aberration) in an optical module can depend on distance from the optical axis of the module, it may be desirable to design a compensating micro-optic for each channel individually. In any case, an appropriate prescription for a given channel-specific compensating micro-optic element can be determined by applying conventional optical modeling techniques to a particular channel design and a particular design of the Rx-side bulk imaging module.

Channel-specific compensating micro-optics can be fabricated from any material that is optically transparent at the relevant wavelengths. Molding or other processes can be used to shape the micro-optics. In some embodiments, the micro-optics for all channels of the sensor array can be fabricated as a single structure having surface features (e.g., regions of locally convex or concave curvature) that define the per-channel micro-optic element and assembled with other layers of a monolithic sensor array. Further, the prescriptions for the channel-specific micro-optic elements can be chosen based on any optical properties of the bulk optics, not limited to chromatic aberration. Examples of using channel-specific micro-optic elements to compensate for focal plane curvature of a bulk optic are described below.

2.3. Achromatic Bulk Optics

In some embodiments, per-channel compensating micro-optics can be omitted. For example, the bulk optical module may have negligible (or no) chromatic aberration so that light of all relevant wavelengths is focused at the same aperture plane. An achromatic bulk optic module may be particularly useful for sensor arrays that include multispectral sensor channels (e.g., sensor array 500) and/or hybrid sensor channels (e.g., sensor array 600), as well as for sensor arrays where some of the photosensors are disposed in the aperture plane (e.g., sensor array 900).

Figure 19:
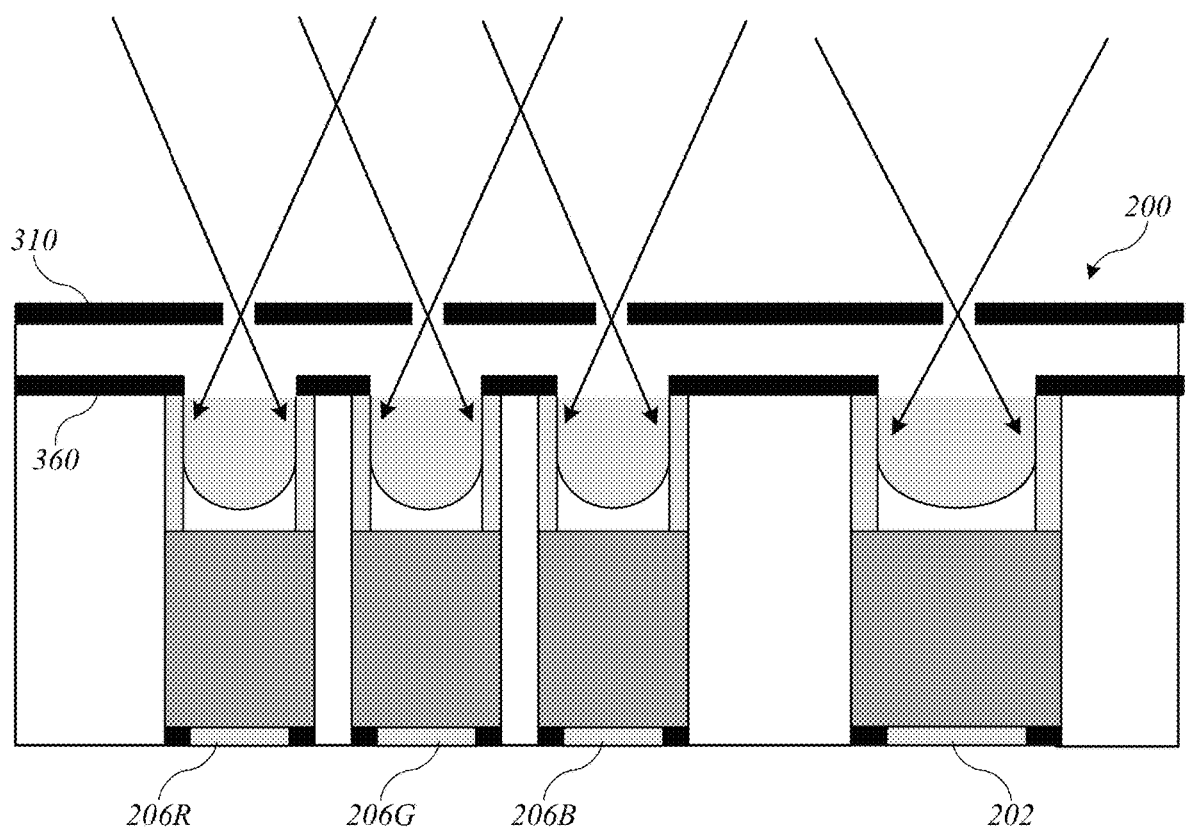
FIG. 19 is a simplified cross-sectional view of a portion of a sensor array with an achromatic bulk optical module according to one or more embodiments.

FIG. 19 shows an example of sensor array 200 in a system with an achromatic bulk optical module that focuses all colors in aperture plane 310. Per-channel compensating micro-optics are not used in this example. For channels with wide passband (e.g., channels 206R/GB), the optical filters can be located anywhere in the channel. For polarization channels (not shown), one or more polarization gratings can be included in the stack (e.g., in the optical filter layer) or in a metal layer of the underlying ASIC photosensor(s).

Figure 20:
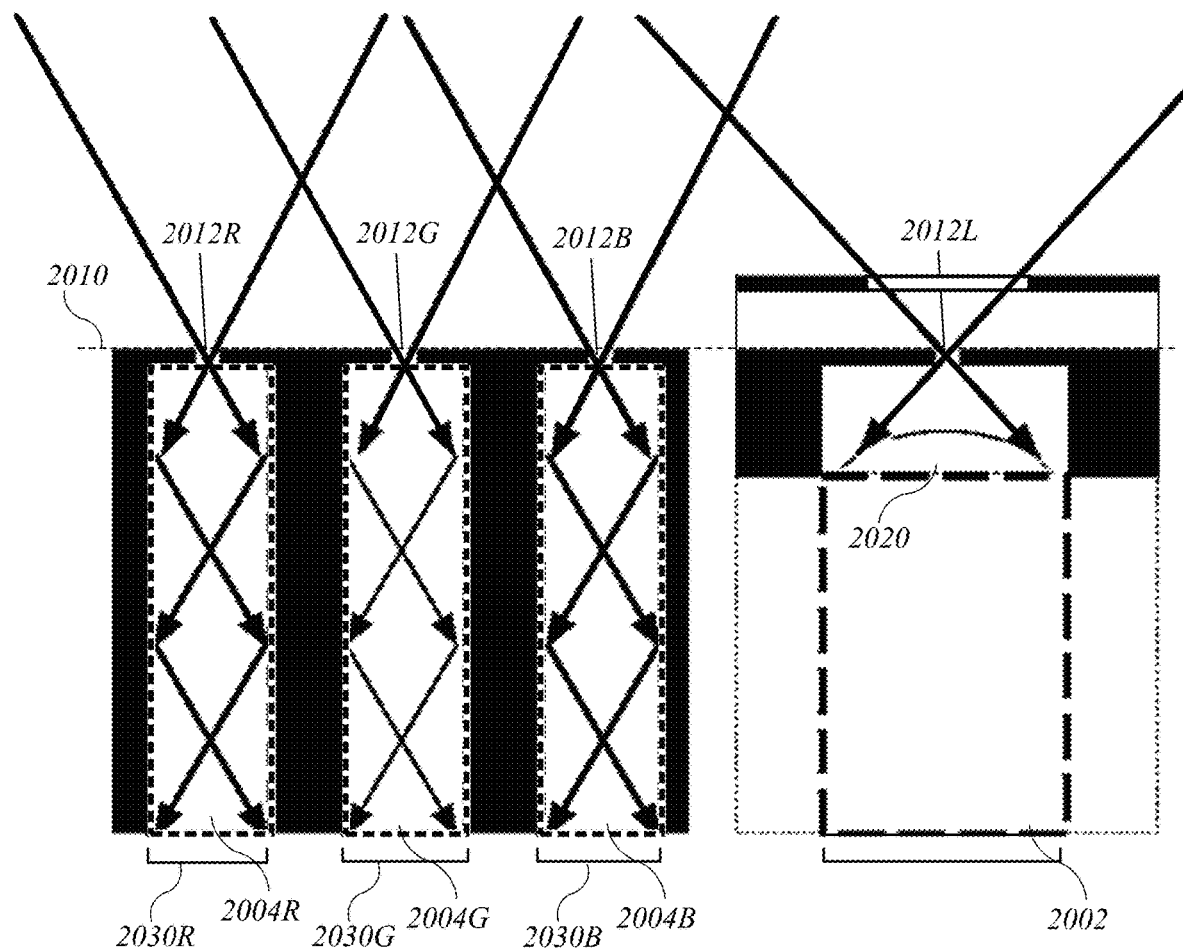
FIG. 20 is a simplified cross-sectional view of a portion of another sensor array with an achromatic bulk optical module according to one or more embodiments.

FIG. 20 shows another example of a sensor array 2000 in a system with an achromatic bulk optical module that focuses all colors in aperture plane 2010. In this example, LIDAR sensor channel 2002 and ambient-light sensor channels 2004R, 2004G, 2004B are fabricated as separate monolithic devices arranged side-by-side. Each sensor channel 2002, 2004R/G/B has an aperture 2012L, 2012R/GB located in the same aperture plane 2010. LIDAR sensor channel 2002 includes collimating optics 2020. Ambient-light sensor channels 2004R/G/B in this example do not include collimating optics. Instead, non-refractive optics (e.g., light guides) can be used to direct light through the channel to photosensors 2030R, 2030G, 2030B. For wide passbands, color filters can be placed anywhere in the channel. Although shown for sensor channels having a single sensor type, channel configurations with non-refractive optics may also be useful for multispectral sensor channels (e.g., multispectral sensor channels 506 of FIG. 5) or hybrid sensor channels (e.g., hybrid sensor channels 602 of FIG. 6).

2.4. Micro-optics to Compensate for Focal Plane Curvature

Examples described above assume that the bulk optical module focuses light (of a given wavelength) onto a (flat) image plane, regardless of where the light passes through the bulk optical module. In the examples shown above (e.g., in FIGS. 19 and 20), the image plane coincides with the aperture plane.

Figure 21:
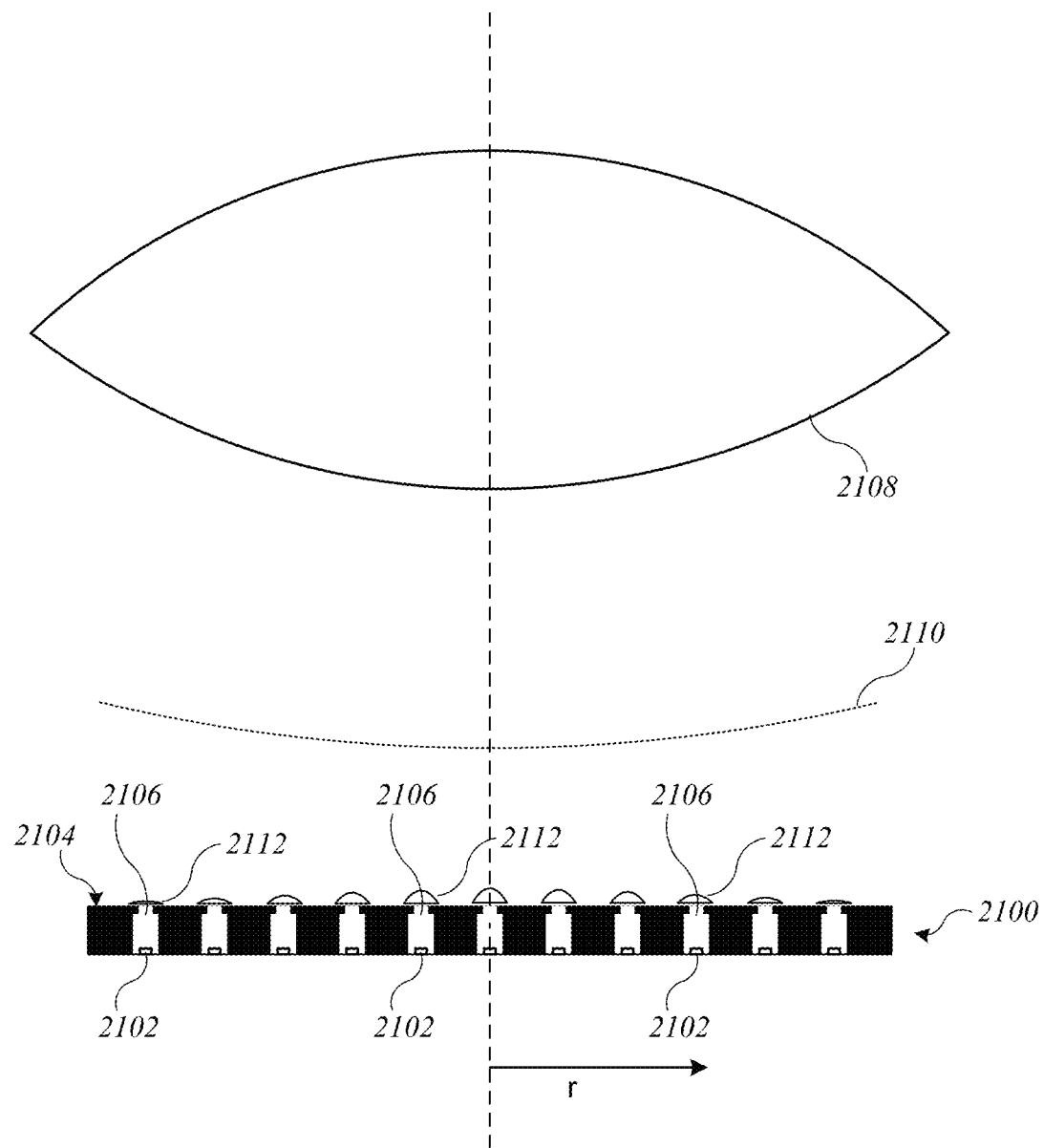
FIG. 21 shows an example of a sensor module with per-channel micro-optics to correct for focal length of a bulk optic module according to one or more embodiments.

In some embodiments, a bulk optical module may focus light of a given wavelength onto a curved surface (referred to as a "curved focal plane") rather than a flat plane. Where this is the case, per-channel micro-optics similar to examples described above can be employed to compensate for an offset between the curved focal plane and the (flat) aperture plane at the location of each aperture. FIG. 21 shows an example of per-channel micro-optics to correct for focal length of a bulk optic module that can be used in some embodiments. A sensor array 2100 has a row of sensor channels 2102 arranged in a plane. (A one-dimensional sensor array is shown for simplicity of illustration; it will be understood that the same principle applies to two-dimensional sensor arrays.) A planar aperture layer 2104 has apertures 2106 arranged such that each aperture 2106 passes light to a corresponding sensor channel 2102. In this example, bulk optic module 2108 has a curved focal plane, represented by dotted line 2110. In front of each aperture 2106 is a channel-specific micro-optic element 2112 that compensates for the curvature of focal plane 2110. For instance, each channel-specific micro-optic element 2112 can have a prescription that corrects for the offset between the location of the corresponding aperture 2106 and a corresponding location on curved focal plane 2110 so that light is focused into the corresponding aperture 2106 (rather than in front of or behind aperture 2106). In this example, for most of apertures 2106, the corresponding location on curved focal plane 2110 is in front of planar aperture layer 2104, and the corresponding channel-specific micro-optic elements 2112 have positive focusing power. In this example, the magnitude of the focusing power of different channel-specific micro-optic elements 2112 increases with radial distance r from the optical axis 2114 of bulk optic module 2108. In other examples (not shown) curved focal plane 2110 can be behind planar aperture layer 2104 at some or all of the aperture locations 2106, and any particular channel-specific micro-optic element 2112 can have positive or negative focusing power as needed. In some embodiments, curved focal plane 2110 of bulk optic module 2108 may coincide with the aperture plane of one or more sensor channels, and channel-specific micro-optic elements 2112 for such sensor channels may be omitted, or micro-optic elements with zero focusing power may be provided.

Figure 22:
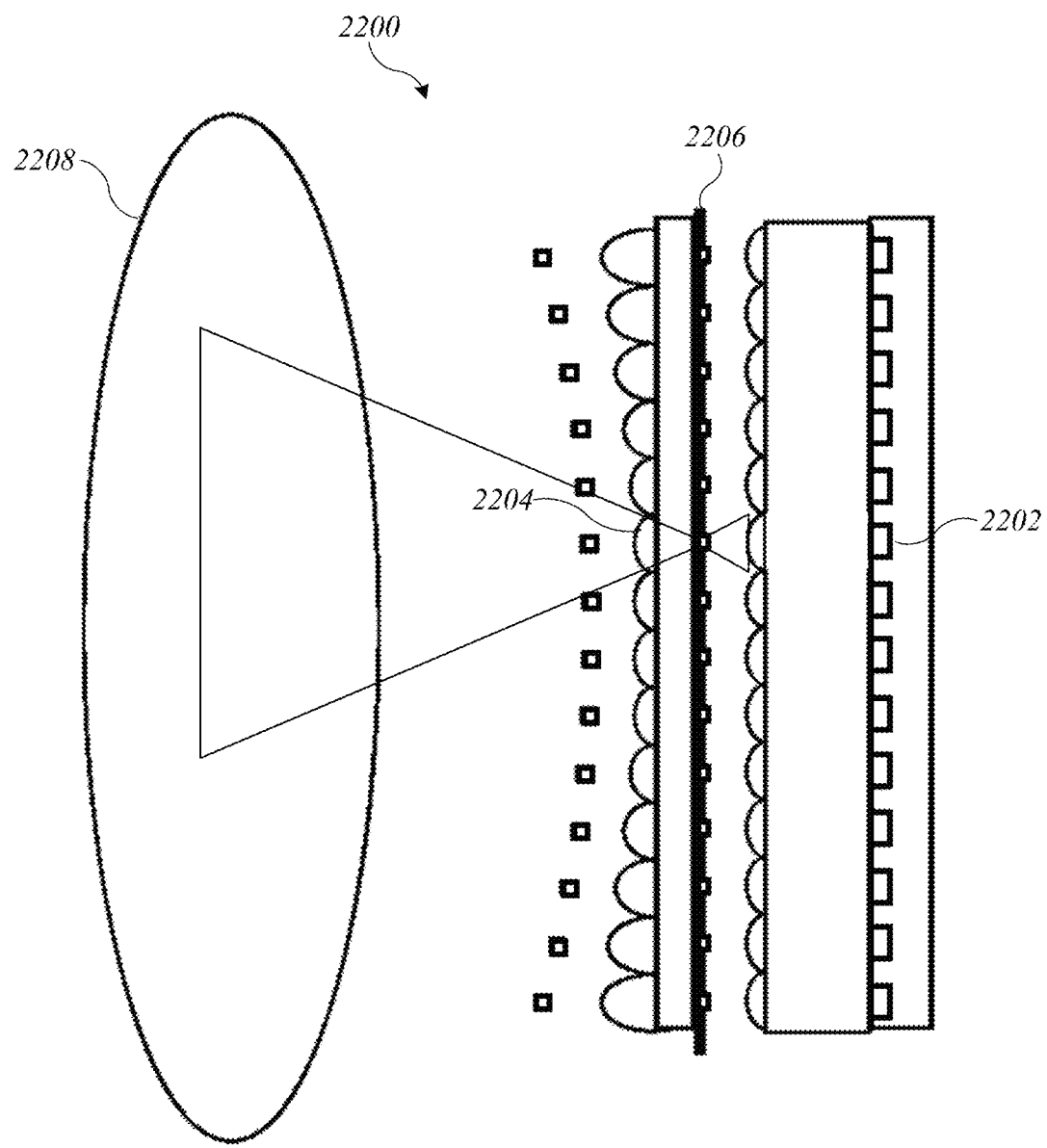
FIG. 22 shows another example of a receive module with channel-specific micro-optic elements according to one or more embodiments.

FIG. 22 shows another example of a receive (Rx) module 2200 with channel-specific micro-optic elements. Rx module 2200 can be similar to Rx module 1540 of FIG. 15 described above and can include any combination of sensor channel types. For instance, all channels 2202 can be LIDAR sensor channels, all channels can be ambient-light sensor channels, all channels 2202 can be hybrid sensor channels, or a combination of different sensor channel types can be present. In this example, channel-specific micro-optic elements 2204 are provided in front of an aperture plane 2206 to compensate for the curvature of the focal plane of bulk optic module 2208. As in the example of FIG. 21, the prescription of channel-specific micro-optic elements 2204 can be a function of the radial distance from the optical axis, corresponding to the curvature of the focal plane of bulk optic module 2208. In this example, channel-specific micro-optic elements 2204 have positive focusing power that increases with radial distance from the optical axis; however, as noted above, some or all channel-specific micro-optic elements 2204 can have negative or zero focusing power.

Figure 23:
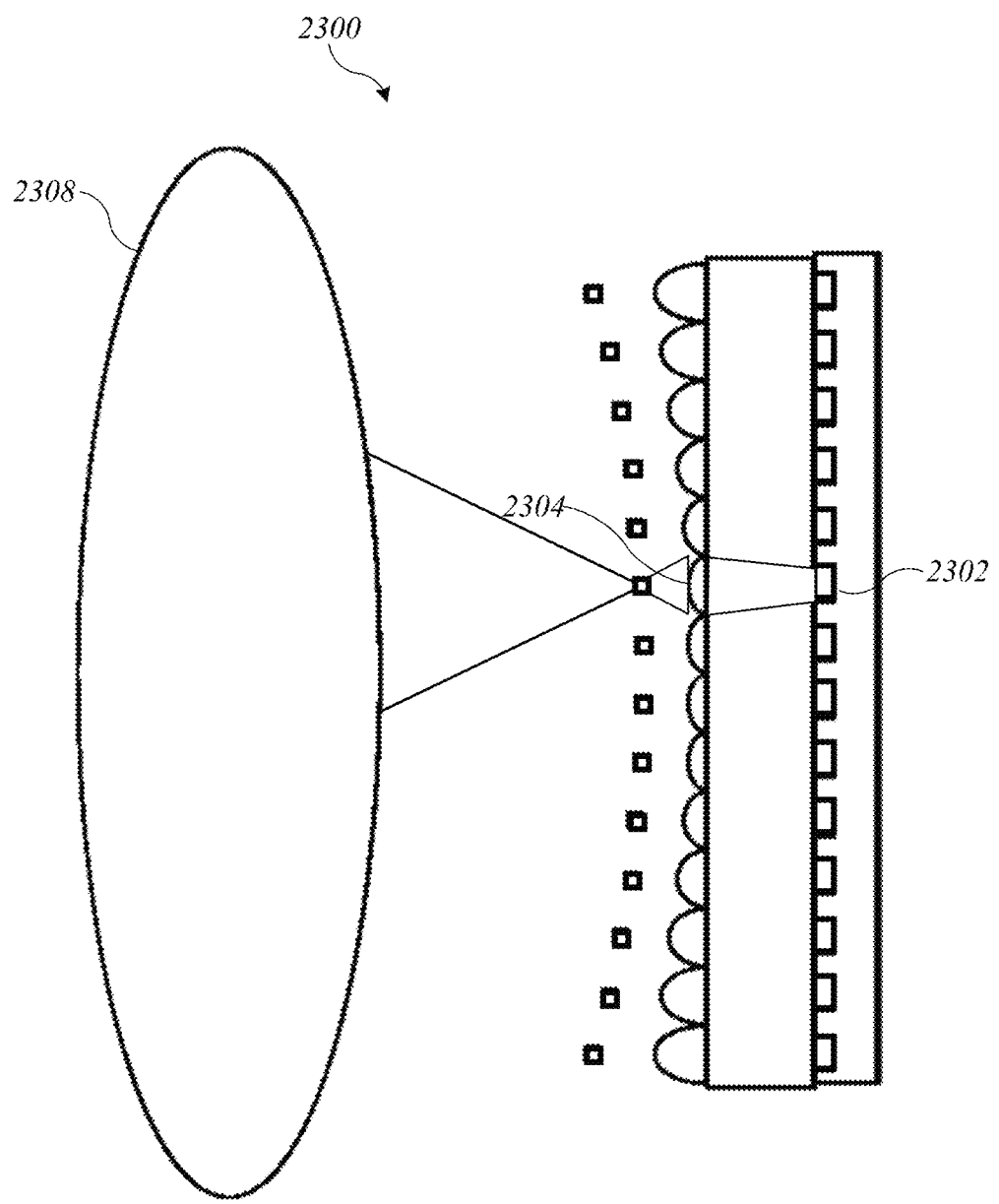
FIG. 23 shows an example of a transmit module with channel-specific micro-optic elements according to one or more embodiments.

In some embodiments, channel-specific micro-optic elements that correct for focal length can be used in LIDAR transmitter arrays as well as in sensor arrays. FIG. 23 shows an example of a transmit (Tx) module 2300 with channel-specific micro-optic elements. Tx module 2300 can be similar to Tx module 1510 of FIG. 15 described above and can include a 1D or 2D array of emitter channels 2302. In this example, channel-specific micro-optic elements 2304 are provided to compensate for the curvature of the focal plane of bulk optic module 2308. As in the examples of FIGS. 21 and 22, the prescription of channel-specific micro-optic elements 2304 can be a function of the radial distance from the optical axis, corresponding to the curvature of the focal plane of bulk optic module 2308.

These examples are illustrative and not limiting. For instance, in the examples described above, the prescription (focusing power) of the channel-specific micro-optic elements is varied to compensate for focal plane curvature of the bulk optic. In other embodiments, a similar per-channel compensation can be achieved by using channel-specific micro-optic elements with the same prescription and a variable standoff distance between the channel-specific micro-optic element and the aperture plane; the standoff distance can be based on the radial distance from the optical axis. A combination of varying the prescription and the standoff distance can also be used.

It should be understood that channel-specific micro-optic elements that compensate for focal plane curvature of a bulk optic module can be useful in contexts other than multispectral sensor arrays. For instance, a LIDAR system that does not include ambient-light sensor channels may also benefit from the clearer imaging associated with compensation for focal plane curvature of the bulk optic modules. Channel-specific micro-optic elements can be incorporated into the transmitter module, the receiver module, or both, depending on the properties of the bulk optics provided for each module. Imaging systems with only ambient-light sensor channels may also benefit, and presence of a transmit module is not required. Use of channel-specific micro-optic elements to compensate for focal plane curvature of a bulk optic module may allow reduction in cost and/or size of the bulk optic module, since bulk lens systems without focal plane curvature are generally larger and more complex than bulk lens systems with focal plane curvature.

In some embodiments of multispectral sensor arrays (e.g., any of the examples described above) or other systems where the bulk optic module exhibits chromatic aberration as well as focal plane curvature, the channel-specific micro-optic element for any given channel can be designed to compensate for both effects, so that light of the desired wavelength for a given channel is focused onto the aperture plane. More generally, channel-specific micro-optic elements can have prescriptions designed to compensate for any optical property (or optical characteristic) of a bulk optic module that has different effects for channels at different positions within an array.

2.5. Uniform Sampling of Object Space

Sensor arrays of the kind described herein can be incorporated into a variety of ranging/imaging systems that generate images made up of multispectral image pixels that each include data obtained from sensors of different types. It is often desirable that such images represent a uniform sampling of the sensor system's field of view (also referred to as "object space"). Specifically, it is desirable to define a regular "grid" of sampling areas in object space (referred to herein as "object-space pixels"), which may be arranged in rows and columns, and to design the sensor system and its operation to produce a grid of image pixels, each of which corresponds to a single object space pixel as imaged by each sensor type in the sensor array. In some embodiments of a ranging/imaging system, the bulk optics are designed to support this uniform sampling of object space.

2.5.1. Optics for Static Systems

In some embodiments, multispectral sensor arrays of the kind described above may be used in a "static" ranging/imaging system. Such a system incorporates a 2D sensor array (e.g., sensor array 600 or sensor array 900 described above) and acquires an image over the surface of the sensor array without moving the array, as described below. An image pixel in such a system can correspond to a hybrid sensor channel (e.g., hybrid sensor channel 602) or a multispectral pixel (e.g., multispectral pixel 1020). Such arrays can uniformly sample the object space, provided that the bulk imaging optic is free of localized distortion. In some embodiments, use of a flat-field focal-length distortion profile may be desirable, so that light is focused onto the aperture plane across the entire array.

2.5.2. Optics for Scanning Systems

In some embodiments, multispectral sensor arrays of the kind described above may be used in an angular scanning or rotating mode such that different sensor channels in a row of a sensor array successively image (i.e., sense photons from) a particular region in the field of view. Examples of scanning operations are described below. For purposes of this description, it is assumed that, during a scanning operation, the sensor system rotates about an axis that is transverse to the rows and that the sensor channels are operated as the sensor system rotates through different angles. (It should be understood that scanning behavior can also be achieved without moving the sensor array, e.g., by using a MEMS mirror to reflect light from different areas of object space onto the array at different times.) It is also assumed that the sensor array and the bulk optical module are held in fixed relation to each other in the sensor system, so that a given sensor channel has a fixed spatial relationship to the optical axis of the bulk imaging optic and "sees" through the same portion of the bulk optical module, regardless of orientation of the system in space.

To simplify image analysis, it is generally desirable that a scanning sensor system uniformly samples the object space. In this context, the grid of object-space pixels is considered to be arranged with rows along the scanning direction and columns in the direction transverse to the scanning direction. In the scanning direction, it is desirable that different sensor channels in the same row (e.g., all sensor channels in the same row 204 of sensor array 202 of FIG. 2) sample the same object-space pixel (at somewhat different times) as the sensor array rotates. This can be achieved in part by coordinating sampling intervals with the rotation of the sensor array, as described below. However, it is also important to avoid pointing error due to differences in the locations of different sensor channels relative to the optical axis of the bulk optical module. Accordingly, in some embodiments, the bulk optical module used with a sensor array in a scanning sensor system is designed to provide uniform sampling in both the scanning and non-scanning directions.

Figure 24A:
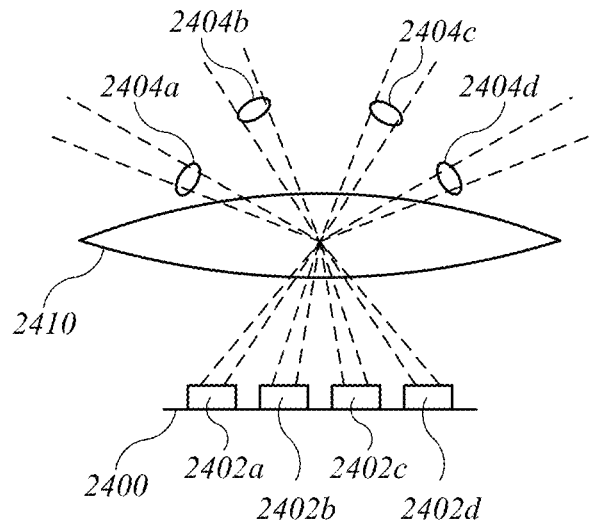
FIGS. 24A and 24B are simplified conceptual illustrations showing the potential for pointing error in a scanning system using a sensor array.
Figure 24B:
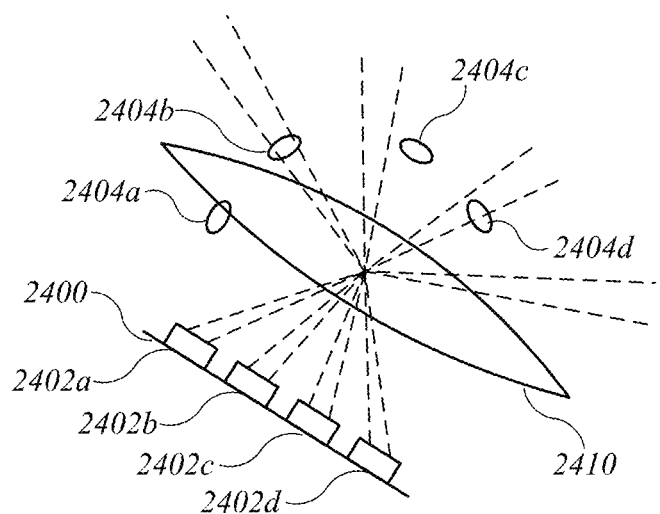

FIGS. 24A and 24B are simplified conceptual illustrations showing the potential for pointing error in a scanning system using a sensor array. FIG. 24A shows a row of a sensor array 2400 that has uniformly spaced sensor channels 2402a-2402d, which may correspond, e.g., to sensor channels in a row 204 of sensor array 200 of FIG. 2. Each sensor channel has a channel field of view through a bulk optic 2410, as indicated by dashed lines. Uniformly-spaced object space pixels, indicated by ovals 2404a-2404d, align with the channel fields of view of sensor channels 2402a-2402d. FIG. 24B shows sensor array 2400 after rotating through an angle such that sensor channel 2402a points approximately at object-space pixel 2404b. Sensor channel 2402b points to the left of object-space pixel 2404c, and sensor channel 2402c points approximately at object-space pixel 2404d.

As can be seen in FIG. 24B, there is pointing error. For instance, the field of view of sensor channel 2402b does not point at object-space pixel 2404c, and the field of view of sensor channel 2402c does not precisely align with object-space pixel 2404d. The term "intrapixel pointing error" is used herein to refer to differences in the field of view between sensor channels that are nominally pointed at the same object-space pixel. (These differences are "intrapixel" with respect to object-space pixels.) In some embodiments, controlling intrapixel pointing error is desirable when gathering multispectral pixel data.

In addition to intrapixel pointing error, a sensor system may have "interpixel pointing error," which refers to non-uniform spacing between object-space pixels in either the row (scanning) direction or the column (non-scanning) direction. In a scanning sensor system, uniformity of pixel spacing in the scanning direction can be achieved by controlling the shutter intervals relative to the rotation angle of the sensor system (e.g., as described below) and by limiting the intrapixel pointing error. In the non-scanning direction, it is desirable that the object-space pixels along a column are uniformly spaced and that columns in object space map to columns in image space. In this connection, it should also be noted that some sensor arrays (e.g., sensor array 200) may include a set of staggered sensor channels (e.g., LIDAR channels 202). In this case, a single column of object-space pixels can be imaged by scanning the array and controlling the shutter intervals to create a column alignment. For example, in the case of sensor array 200, a column of the image can have sixteen pixels, even though the sixteen sensor channels 202 are not aligned in a column on sensor array 200.

The desired imaging behavior is achieved in some embodiments by providing a bulk optic module that has a focal length distortion profile in which displacement of a light ray is linear with changes in the tangent of the angle of incidence ($\theta$) of the ray. Lenses (or lens systems) with this type of focal length distortion profile are commonly referred to as "F tan $\theta$" lenses (signifying that the displacement distance at the image plane is a linear function of tan $\theta$), or "flat field" lenses. For small angles $\theta$, an F tan $\theta$ lens has the property that the displacement of a light ray on the image plane (i.e., the sensor array) is approximately linear with changes in the angle of incidence ($\theta$) of the ray. In the scanning direction, this provides the desired behavior of reducing intrapixel pointing error. In the non-scanning direction, this provides uniform sampling in object space for sensor rows spaced with a uniform pitch and also allows columns of object-space pixels to map to columns of image-space pixels, even if the sensors are arranged in a staggered fashion.

Figure 25:
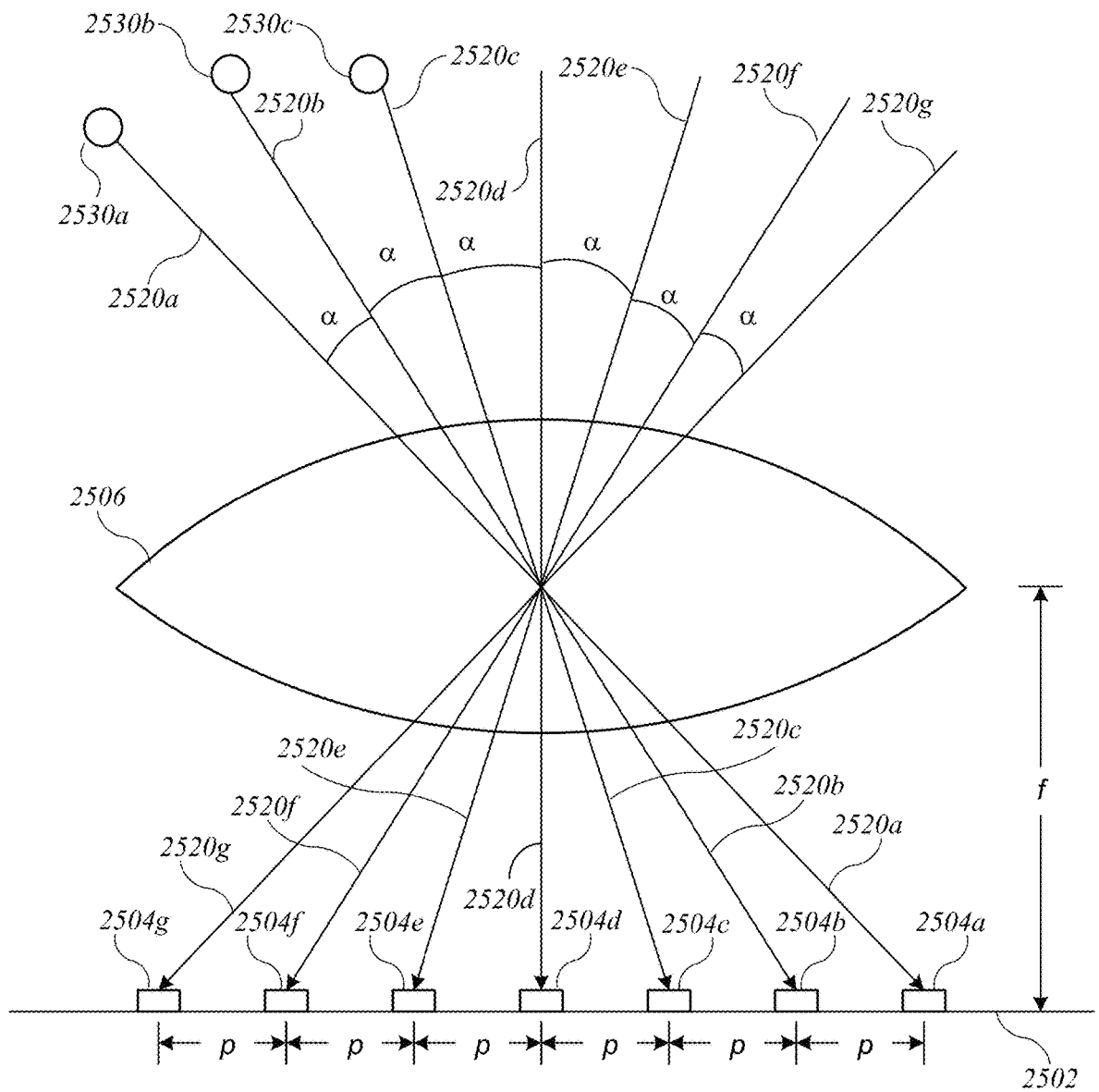
FIG. 25 is a simplified optical diagram showing a focal length distortion property for a bulk optical module according to one or more embodiments.

FIG. 25 illustrates an example of an imaging system using an F tan $\theta$ bulk optic module. Image plane 2502 includes a row of sensors 2504a-g separated by a uniform distance p (also referred to herein as the "linear pitch"). Sensors 2504a-g can be, for example, a row (or a portion of a row) of sensor channels in any of the multispectral sensor arrays described above, or other sensors that detect photons from a given direction. A bulk optic module 2506 is positioned at a distance f above image plane 2502, where f is the focal length of bulk optic module 2506. In this example, bulk optic module 2506 is represented as a single bi-convex lens; however, it should be understood that other lenses or multi-lens systems may be used.

Bulk optic module 2506 can be designed to focus light from a field of view (or object space) onto image plane 2502. For instance, rays 2520a-2520g indicate chief rays for sensors 2504a-2504g. (It should be understood that the actual path of light through bulk optic module 2506 is not shown.)

Bulk optic module 2506 has a F tan $\theta$ focal-length distortion profile. (Those skilled in the art will understand how to create bulk optic modules that have this profile, and a detailed explanation is omitted.) As a result, at least for small angles, a uniform change in the angle of incidence of a light ray results in shifting the point where the refracted light ray intersects the image plane by a uniform distance, independently of the original angle of incidence. For instance, for rays 2520a, 2520b, the difference in angle of incidence is a, and rays 2520a, 2520b are separated at the image plane by the linear pitch p. Rays 2520b, 2520c also have a difference in angle of incidence of a, and the corresponding refracted rays 2520b, 2520c are also separated at the image plane by the linear pitch p. Thus, if image plane 2502 and bulk optic module 2506 are together rotated through an angle $\alpha$, ray 2520a originating from point 2530a would become (approximately) the chief ray for sensor 2504b while ray 2520b originating from point 2530b would become (approximately) the chief ray for sensor 2504c, and so on. The rotation angle $\alpha$ that corresponds to linear pitch p at the image plane is referred to herein as the "angular pitch" of the scanning system, and the value of a is determined based on the sensor pitch p and the properties of the bulk optic module. In scanning ranging/imaging systems where the bulk optic module provides an angular pitch a such that scanning the system through the angle $\alpha$ results in shifting the incident rays by one linear pitch unit p, different sensor channels in a row can image the same portion of the field of view by acquiring images at a sequence of time steps, where the sensor array is rotated by the angular pitch a (or through a smaller angle such that a is an integer multiple of the scanning pitch) at each time step. Examples of scanning operations of this type are described in more detail below.

Figure 26:
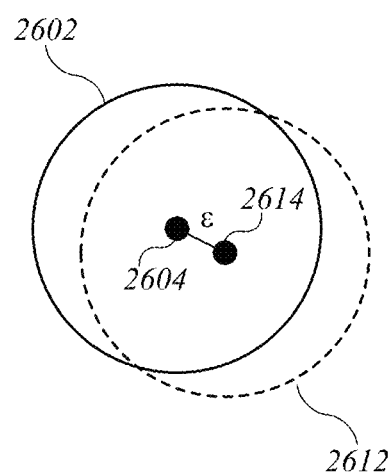
FIG. 26 shows an example of intrapixel pointing error that can be quantified and
constrained in some embodiments of scanning systems.

Using an F tan $\theta$ lens can reduce intrapixel pointing error to a negligible level, where "negligible" can be quantified based on the size of the field of view of a sensor channel. FIG. 26 shows an example of intrapixel pointing error that can be quantified and constrained in some embodiments of scanning systems. Circle 2602 represents the nominal location of an object-space pixel; point 2604 is the center of circle 2602. Circle 2612 (dashed line) represents the field of view sampled by a particular sensor channel when nominally pointed in the direction of circle 2602. As can be seen, center point 2614 of circle 2612 is offset from the center 2604 of object-space pixel 2602 by an offset E. This offset can be used to quantify intrapixel pointing error. In some embodiments, intrapixel pointing error is considered negligible if the offset c for any given sensor channel in a sensor row is less than 50% of the diameter of the channel field of view. In other embodiments, a tighter definition, e.g., that intrapixel pointing error is less than 10% of the diameter of the channel field, of view is used. Whether a given sensor system satisfies this constraint can be determined, e.g., by imaging a test pattern. Other definitions can also be used.

The bulk optic for a scanning sensor system can also have an F tan $\theta$ focal-length distortion profile in the non-scanning direction. Thus, in the example shown in FIG. 25, sensors 2504a-g can also be understood as corresponding to a column (or a portion of a column) of sensor channels in any of the multispectral sensor arrays described above. Where some or all of the columns of sensor channels are staggered (e.g., LIDAR sensor channels 202 in FIG. 2), a bulk optic having an F tan $\theta$ focal-length distortion profile in both directions can allow the staggered sensor-channel columns to sample a uniformly-spaced column of object-space pixels via a scanning operation and allow different sensor channels in the same row to have negligible intrapixel pointing error.

It should be noted that an F tan $\theta$ bulk optical module can be useful in contexts other than multispectral sensor arrays. For instance, a scanning LIDAR sensor array may include an array of staggered LIDAR channels arranged in columns, which may be operated in a scanning/rotating mode to image a field of view. Examples of such systems are described, e.g., in U.S. patent application Ser. No. 15/685,384, filed Aug. 24, 2017 (published as U.S. Patent Application Publication No. 2018/0059222), the disclosure of which is incorporated herein by reference in its entirety. An F tan $\theta$ bulk optical module can be used to provide that object-space pixels imaged by sensor channels located in different columns in the staggered array align vertically (i.e., in the column direction in image space) with each other and/or to provide uniform spacing of the sampled locations along the columns.

It should be understood that a bulk optic module for a sensor array (multispectral or LIDAR-only) is not required to have an F tan θ focal-length distortion profile, or any other particular focal-length distortion profile. For instance, lenses used in some laser scanning systems have a focal length distortion profile such that the displacement is a linear function of θ (rather than tan(θ)); such lenses are sometimes referred to as "F θ" lenses. For small angles of incidence θ, tan(θ) is approximately equal to θ, and an F θ lens can provide approximately the desired behavior. Accordingly, in some embodiments the bulk optic can have an F θ focal length distortion profile. Further, the focal-length distortion profiles in the scanning and non-scanning directions need not be the same.

In some embodiments, nonuniformity in the size or location of regions sampled by different sensors of a sensor array can be accounted for using image-processing techniques. For instance, image processing algorithms can interpret images with fisheye distortion or the like, as long as the distortion profile of the bulk optic is not subject to localized deviations (e.g., high-frequency noise).

Figure 27:
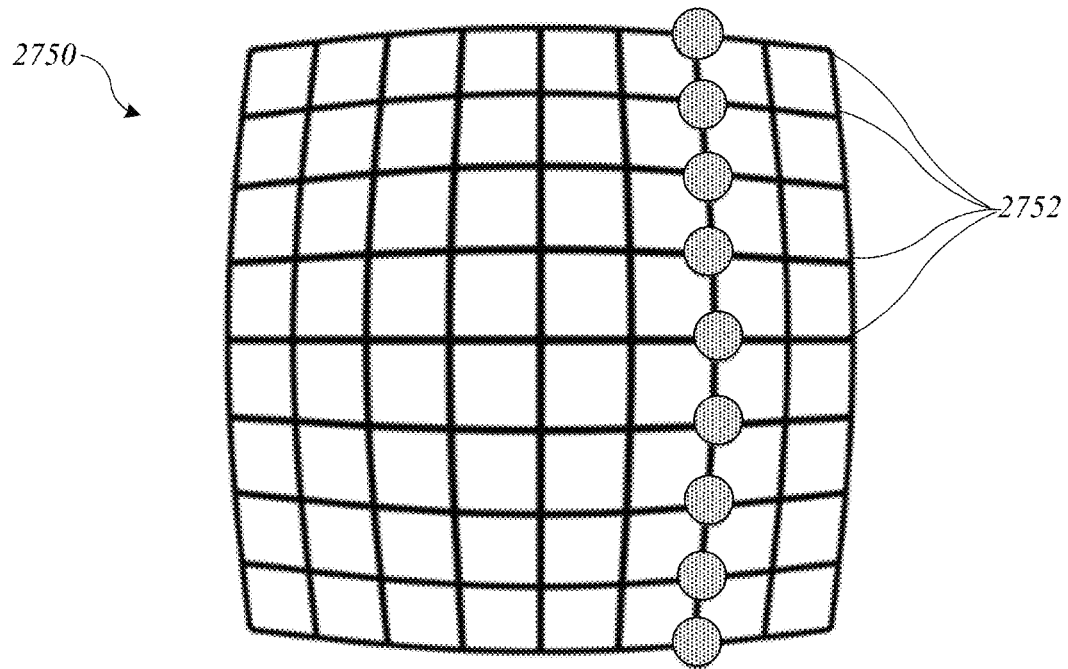
FIGS. 27 and 28 show examples of sensor channel positioning to compensate for barrel distortion and pincushion distortion in a bulk optical module according to one or more embodiments.
Figure 28:
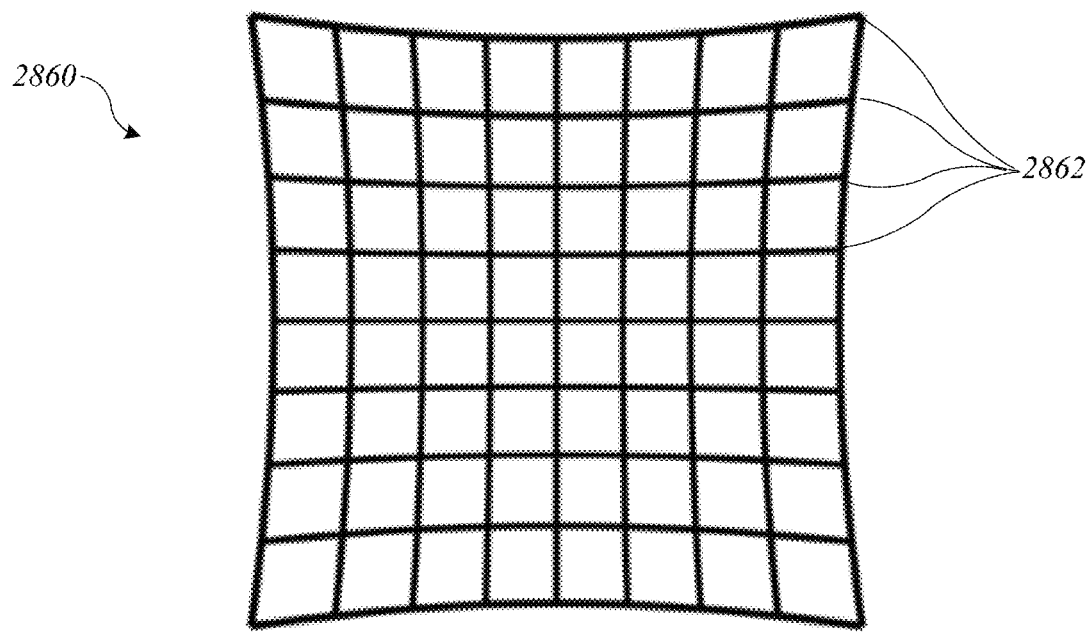

Alternatively, sensor channels can be arranged in a non-uniform array rather than a rectilinear array, in a pattern that compensates for the distortion profile of the bulk optic so that uniform sampling of object space and consistent pointing behavior is achieved. For example, FIG. 27 shows a nonuniform array pattern 2750 that compensates for barrel distortion. Sensor channels can be placed, e.g., at vertices 2752. (Some vertices 2752 are highlighted as red dots, but it should be understood that sensor channels can be placed at any vertex 2752). In this example, the spacing between adjacent sensor channels increases toward the center of the array. FIG. 28 shows a nonuniform array pattern 2860 that compensates for pincushion distortion. Sensor channels can be placed, e.g., at vertices 2862. In this example, the spacing between adjacent sensor channels decreases toward the center of the array.

More generally, based on the design of a particular bulk optic, the distortion profile in the image plane can be mapped, and sensor channels can be placed non-uniformly such that sampling density is uniform in object space. (It is noted that this technique may complicate design and manufacture of sensor arrays and may require the sensor array to be adapted to a particular bulk optic.)

Further, in some embodiments, shutter intervals can be controlled individually for different sensor channels, so that different sensor channels can begin and end data collection for a given pixel at different times. Individual shutter control can be used to compensate for intrapixel pointing error of specific channels along the scanning direction. (It is noted that this may complicate design of the sensor electronics.)

2.5.3. Optics for Raster Scanning Systems

In some embodiments, multispectral sensor arrays of the kind described above may be used in a raster scanning mode. In a raster scanning mode, a sensor array having a relatively small number of sensor channels can scan the field of view in two directions to produce an image having a number of pixels larger than the number of sensor channels. For convenience, the scanning directions are referred to herein as "horizontal" and "vertical"; however, those skilled in the art will understand that the spatial orientation of a raster scan is arbitrary. Raster scanning can be performed with a sensor array that includes a 2D array of hybrid sensor channels (e.g., sensor array 600) or multispectral pixels (e.g., sensor array 900), or with a row-based scanning sensor array (e.g., sensor array 200) that also scans in a column-wise direction.

Figure 29:
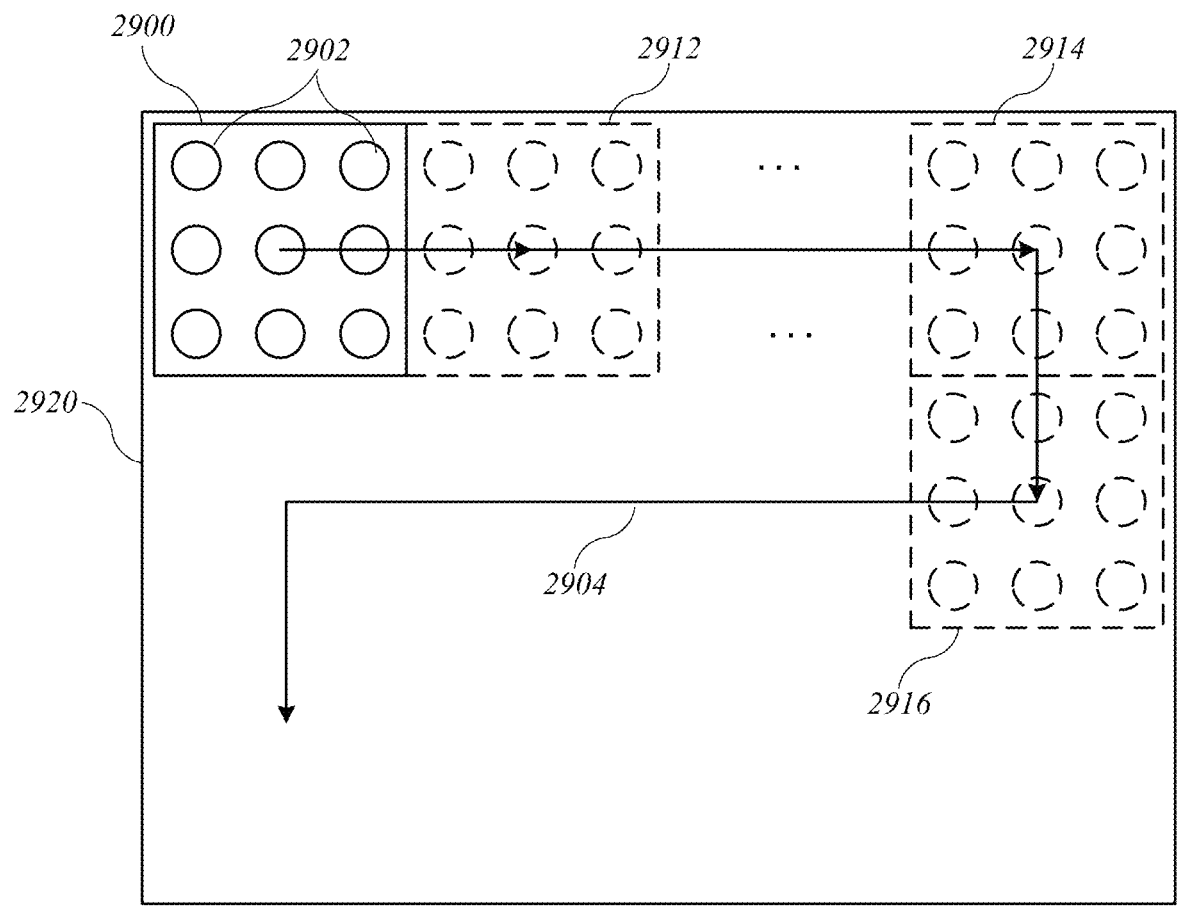
FIG. 29 shows an example of raster scanning using a sensor array according to an embodiment of the present invention.

FIG. 29 shows an example of raster scanning using a sensor array according to an embodiment of the present invention. Sensor array 2900 includes a number of sensor channels 2902 arranged in a regular sensor grid. In this example, the sensor grid is 3×3; however, the dimensions can be varied as desired. Sensor channels 2902 can include any of the sensor channel types described above. Arrow 2904 indicates a motion path for sensor array 2900. As indicated, sensor array 2900 can be moved to the right along a horizontal line through a succession of imaging positions within a field of view 2920, including positions 2912 and 2914. At each imaging position, sensor channels 2902 can be operated to capture an image. At the end of the horizontal line (position 2914), sensor array 2900 can be shifted down, e.g., by a pitch distance based on the number of rows in sensor array 2900, to position 2916 to capture the next image. Sensor array 2900 can then be moved to the left and capture images for the next horizontal line. The captured images can be accumulated into a larger image covering the entire field of view 2920.

Sensor array 2900 can be, e.g., any of the multispectral sensor arrays described above. If sensor array 2900 is a 2D array (e.g., sensor array 600 or sensor array 900), then the distance that sensor array 2900 moves between successive images along a horizontal scan line can be based on the horizontal size of the array, to provide uniform, non-overlapping samples as shown in FIG. 29. If sensor array 2900 is a row-based array and the rows are oriented along the horizontal scan lines, then the distance between successive images along a horizontal scan line can be equal to the channel pitch, allowing different sensors in the same row of the sensor array to image the same object-space pixel. The vertical shift between scan lines can be determined based on the number of rows in the array.

The motion pattern of a raster scan can be varied from that shown in FIG. 29. For example, a "horizontal retrace" pattern can be used in which, at the end of a horizontal scan line, sensor array 2900 returns to the left end and shifts down to the next horizontal scan line, so that images for each horizontal scan line are captured using the same direction of travel. As another example, for a row-based sensor array, the rows can be oriented in the vertical direction, and the vertical distance between horizontal scan lines can be equal to the channel pitch within a row. (As noted above, "vertical" and "horizontal" are arbitrary.) Raster scanning can be implemented by physically moving the array in two dimensions or by providing an optical system with a tip-tilt mirror that can steer light in a raster pattern.

Figure 30:
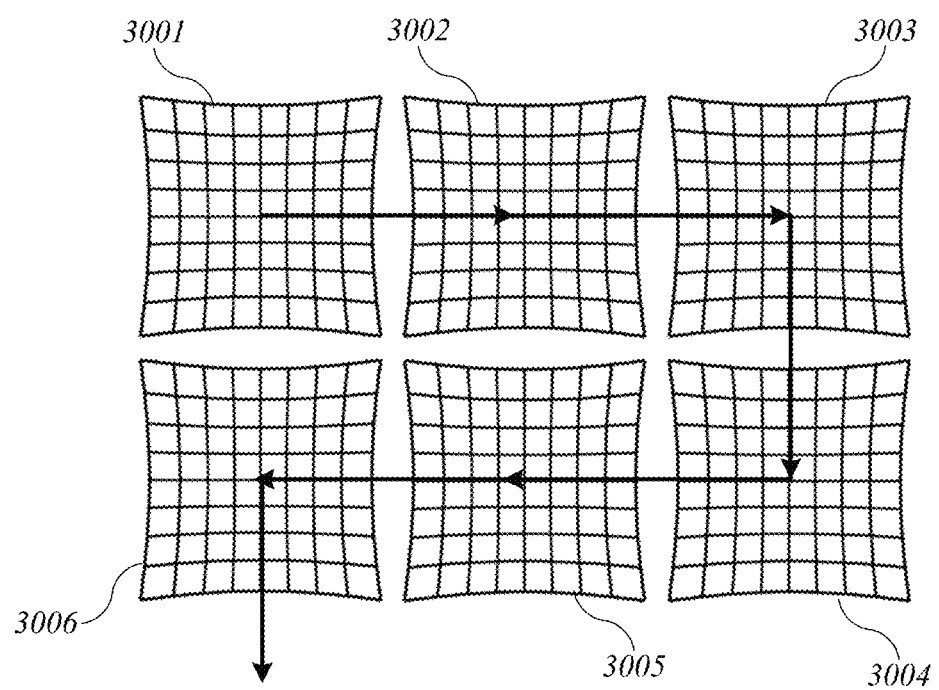
FIG. 30 shows a nonuniform sampling pattern that can result from resulting from raster-scanning using an array with a bulk optic that exhibits pincushion distortion.

Some embodiments of a raster-scanning system can include sensor array 2900 and a bulk optic module that supports uniform sampling of field of view 2920. If the bulk optic module introduces a global distortion (e.g., barrel distortion or pincushion distortion), the resulting image of field of view 2920 will not be uniformly sampled. By way of illustration, FIG. 30 shows a nonuniform sampling pattern that can result from raster scanning using a sensor array with a bulk optic that exhibits pincushion distortion. Each grid 3001-3006 represents the locations imaged with the sensor at a different location in the raster pattern. As can be seen, the distortion is subject to local deviations. This type of localized distortion pattern can create significant difficulty for subsequent image processing and analysis (much more so than global pincushion distortion).

As described above, use of a bulk optical module with F tan θ focal-length distortion profile can provide uniform sampling across a sensor array. Accordingly, an F tan θ bulk optical module can be used in a raster-scanning system. Alternatively, the sensor channels of a sensor array for a raster-scanning system can be arranged to compensate for the distortion profile of the bulk optical module, e.g., as described above with reference to FIGS. 27 and 28.

It should be understood that the foregoing examples of optical elements and optical modules are illustrative and that variations and modifications are possible. Further, optical elements shown in connection with one type of sensor array can also be used with other types of sensor arrays. For instance, achromatic bulk optic modules can be used in both row-based (or 1D) and 2D multispectral sensor arrays. An achromatic bulk optic module can have an F tan θ focal length distortion profile, an F θ focal length distortion profile, or a different profile as desired. Likewise, a bulk optic module with chromatic aberration can have an F tan θ focal length distortion profile, an F θ focal length distortion profile, or a different profile as desired. As noted above, achromatic bulk optics may be desirable for sensor arrays that include multispectral sensor channels and/or hybrid sensor channels; however, this is not required.

3. Ranging/Imaging Systems with Multispectral Sensor Arrays

Multispectral sensor arrays of the kind described above can be incorporated into ranging/imaging systems that provide multispectral images of a field of view (e.g., color images, absorption images, polarization images, and/or other images extracted from ambient-light sensor channels) that are inherently registered with each other and with depth information (e.g., extracted from LIDAR sensor channels in the multispectral sensor array). The particular implementation of a multispectral ranging/imaging system depends in part on the particular multispectral sensor array. For purposes of illustration, two types of ranging/imaging systems will be described. A first type, referred to herein as an "angular scanning" (also sometimes called "rotating" or "spinning") ranging/imaging system either rotates the sensor array (and its associated optics) to point at different portions of the field of view at different times or uses controllable optics (e.g., MEMS galvanometers) to direct light from different portions of the field of view onto the array at different times. In either case, an angular scanning system allows different sensor channels on the same array (e.g., different sensors in a row of sensor array 200 of FIG. 2) to image (detect photons from) a given area within the field of view at different times. A second type, referred to herein as a "static" (or "solid-state") ranging/imaging system, uses a 2D multispectral sensor array that can image a field of view in multiple channels without movement of the sensor array.

3.1. Angular Scanning Ranging/Imaging Systems

Figure 31A:
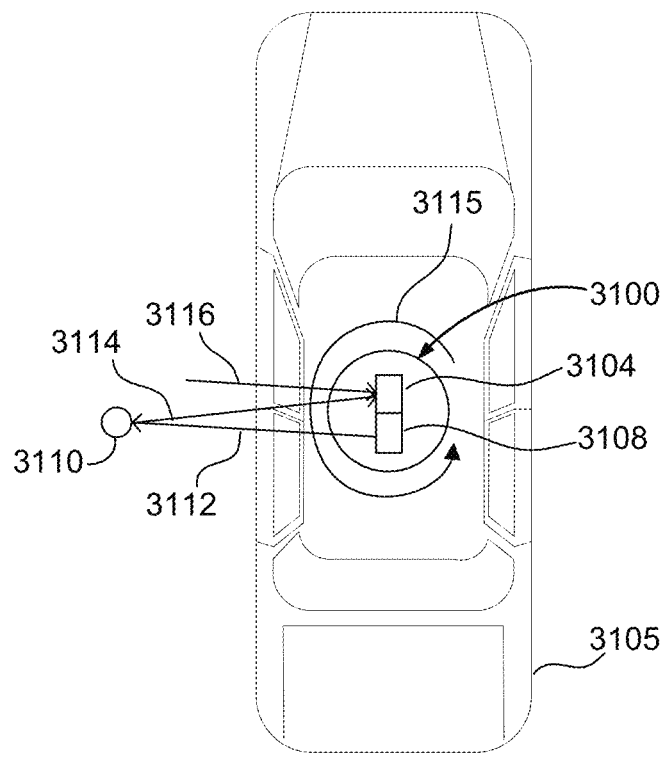
FIGS. 31A and 31B show an example of a rotating imaging/LIDAR system according to one or more embodiments.

FIG. 31A shows an example of an automotive application for an angular scanning (e.g., rotating or spinning) imaging/LIDAR system 3100 incorporating a sensor array as described herein. The automotive application is chosen here merely for the sake of illustration and the sensors described herein may be employed in other types of vehicles, e.g., boats, aircraft, trains, etc., as well as in a variety of other applications where 3D depth images that are spatially and temporally registered with spectral images are useful, such as medical imaging, geodesy, geomatics, archaeology, geography, geology, geomorphology, seismology, forestry, atmospheric physics, laser guidance, airborne laser swath mapping (ALSM), and laser altimetry. According to some embodiments, scanning imaging/LIDAR system 3100 can be mounted on the roof of a vehicle 3105 as shown. In other embodiments one or more LIDAR and/or imaging sensors can be mounted on other locations of a vehicle including, but not limited to, the front or back of the vehicle, the sides of the vehicle and/or corners of the vehicle.

The scanning imaging/LIDAR system 3100 shown in FIG. 31A can incorporate a light source module 3102 for emitting laser pulses, such as transmit module 1510 of FIG. 15, and/or light sensing module 3104, such as receiving module 1540 of FIG. 15, which can incorporate a sensor array that includes both LIDAR sensor channels and ambient-light sensor channels (e.g., any of the multispectral sensor arrays described above). In some embodiments, light transmission module 3102 can be disposed in the same housing as light sensing module 3104.

Scanning imaging/LIDAR system 3100 can employ a scanning architecture, where the orientation of the LIDAR light transmission module 3102 and light-sensing module 3104 can be scanned around one or more fields of view 3110 (e.g., a 360 degree field in some embodiments) within an external field or scene that is external to the vehicle 3105. In the case of the scanning architecture, emitted light 3112 can be scanned over the surrounding environment as shown. For example, the output beam(s) of one or more light sources (such as infrared or near-infrared pulsed IR lasers, not shown) located in the scanning imaging/LIDAR system 3100 can be scanned, e.g., rotated, to illuminate a scene around the vehicle. In some embodiments, the scanning, represented by rotation arrow 3115, can be implemented by mechanical means, e.g., by mounting the light emitters and sensors to a rotating column or platform. In some embodiments, the scanning can be implemented through other mechanical means such as through the use of galvanometers. Chip-based steering techniques can also be employed, e.g., by using microchips that employ one or more MEMS based reflectors, e.g., such as a digital micro-mirror (DMD) device, a digital light processing (DLP) device, and the like. For emitters, such mirror subsystems can be controlled to direct light onto different portions of the field of view at different times, and for sensors, such mirror subsystems can be controlled to direct light from the field of view onto different portions of the sensor array at different times. In some embodiments, the scanning can be effectuated through non-mechanical means, e.g., by using electronic signals to steer one or more optical phased arrays.

Objects within the scene (e.g., object 3110) can reflect portions of the light pulses that are emitted from the LIDAR light sources. One or more reflected portions then travel back to the imaging/LIDAR system and can be detected by the detector circuitry. For example, reflected portion 3114 can be detected by light sensor module 3104. In addition, ambient light 3116 may enter detector circuitry 3104.

Figure 31B:
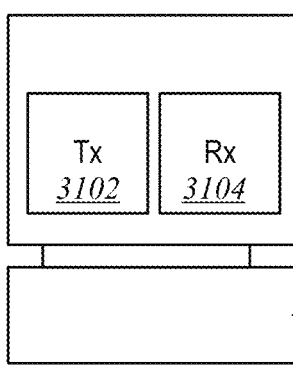

FIG. 31B is a side view showing a simplified example of the structure of scanning imaging/LIDAR system 3100 according to some embodiments. Scanning imaging/LIDAR system 3100 can include a stationary base 3120 that can be mounted, e.g., to the roof of vehicle 3105. Rotational housing 3122, which holds emitter module (Tx) 3102 and light sensor module (Rx) 3104 can be rotationally coupled to stationary base 3120.

Figure 32:
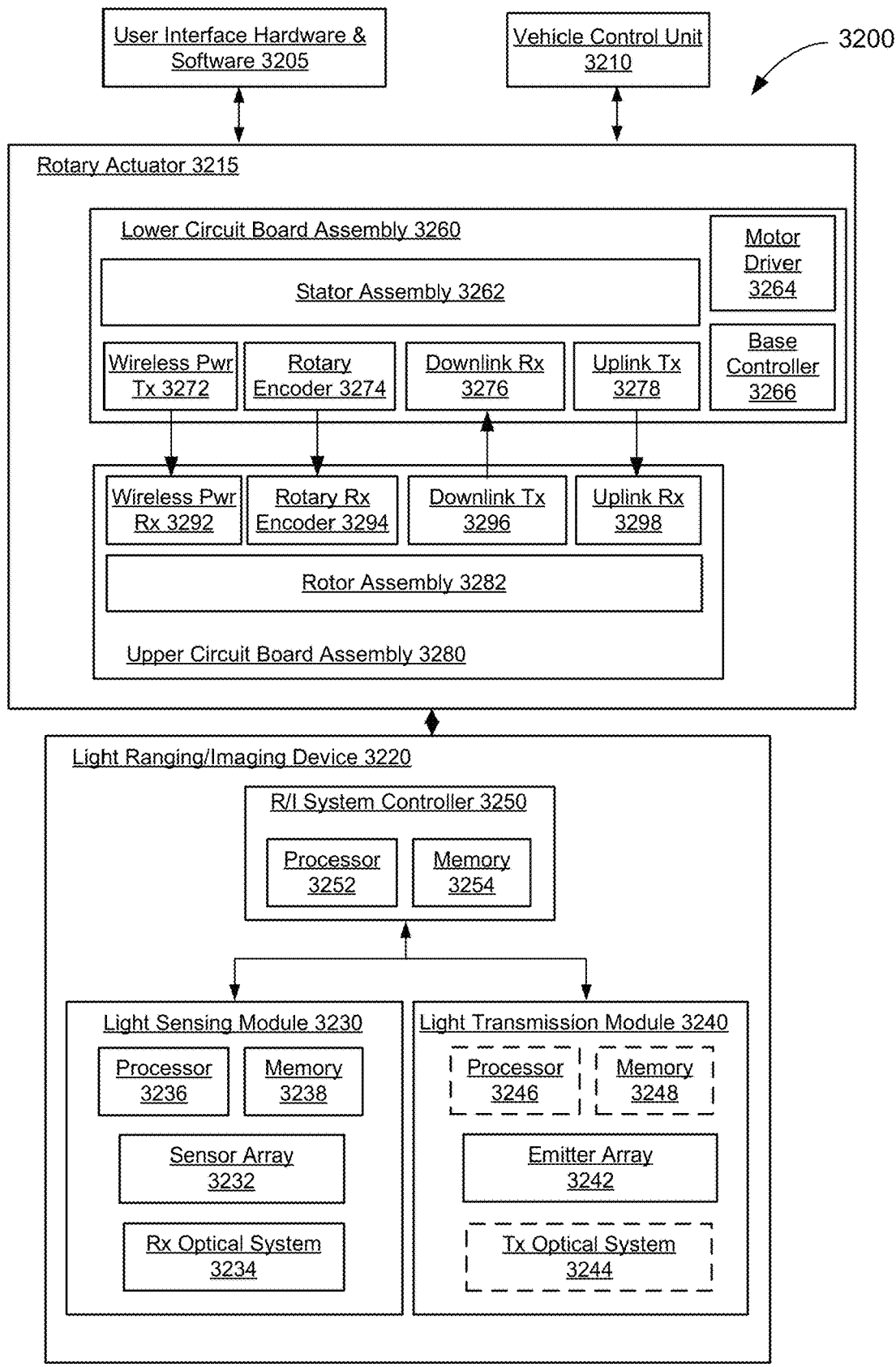
FIG. 32 illustrates a block diagram of a rotating imaging/LIDAR system according to one or more embodiments.

FIG. 32 illustrates a block diagram of a rotating imaging/LIDAR system 3200 (e.g., implementing scanning imaging/LIDAR system 3100 of FIG. 31) according to some embodiments. Rotating imaging/LIDAR system 3200 can optionally employ a rotary actuator with wireless data and power transmission and reception capabilities. In some embodiments, the rotary actuator includes a rotor that is integrated onto a surface of a rotating circuit board and a stator that is integrated onto a surface of a stationary circuit board, and both board assemblies are equipped with wireless power and data transfer capabilities.

Rotating imaging/LIDAR system 3200 shown in FIG. 32 includes two main modules: a light ranging/imaging (R/I) device 3220 and a rotary actuator 3215. Additionally, rotating imaging/LIDAR system 3200 can interact with one or more instantiations of user interface hardware and software 3205. The different instantiations of user interface hardware and software 3205 can vary and may include, e.g., a computer system with a monitor, keyboard, mouse, CPU and memory; a touch-screen in an automobile; a handheld device with a touch-screen; or any other appropriate user interface. The user interface hardware and software 3205 may be local to the object upon which rotating imaging/LIDAR system 3200 is mounted but can also be a remotely operated system. For example, commands and data to/from rotating imaging/LIDAR system 3200 can be routed through a cellular network (LTE, etc.), a personal area network (Bluetooth, Zigbee, etc.), a local area network (Wi-Fi, IR, etc.), or a wide area network such as the Internet.

The user interface hardware and software 3205 can present the LIDAR data from the device to the user and/or allow a user or an upper level program to control the rotating imaging/LIDAR system 3200 with one or more commands. Example commands can include commands that activate or deactivate the imaging/LIDAR system, specify photo-detector exposure level, bias, sampling duration and other operational parameters (e.g., for emitted pulse patterns and signal processing), specify light emitters parameters such as brightness. In addition, commands can allow the user or an upper level program to select the method for displaying or interpreting results. The user interface can display imaging/LIDAR system results which can include, e.g., a single frame snapshot image, a constantly updated video image, and/or a display of other light measurements for some or all pixels. Examples of other light measurements for LIDAR pixels include ambient noise intensity, return signal intensity, calibrated target reflectivity, target classification (hard target, diffuse target, retroreflective target), range, signal to noise ratio, target radial velocity, return signal temporal pulse width, and the like. In some embodiments, user interface hardware and software 3205 can track distances (proximity) of objects from the vehicle and/or analyze visual features determined from ambient-light sensor channels). Based on the visual features and distance information, user interface hardware and software can, for example, identify and track objects in the field of view and potentially provide alerts to a driver or provide such tracking information for analytics of a driver's performance.

In some embodiments, the imaging/LIDAR system can communicate with a vehicle control unit 3210, and one or more parameters associated with control of a vehicle can be modified based on the received LIDAR and/or ambient-light data. For example, in a fully autonomous vehicle, the imaging/LIDAR system can provide a real time 3D hyperspectral image of the environment surrounding the car to aid in navigation. In other cases, the imaging/LIDAR system can be employed as part of an advanced driver-assistance system (ADAS) or as part of a safety system that, for example, can provide 3D hyperspectral image data to any number of different systems (e.g., adaptive cruise control, automatic parking, driver drowsiness monitoring, blind spot monitoring, collision avoidance systems, etc.). When a vehicle control unit 3210 is communicably coupled to light ranging/imaging device 3220, alerts can be provided to a driver or the proximity of an object can be tracked and/or displayed.

Light ranging/imaging device 3220 includes light sensing module 3230, light transmission module 3240, and light ranging/imaging system controller 3250. Light sensor module 3230 can be similar to light sensing module 1540 described above and can include a sensor array such as sensor array 200 of FIG. 2 or sensor array 400 of FIG. 4. Light transmission module 3240 can be similar to light transmission module 1510 described above. Rotary actuator 3215 includes at least two circuit board assemblies, a lower circuit board assembly 3260 (also referred to herein as a base subsystem) and an upper circuit board assembly 3280 (also referred to herein as a turret subsystem). The lower circuit board assembly 3260 can be mechanically mounted to a fixed portion of an enclosure or housing (not shown) while the upper circuit board assembly 3280 is free to rotate about an axis of rotation, usually defined by a shaft (not represented in FIG. 32) that is also mounted to the enclosure (directly or indirectly). The light ranging/imaging device 3220 can be mechanically attached to the rotatable upper circuit board assembly 3280 and therefore is free to rotate within the housing.

While FIG. 32 shows one particular arrangement of components within light ranging/imaging device 3220 and rotary actuator 3215, in some embodiments, certain components may be integrated into one, or the other, module differently than shown. As one example, ranging/imaging system controller 3250, which can be, for example, an FPGA, ASIC, or a more general computing device, like an embedded system or system-on-a-chip (SOC), can be mounted directly (e.g., soldered) to, a printed circuit board that is part of the upper circuit board assembly 3280. In other words, in some embodiments, the parts of the rotary actuator can be integrated within the light ranging/imaging device 3220 and vice versa.

The rotary actuator 3215 includes a number of different systems that are integrated onto one or more printed circuit boards of the lower and upper circuit board assemblies 3260 and 3280. For example, rotary actuator 3215 can include a brushless electric motor assembly, an optical communications subsystem, a wireless power transmission subsystem, and a base controller. These systems are formed by pairs of cooperating circuit elements with each pair including one or more circuit elements on the lower circuit board assembly 3260 operating in cooperation with (e.g., having a function that is complementary to) one or more circuit elements on the upper circuit board assembly 3280. Complementary functions include, for example, transmission (Tx) and reception (Rx) of power and/or data communication signals as is described in more detail below.

The brushless electric motor assembly includes a stator assembly 3262 integrated onto a printed circuit board of the lower circuit board assembly 3260 and a rotor assembly 3282 integrated onto a printed circuit board of the upper circuit board assembly 3280. The rotation of rotor assembly 3282 is driven from a drive signal, for example, a three-phase drive current, that originates from a motor driver circuit 3264. In some embodiments, one or more motor control lines connect the motor driver circuit to the coils of the stator assembly 3262 to allow for the drive signal to be provided to the motor stator. Furthermore, the motor driver circuit 3264 can be electrically connected to a base controller 3266 such that the base controller 3266 can control the rotation rate of the rotor assembly and thus the rotation rate (i.e., frame rate) of the light ranging/imaging device 3220.

In some embodiments, rotor assembly 3282 can rotate at a rate between 10-30 Hz. In some embodiments, the rotor assembly 3282 can be a passive device that includes a series of permanent magnets that are attached to a circuit board of the upper circuit board assembly. These permanent magnets are either attracted to or repelled by an electromagnetic force, for example, a magnetic force, generated by the coils of the stator assembly to drive a rotation of the upper circuit board assembly 3280 relative to the lower circuit board assembly 3260. The rotational orientation of the upper circuit board assembly 3280 can be tracked by a rotary encoder receiver 3294, which can track the angular position of the upper circuit board assembly by detecting the passage of one or more features on the rotary encoder 3274. A variety of different rotary encoder technologies can be employed. In some embodiments, rotary encoder 3274 is integrated directly onto a surface of a circuit board of the lower circuit board assembly 3260.

Rotary actuator 3215 can also include a wireless power system that includes a wireless power transmitter 3272 and a wireless power receiver 3292 in a configuration referred to herein as a rotary transformer. Power transmitted from transmitter 3272 to wireless power receiver 3292 can be consumed by light ranging/imaging device 3220 and/or any circuitry needing power on the turret/upper circuit board assembly. In some embodiments, all power required by light ranging/imaging device 3220 is provided through wireless power receiver 3292 and thus there is no need for a rotary electric coupler like a slip ring or mercury based device thereby increasing reliability and decreasing cost of the overall system.

Rotary actuator 3210 can also include an optical communication subsystem that includes a number of optical transmitters (e.g., optical transmitters 3278 and 3296) and a number of optical receivers (e.g., optical receivers 3276 and 3298) used for bi-directional contactless data transmission between rotary actuator 3215 and light ranging/imaging device 3220 (or to/from any other device or system that is mechanically connected to upper circuit board assembly 3280 of the rotary actuator 3215). More specifically, the optical communication subsystem can include a set of base optical communication components that are attached to (e.g., soldered to) lower circuit board assembly 3260 that is part of the stationary base of imaging/LIDAR system 3200, and can include a set of turret optical communication components that are attached to (e.g., soldered to) rotating upper circuit board assembly 3280 that is part of the rotating turret of imaging/LIDAR system 3200. These optical communication components provide an uplink data channel for providing optical signals, including control signals, to light ranging/imaging device 3220 and also provide a downlink data channel for providing optical signals, including ranging and operational data, from light ranging/imaging device 3220 to base controller 3266, user interface hardware and software 3205, and/or the vehicle control unit 3210.

A downlink optical communication channel from the upper circuit board assembly 3260 to the lower circuit board assembly 3280 can be created between the optical downlink transmitter 3296 and the optical downlink receiver 3276. Light ranging/imaging device 3220 can be connected directly to upper circuit board assembly 3280 and therefore can access the downlink optical communication channel to pass ranging and operational data down to lower circuit board assembly 3260 for further use. In some embodiments, the data passed down in the optical signals via the optical downlink can include range data for individual points (pixels) in the field (or possibly multiple ranges for a single pixel and angle, e.g. during fog/rain, when looking through glass windows, etc.), azimuth and zenith angle data, signal to noise ratio (SNR) of the return or signal intensity, target reflectivity, ambient near IR (NIR) levels coming from each pixel field of view, diagnostic operational information from the light ranging/imaging device such as temperature, voltage levels, etc. In addition, data from any other system connected to upper circuit board 3280 of the rotary actuator can be passed down through the optical downlink. For example, data from high speed RGB or thermal cameras, line scan cameras and the like.

An uplink optical communication channel from lower circuit board assembly 3260 can be created between optical uplink transmitter 3278 and optical uplink receiver 3298. In some embodiments, control signals from the base controller 3266 can be passed to light ranging/imaging device 3220 via the optical uplink communication channel. For example, in some embodiments, base controller 3266 can monitor various temperatures in the device (as received from the downlink channel) and can, in the case of an overheat condition, send an emergency shutdown signal to light ranging/imaging device 3220 via the uplink channel. In some embodiments, the base controller can be a mobile computer, e.g., a programmable system-on-a-chip employing an ARM+ FPGA architecture with associated memory and I/O capability (e.g., Ethernet and the like).

Ranging data can be generated by light ranging/imaging device 3220 by transmitting one or more light pulses from light transmission module 3240 to objects in a field of view surrounding the light ranging/imaging device. Reflected portions of the transmitted light are then detected by light sensing module 3230 after some delay time. Based on the delay time, commonly referred to as the "time of flight", the distance to the reflecting surface can be determined. Other ranging methods can be employed as well, for example, continuous wave, Doppler, and the like.

In addition to ranging data, light ranging/imaging device 3220 can generate light intensity data based on ambient light. For instance, light sensing module 3230 can include one or more ambient-light sensor channels tuned to various wavelength bands (e.g., as described above), and the ambient-light sensor channels can be operated to count photons of the channel wavelength band detected during a particular time interval (referred to herein as a "shutter interval"). The photon counts in a particular channel are indicative of intensity of light in that wavelength band. Other ambient light sensor channels can be used to measure other characteristics of the ambient light, such as polarization (e.g., by determining the difference in photon counts detected by differently-oriented polarization channels) and/or absorption at a particular wavelength (e.g., by comparing the number of photons in a channel tuned to the absorption band relative to number of photons in another channel tuned to a wider band that includes the absorption band, with a deficit in the absorption band indicating absorption).

Light transmission module 3240 can include an emitter array 3242 (e.g., emitter array 1520 described above) and a Transmit (Tx) optical system 3244 (including, e.g., Tx optical modules described above). Light transmission module 3240 can further include a processor 3246 and memory 3248, although in some embodiments these computing resources can be incorporated into ranging/imaging system controller 3250. In some embodiments, a pulse coding technique can be used, e.g., Barker codes and the like. In such cases, memory 3248 can store pulse-codes that indicate when light should be transmitted. In one embodiment the pulse-codes are stored as a sequence of integers stored in memory.

Light sensing module 3230 can include a sensor array 3232 and a receiver (Rx) optical system 3234. Sensor array 3232 can be, e.g., an implementation of sensor array 200 or sensor array 400 (or similar sensor array) and can include rows of sensor channels that incorporate both LIDAR sensor channels (or other ranging sensor channels) and ambient-light sensor channels as described above.

As mentioned above, processor 3236 and memory 3238 (e.g., SRAM) can perform the signal processing. As an example of signal processing for a ranging sensor channel, for each photosensor or grouping of photosensors, memory 3238 of light sensing module 3230 can accumulate counts of detected photons over successive time bins and these time bins taken together can be used to recreate a time series of the reflected light pulse (i.e., a count of photons vs. time). This time-series of aggregated photon counts is referred to herein as an intensity histogram (or just histogram). In addition, processor 3236 can apply certain signal processing techniques, such as matched filtering, to help recover a photon time series that is less susceptible to pulse shape distortion that can occur due to SPAD saturation and quenching. As an example of signal processing for an ambient-light sensor channel, for each photosensor or grouping of photosensors, memory 3238 of light sensing module 3230 can accumulate counts of detected photons over a single time interval (referred to herein as a "shutter interval"). The shutter interval can be, e.g., as long as the aggregate length of the time bins used to construct the intensity histogram for the ranging sensor channels, or it can be a longer or shorter time interval. The photon count accumulated by a particular ambient-light sensor channel during a shutter interval can indicate the intensity of light received by that ambient-light sensor channel. In some embodiments, processor 3236 can apply signal processing techniques, e.g., calibration-based corrections to reduce noise and/or to compensate for channel-to-channel variation in intensity measurements. In some embodiments, one or more components of ranging/imaging system controller 3250 can also be integrated into the same ASIC as sensor array 3232, processor 3236 and memory 3238, thereby eliminating the need for separate a ranging controller module.

In some embodiments, output from processor 3236 is sent to ranging/imaging system controller 3250 for further processing. For example, the data can be encoded by one or more encoders of ranging/imaging system controller 3250 and then sent as data packets via the optical downlink to lower circuit board assembly 3260. Ranging/imaging system controller 3250 can be realized in multiple ways including, e.g., by using a programmable logic device such an FPGA, as an ASIC or part of an ASIC, using a processor 3252 with a memory 3254, and some combination of the above. Ranging/imaging system controller 3250 can cooperate with base controller 3266 or operate independently of the base controller (via pre-programed instructions) to control light sensing module 3230 by sending commands that include start and stop light detection and adjust photo-detector parameters. Similarly, ranging/imaging system controller 3250 can control the light transmission module 3240 by sending commands, or relaying commands from the base controller 3266, that include start and stop light emission controls and controls that can adjust other light-emitter parameters such as, emitter temperature control (for wavelength tuning), emitter drive power and/or voltage.

If emitter array 3242 has multiple independent drive circuits, then there can be multiple on/off signals that can be properly sequenced by ranging/imaging system controller 3250. Likewise, if the emitter array includes multiple temperature control circuits to tune different emitters in the array differently, the transmitter parameters can include multiple temperature control signals. In some embodiments, ranging/imaging system controller 3250 has one or more wired interfaces or connectors (e.g., traces on a circuit board) for exchanging data with light sensing module 3230 and with light transmission module 3240. In other embodiments, ranging/imaging system controller 3220 communicates with the light sensing module 3230 and light transmission module 1840 over a wireless interconnect such as an optical communication link.

While a particular example of a scanning ranging/imaging system has been described in detail, those skilled in the art with access to the present disclosure will recognize that other implementations are possible, including scanning ranging/imaging systems that perform raster scanning in two dimensions. Raster scanning mechanisms may include, e.g., electric motors to move the sensor array in two dimensions (e.g., rotary movement around one axis combined with linear or rotary movement along or around an orthogonal axis), tip-tilt mirror systems that are rotatable around two or more orthogonal axes, or a combination of motion of the sensor array and a mirror system (e.g., the raster scanning mechanism may move the sensor array in one direction and move mirrors to provide scanning in an orthogonal direction).

3.2. Operation of Scanning Ranging/Imaging Systems

In an example of an imaging operation, the rotation (or other scanning) of light ranging/imaging device 3220 can be coordinated with the shutter intervals (which may correspond to LIDAR active-sensing intervals) such that a given location within the field of view is successively imaged by each sensor channel in a row of the sensor array. That is, the time between shutter intervals can be based on the angular distance between adjacent image pixels divided by the rotation rate of the imaging/LIDAR sensor array. Since the sensor channels image the same point in space (at slightly different times), registration between images obtained from different channels is inherent, with no need for object-identification or point-mapping algorithms. Further, if the speed of the imaging operation is sufficiently fast, it can be assumed that little change has occurred between imaging with successive channels, so the images correspond to the same scene. Thus, in some embodiments, a row-based sensor array such as sensor array 200 or sensor array 400 can enable multispectral imaging across a wide field of view (e.g., up to 360 degrees).

Figure 33A:
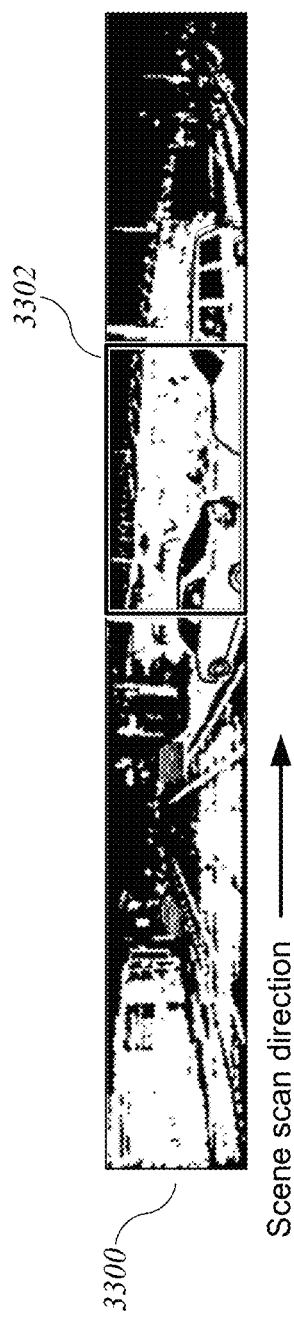
FIGS. 33A and 33B illustrate an example of a hyperspectral imaging operation using a sensor array according to one or more embodiments.
Figure 33B:
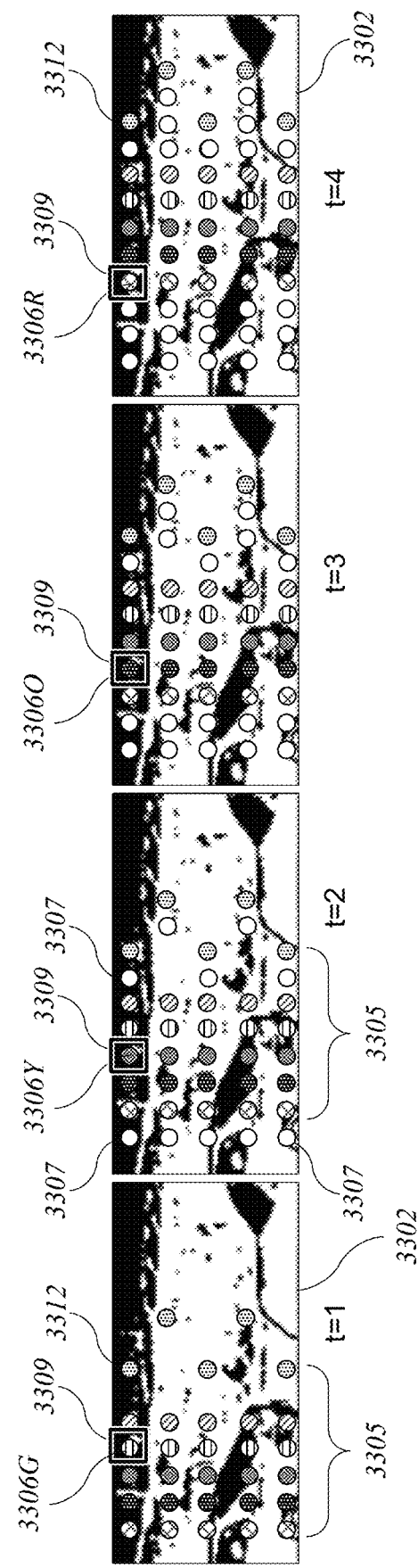

FIGS. 33A and 33B illustrate an example of multispectral imaging with inherent registration between imaging channels using an imaging/LIDAR sensor array similar to sensor array 200 or sensor array 400 described above. FIG. 33A shows a field of view 3300 to be scanned (e.g., a 360-degree field). For purposes of illustration, the description of the imaging process will refer to a specific image region 3302 within field of view 3300; however, the same principles can apply to all portions of field of view 3300.

FIG. 33B shows the progress of data collection at successive stages in a scanning operation that uses a row-based imaging/LIDAR sensor array (e.g., any of sensor array 200, 400, or 500) to create a set of inherently registered images of region 3302. In this example, the sensor array (not explicitly shown) is assumed to have five ambient-light channels tuned to different colors (or wavelength regions)

and one LIDAR channel in each sensor row. It is also assumed that the ambient-light sensor channels within a row of the sensor array are spaced apart by a uniform linear pitch p and that the bulk optic module provided for the imaging/LIDAR sensor array has a F tan θ focal-length distortion profile so that rotation of the imaging/LIDAR system through pitch angle α shifts the field of view approximately by the linear pitch p (e.g., as described above).

At a first time (t=1), the sensor array is operated for a first shutter interval. Each channel collects data corresponding to a different location (or object-space pixel) in region 3302, as indicated by representative colored dots 3305. For instance, the object-space pixel indicated by box 3309 is sampled (or imaged) by a green sensor channel 3306G. It is to be understood that the actual number of sensor channels can be significantly larger than the number of colored dots 3305 shown in FIG. 33B; for instance, there may be more than five rows of sensors, and the density of rows may be significantly higher than what is shown.

At time t=2, the sensor array has moved through the pitch angle α, which, relative to region 3302, shifts each channel to the right by a distance equal to the liner pitch p; colored dots 3305 have shifted one pitch to the right. At this time, the sensor array is operated for a second shutter interval, in which object-space pixel 3309 is sampled by a yellow sensor channel 3306Y. (For times t=2 and later, the white dots 3307 indicate locations that were sampled by at least one sensor channel corresponding to a colored dot 3305 in a previous shutter interval but that are not currently being sampled by a channel corresponding to any of colored dots 3305.)

At time t=3, the sensor array has again moves through the same pitch angle α, shifting each channel to the right by another pitch so that at time t=3, object-space pixel 3309 is sampled by an orange sensor channel 3306O. Similarly, at time t=4, object-space pixel 3309 is sampled by a red sensor channel 3306R. Proceeding in this manner, object-space pixel 3309 (and other locations in region 3302) can eventually be sampled by every sensor channel that is present in a particular row of the sensor array, including LIDAR sensor channel 3312. It should be understood that the channel pitch may be small and the number of sampling intervals per 360-degree rotation can be large (e.g., 1024, 2048, or 4096 sampling intervals per rotation), providing a higher image resolution than is suggested by FIG. 33B. The size and shape of object-space pixels is determined in the non-scanning direction by the spacing of the rows of the sensor array (and the size of the field of view) and in the scanning direction by the angle between successive sampling operations. Depending on the particular system design, object-space pixels can have a simple aspect ratio (e.g., 1:1 or 2:1 or the like), which can facilitate image processing and image analysis.

In this example, adjacent ambient-light sensor channels within a row have a uniform pitch p that facilitates inherent registration of images captured using different sensors. As shown, LIDAR sensor channel 3302 has a larger spacing than the uniform pitch of the ambient-light sensor channels. In some embodiments, the spacing between LIDAR sensor channel 3312 and the adjacent ambient-light sensor in a row can be an integer multiple of the uniform pitch p of the ambient-light sensor channels (in the example, the top row of sensors has LIDAR sensor channel 3312 spaced by 2p from the closest ambient-light sensor channel), which still allows inherent registration between the LIDAR sensor channel and the ambient-light sensor channels. (This is shown in FIG. 33B.) More generally, data from different sensor channels in a row can be inherently registered to the same location in the field of view, provided that the angular pitch of the sensor channels is an integer multiple of the angular displacement (or measurement angle) between successive shutter intervals, which is the case where the bulk optic module provided for the imaging/LIDAR sensor array has a F tan θ focal-length distortion profile. In embodiments where this condition is not satisfied, imaging operations can be performed, and data from different sensor channels can be used to generate reliably registered images (since the spatial relationship between different sensor channels is fixed); however, the image processing may become more complex.

In some embodiments, a rotating ranging/imaging system can rotate continuously (e.g., at a rate of 10-30 Hz) and can determine, based on the current rotational angle when to start and stop data collection. For example, as described above with reference to FIG. 32, rotary actuator 3215 can include rotary encoder 3274, and rotary encoder receiver 3294 can track the angular position of upper circuit board assembly 3280 (which is rigidly connected to the sensor array 3232). A set of M "measurement angles" $\phi_i$ (for i=1, 2, . . . M) corresponding to uniformly spaced angular positions can be defined such that $\phi_i - \phi_{i-1} = \alpha/N$ for integer N (where a is the pitch angle of the sensor array). In some embodiments, N=1. The number M of measurement angles can be selected as M=360°/(α/N) (or more generally Φ/(α/N), where Φ is the angle through which the sensor array moves during a scan). In one example, rotary encoder 3274 has 2048 steps, and the sensor array and bulk optical module are designed such that α=360°/2048.

Sensor array 3232 can rotate (with the rest of light ranging/imaging device 3220) continuously at a uniform angular speed, and LIDAR sensor channels can continuously generate signals. Memory 3238 can accumulate counts of detected photons over successive time bins, which can be used to create an intensity histogram as described above. A controller (e.g., R/I system controller 3250 of FIG. 32) can receive a signal indicating when the encoder position corresponds to one of the measurement angles $\phi_i$. This signal, also referred to as a "marker" signal, marks a boundary between consecutive measurement periods for the LIDAR sensor channels. In response to this signal, histogram data collected in memory 3238 can be sent to a digital signal processor (DSP) (e.g., processor 3236) for analysis, which can include, e.g., applying filters to the histogram data to determine the precise time of receipt of reflected LIDAR pulses. In response to the same signal, memory 3238 can begin accumulating data for the next histogram. In some embodiments, memory 3238 can include two (or more) banks dedicated to storing photon-counts, and photon-count data from alternate measurement periods can be stored in alternate banks.

In some embodiments, the marker signal can also be used as a trigger to initiate a shutter interval of the ambient-light sensor channels. During the shutter interval, a single photon count (accumulated across the shutter interval) can be determined from signals received at each ambient-light sensor channel. The photon count from each ambient-light sensor channel can be sent to the DSP along with the histogram data from the LIDAR sensor channels. The shutter interval can have the same duration as a measurement period or a different (e.g., shorter) duration as desired. In some embodiments, the shutter interval may be dynamically variable, e.g., based on current light levels in one or more of the ambient-light sensor channels, with shorter shutter intervals being selected to avoid saturating the photosensors and longer shutter intervals being selected under low-light conditions.

Continuous rotation during measurement can be used with multispectral sensor arrays as described above. Continuous rotation during measurement can also be used with other types of sensor arrays, such as a LIDAR-only sensor array that includes multiple columns of LIDAR channels (which may be staggered, e.g., as shown in FIG. 1, and/or tuned to different emission frequencies). It should also be understood that continuous rotation is not required. In some embodiments, a rotating ranging/imaging system can rotate and collect data in a stepwise fashion, e.g., rotating to a first measurement angle, collecting data for a measurement period, then rotating to the next measurement angle and repeating the data collection.

3.3. Scanning with Increased Resolution in Ambient-Light Channels

In the example of FIGS. 33A-33B, a scanning ranging/imaging system using a multispectral sensor array produces images with the same spatial resolution for all channel types. For some applications, it may be desirable to increase the spatial resolution of ambient-light sensor channels relative to the number of LIDAR channels. Examples of multispectral sensor arrays that can provide enhanced (increased) spatial resolution for ambient-light sensor channels in both the scanning and non-scanning directions will now be described.

Figure 34:
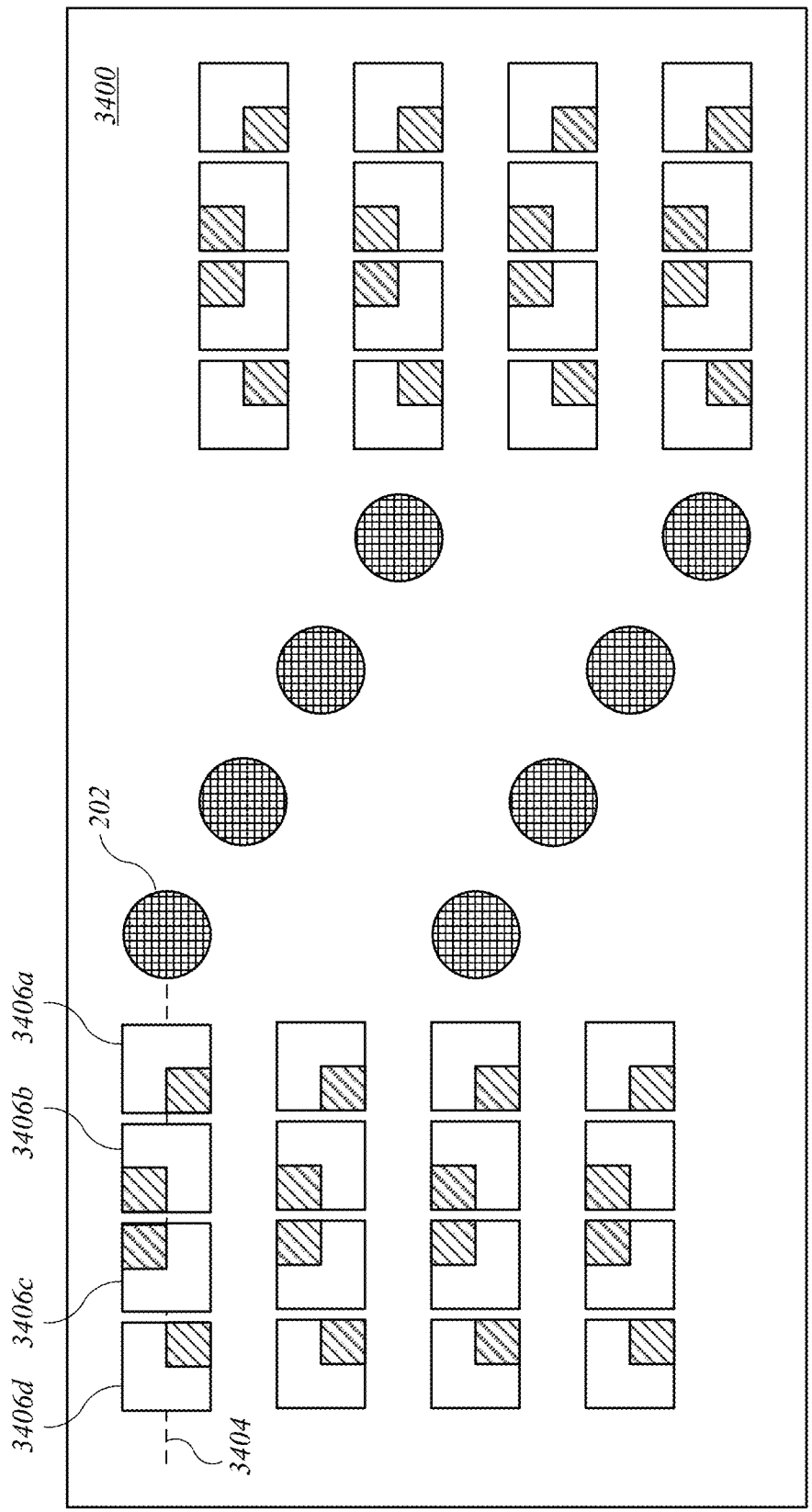
FIG. 34 shows a simplified front view of a sensor array according to some embodiments.

FIG. 34 shows a simplified front view of a sensor array 3400 according to some embodiments. Sensor array 3400 can be a 1D sensor array similar to sensor array 200 of FIG. 2 described above, with LIDAR sensor channels 202, each of which is associated with a row 3404 that includes ambient-light sensor channels 3406a-d. In this example, ambient-light sensor channels 3406a-d each have the same type of optical filter, which can be for example a broad-spectrum visible light filter (e.g., having a passband from about 425 nm to about 700 nm). Various types of optical filters can be used (e.g., polarization filters, color filters, etc.), and in some embodiments ambient-light sensor channels 3406a-d may have no optical filter, in which case the range of wavelengths detectable by ambient-light sensor channels 3406a-d is determined by the wavelength range of the photosensors in ambient-light sensor channels 3406a-d. Ambient-light sensor channels 3406a-d have different "subpixel" apertures (indicated by darkened squares 3410). It is to be understood that darkened squares 3410 indicate an opening in an aperture plane and that the aperture plane is opaque over other portions of the area associated with channels 3406a-d. In this example, each subpixel aperture exposes a different quadrant of the channel area.

In operation, sensor array 3400 can perform scanning as described above with reference to FIGS. 33A and 33B. As ambient-light sensor channels 3406a-d are scanned across an object-space pixel, each channel 3406a-d samples a different "subpixel" (i.e., a subset of the total area of the object-space pixel) using the same type of optical filter. In this manner, an ambient-light image with resolution four times the resolution of LIDAR channels 202 can be generated. Accordingly, ambient-light sensor channels such as channels 3406a-d are also referred to as "enhanced-resolution" ambient-light sensor channels.

Figure 35:
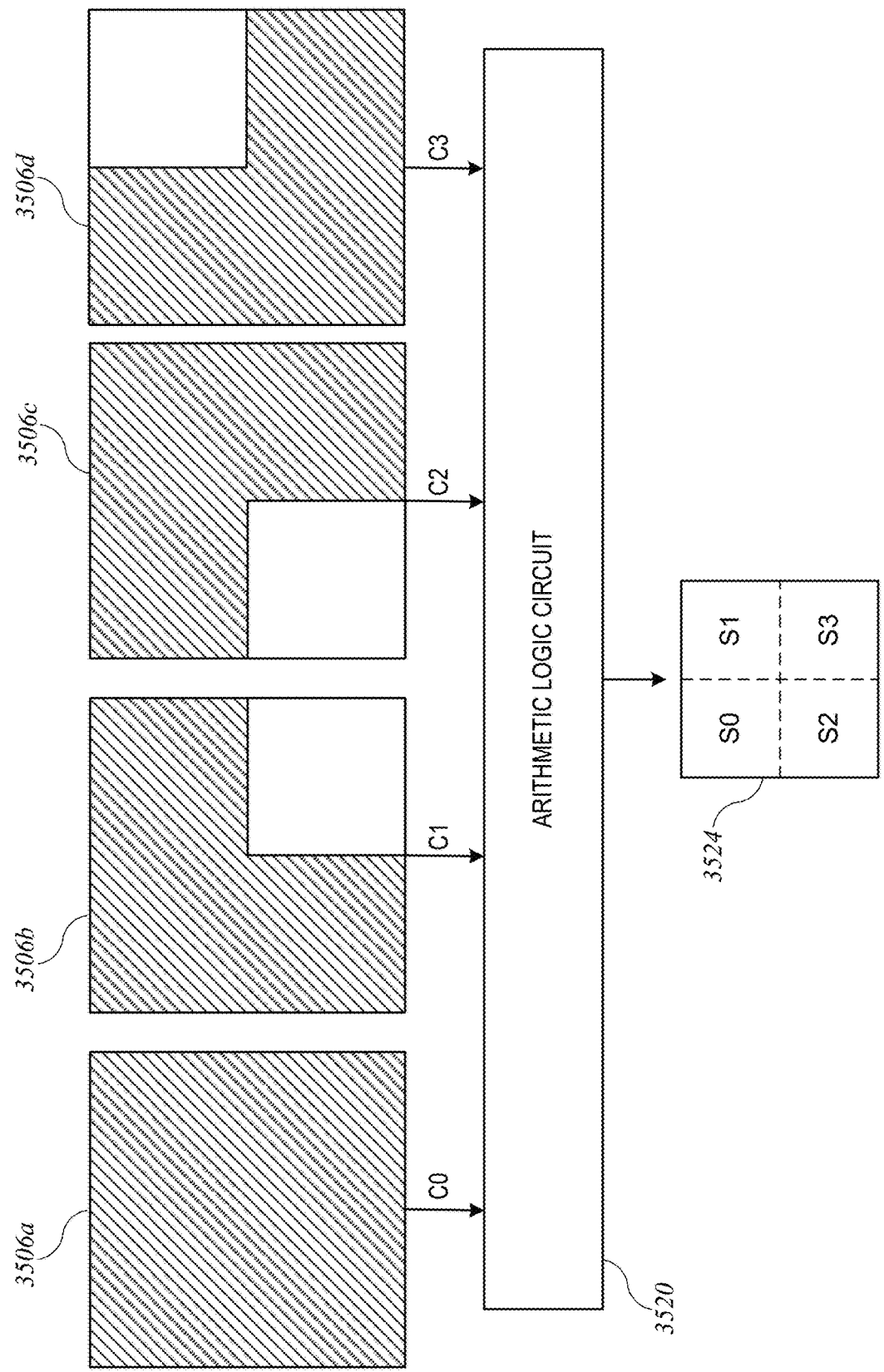
FIG. 35 shows a set of four ambient-light sensor channels with spatially-encoded subpixel apertures according to some embodiments.

In the example of FIG. 34, each ambient-light sensor channel 3406a receives a quarter of the incident light. In other embodiments, a spatial encoding scheme can be used to allow more light in while still providing data with subpixel resolution. For instance, FIG. 35 shows a set of four ambient-light sensor channels 3506a-d with spatially-encoded subpixel apertures according to some embodiments. In this example, the aperture of channel 3506a (darkened area) exposes the full channel area, while the apertures of channels 3506b, 3506c, and 3506d each occlude (white area) a different quadrant of the channel area. Intensity measurements (e.g., photon counts) C0-C3 from channels 3506a-d can be provided to an arithmetic logic circuit 3520, which can implement the following equations to compute subpixel values for the subpixels (S0, S1, S2, S3) of a pixel 3524:

$$S1 = C0 - C3 \qquad (2a)$$

$$S2 = C0 - C2 \qquad (2b)$$

$$S3 = C0 - C1 \qquad (2c)$$

$$S0 = C0 - (C1 + C2 + C3) = C1 + C2 + C3 - 2C0 \qquad (2d)$$

The examples of FIGS. 34 and 35 show subpixels as quadrants of a channel area, which doubles the image resolution in each direction. Other embodiments can provide different increases in resolution. For instance, higher resolution can be achieved by providing more ambient-light channels 3406 or 3506 with smaller (relative to the channel area) subpixel apertures; the upper limit on resolution may be based on the aperture size needed to measure intensity with acceptable accuracy. In some embodiments, the subpixel apertures are arranged so that the subpixels form a square grid (e.g., as shown in FIGS. 34 and 35), but this is not required, and other sampling patterns (including rectangular rather than square patterns) may be used. Further, while the apertures shown in FIGS. 34 and 35 are either squares or six-sided regions (with square indentations at one corner), this is also not required; circular apertures or apertures having other shapes may also be used. It is assumed that all ambient-light sensor channels in a group of ambient-light sensor channels that is used for subpixel sampling have the same type of optical filter so that the same spectral information is sampled at each information and the effect is to increase spatial resolution of the sampling. The particular filter type can be selected as desired, including broad-spectrum filters, narrower bandpass filters, or any other type of optical filter.

In the examples of FIGS. 34 and 35, spatial resolution is increased in both the scanning and non-scanning directions by using subpixel apertures. This approach (with or without spatial encoding) involves using one ambient-light sensor channel per subpixel, e.g., using four ambient-light sensor channels to provide a 4× enhancement in spatial resolution, or sixteen ambient-light sensor channels to provide a 16× enhancement. In other embodiments, sampling resolution in the scanning direction can be increased by using temporal subdivision while sampling resolution in the non-scanning direction can be increased by using subpixel apertures. This can allow, for example, four ambient-light sensor channels to provide a 16× enhancement in spatial resolution.

In some embodiments, temporal subdivision can be provided by using multiple integration registers to accumulate intensity data (e.g., photon counts) for each ambient-light sensor channel, with different integration registers being active during different portions of a shutter interval (shutter intervals are described above with reference to FIG. 33B). Assuming that the sensor array is continuously rotating during the shutter interval, this has the effect of measuring intensity separately for different portions along the scanning direction (referred to for convenience as "column areas") of the area occupied by an object-space pixel.

Figure 36:
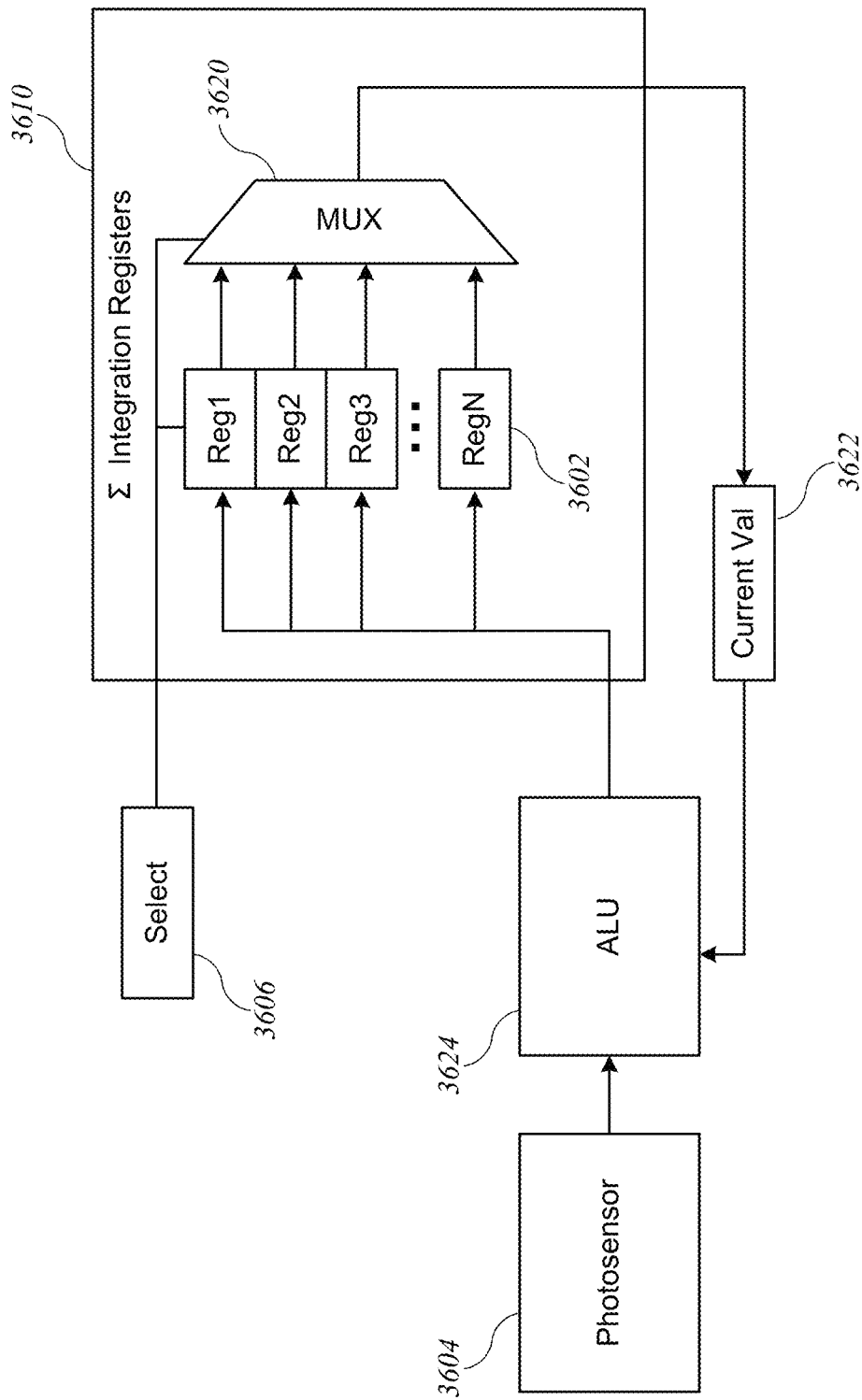
FIG. 36 shows a simplified schematic diagram of a readout data path with multiple integration registers according to some embodiments.

FIG. 36 shows a simplified schematic diagram of a readout data path with multiple integration registers 3602, according to some embodiments. In this example, it is assumed that a photosensor 3604 for a particular ambient-light sensor channel provide data (e.g., a photon count) for each time bin (as described above with reference to FIG. 32), where the time bin is shorter than the shutter interval. The photon count for each time bin is delivered to a selected integration register 3602 in a bank of integration registers 3610, and the selected integration register 3602 adds the photon count received from photosensor 3604 to its current stored value. A selection signal is provided by bank selection logic 3606 to select one of integration registers 3602.

In the example shown, the integration registers operate as follows: at each clock cycle, a multiplexer 3620 is controlled by selection logic 3606 to read out a stored value from a currently selected one of integration registers 3602. The current value 3622 thus selected is delivered to an arithmetic logic unit (ALU) 3624, which also receives a new photon count from photosensor 3604. ALU 3624 adds the new photon count to current value 3622 and delivers the result to integration register bank 3610. Selection logic 3606 selects the current one of integration registers 3602 to receive the new value. Other implementations can also be used.

In some embodiments of a scanning ranging/imaging system (e.g., system 3200 described above) with a number (N) of integration registers, selection logic 3606 divides the shutter interval into a number N of sub-intervals (where each sub-interval includes one or more clock cycles) and selects a different one of integration registers 3602 for each sub-interval, so that each integration register 3602 accumulates a pixel count for a different temporal portion (1/N) of the sub-interval. For instance, selection logic 3606 can use rotary encoder 3274 (as shown in FIG. 32) to define the sub-intervals, or sub-intervals may be defined based on a timer used as a proxy for position based on a known speed of scanning. At the end of the shutter interval, each integration register 3602 can be read out to provide N intensity measurements per pixel.

Figure 37:
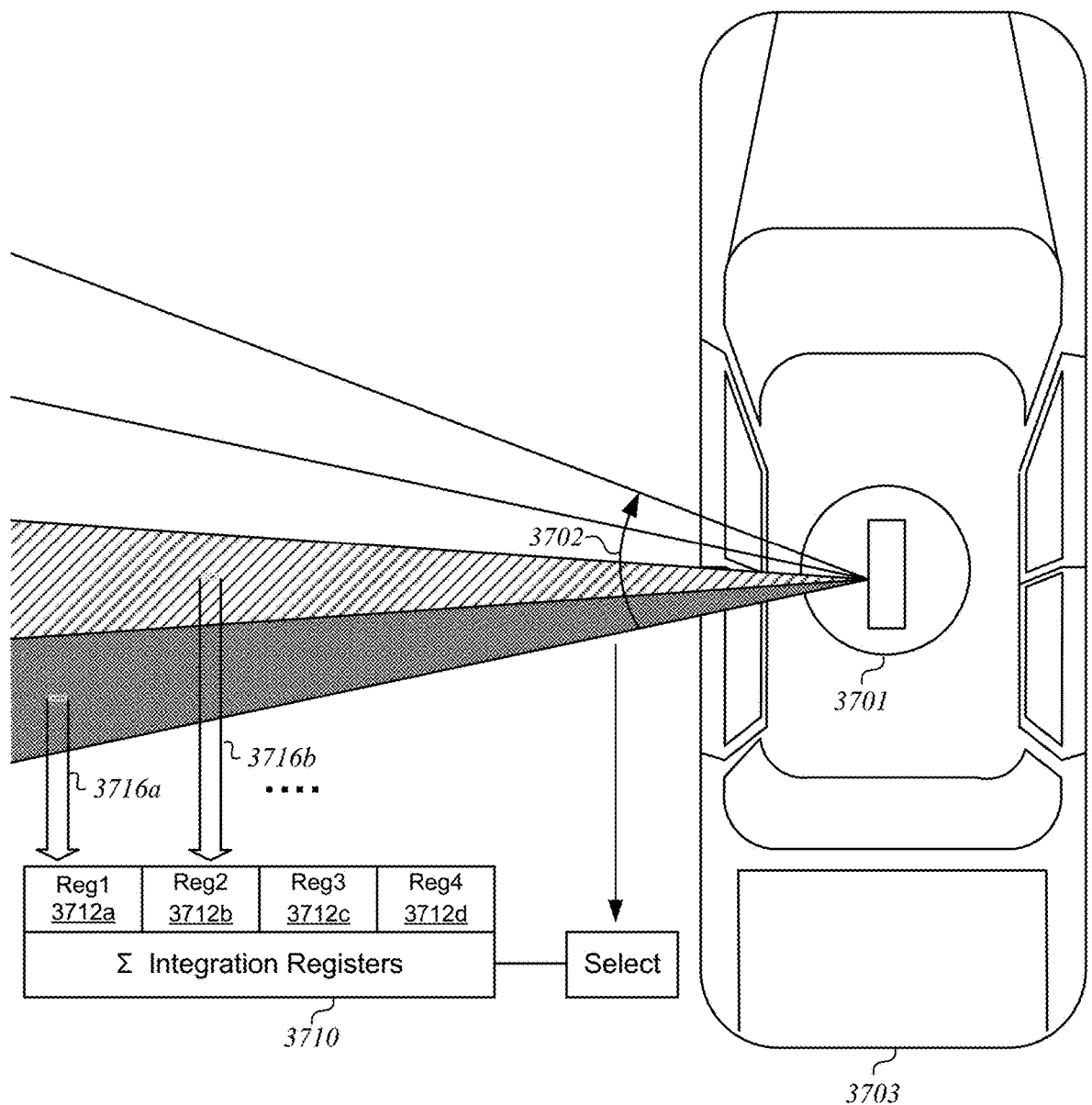
FIG. 37 illustrates ambient light measurement using multiple integration registers according to some embodiments.

Temporally subdividing each shutter interval in this manner can increase the sampling resolution in the scanning direction. FIG. 37 illustrates ambient light measurement using multiple integration registers for a vehicle 3703, according to some embodiments. In this example, a scanning ranging/imaging system 3701 (which may be, e.g., an implementation of system 3200 described above) may be mounted on top of vehicle 3703. Scanning ranging/imaging system 3701 may be configured to rotate around its central axis many times per second (e.g., at 30 Hz) to scan the surrounding area and generate a multispectral image as described above with reference to FIG. 33B.

In embodiments where a scanning ranging/imaging system provides temporal subdivision for ambient-light sensor channels, the spatial resolution of the ambient light image in the scanning direction can be increased based on the number of integration registers. In the example of FIG. 37, an integration-register bank 3710 (which can operate similarly to integration-register bank 3610 described above) includes four integration registers 3712a-d. An increment of angular rotation 3702 corresponding to a shutter interval can be subdivided into four angular increments, during each of which received photon counts are accumulated in a corresponding one of integration registers 3712a-d (as indicated by arrows 3716a, 3716b). This increases the spatial resolution of the ambient-light image by a factor of four in the scanning direction.

Figure 38A:
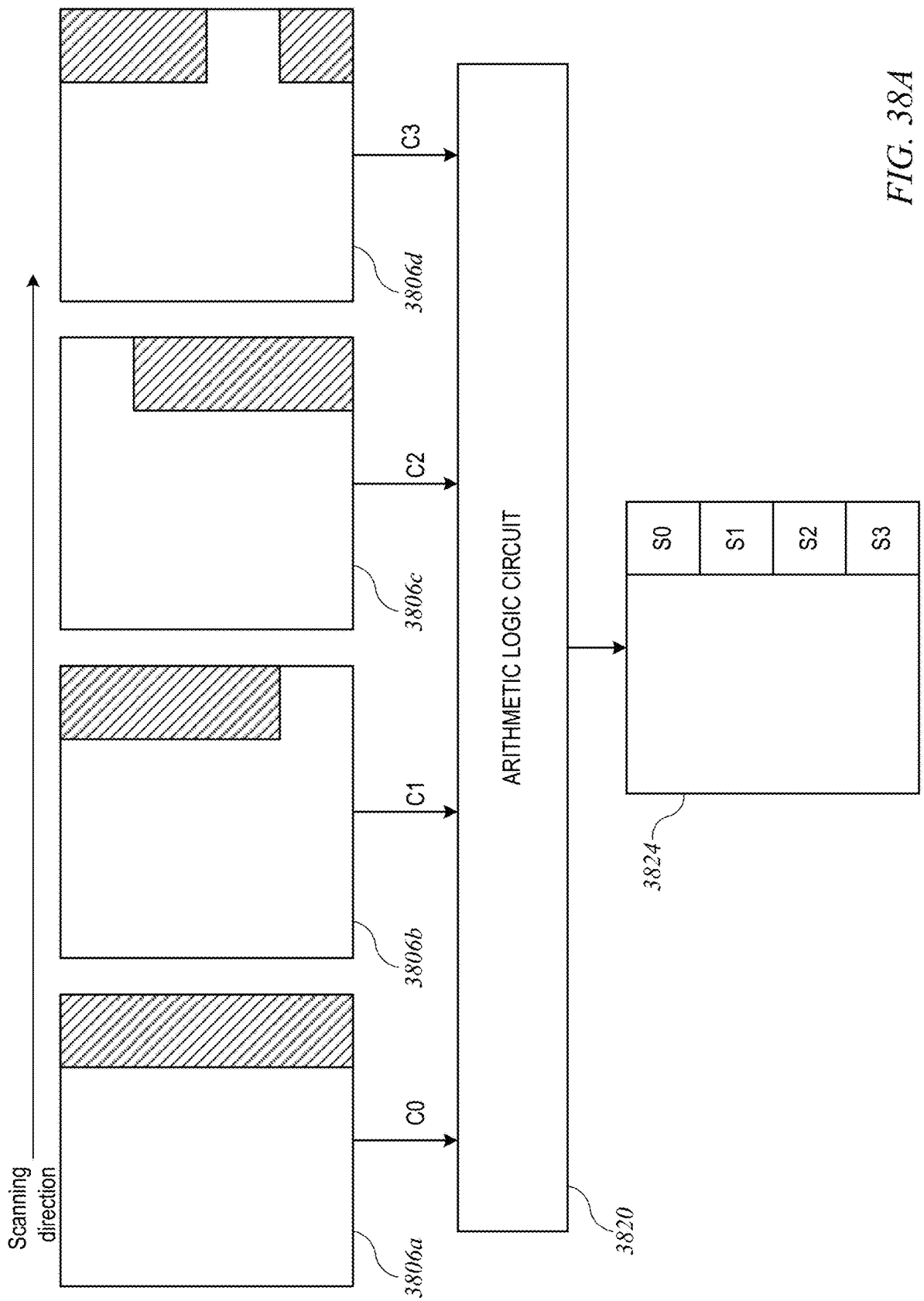
FIG. 38A shows a set of ambient-light sensor channels that provide spatially-encoded subpixel apertures according to some embodiments.

It may also be desirable to increase the spatial resolution of the ambient-light image in the non-scanning direction. In some embodiments, multiple ambient-light sensor channels with spatially-encoded subpixel apertures can be used for this purpose. FIG. 38A shows a set of four ambient-light sensor channels 3806a-d that provide spatially-encoded subpixel apertures according to some embodiments. Ambient-light sensor channels 3806a-d can be used to increase resolution by a factor of four in both the scanning and non-scanning directions. In this example, the aperture (hatched-area) of ambient-light sensor channel 3806a exposes one-quarter of the total channel area, while the apertures of ambient-light sensor channels 3806b-d each expose 3/16 of the total channel area. Intensity measurements (e.g., photon counts) C0-C3 from channels 3806a-3806d can be provided to an arithmetic logic circuit 3820, which can implement the following equations to compute subpixel values for four subpixels (S0, S1, S2, S3) of a pixel 3824:

$$S0 = C0 - C2 \qquad (3a)$$

$$S2 = C0 - C3 \qquad (3b)$$

$$S3 = C0 - C1 \qquad (3c)$$

$$S1 = C0 - (S1 + S2 + S3) = C2 + C3 + C1 - 2C0 \qquad (3d)$$

As shown for pixel 3824, the four subpixels S0, S1, S2, S3 correspond to four pixels occupying different rows in a column area that is one-quarter of the width (in the scanning direction) of the total area of pixel 3824.

Figure 38B:
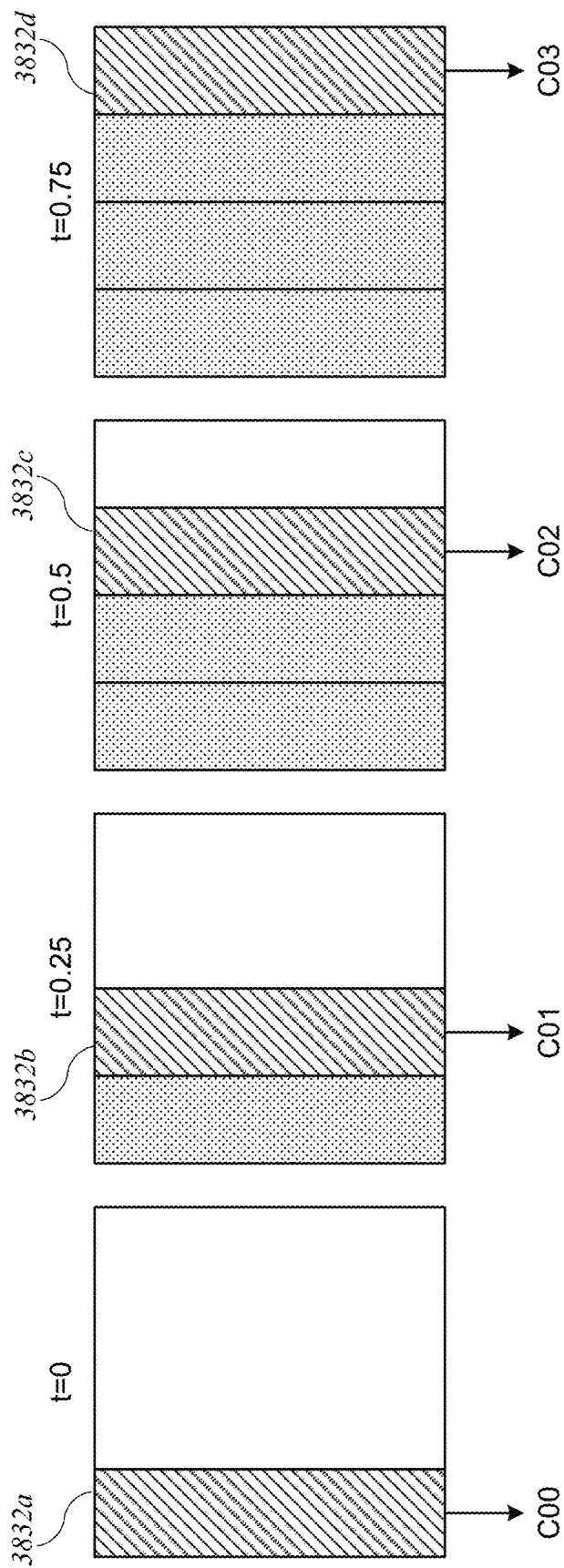
FIG. 38B shows the effect of temporal subdivision using an ambient-light sensor channel of FIG. 38A.

To fully populate subpixels in all column areas of the pixel, temporal subdivision as illustrated in FIG. 37 can be used to enable a single ambient-light sensor channel to sequentially sample different column areas during a shutter interval. FIG. 38B shows the effect of temporal subdivision for ambient-light sensor channel 3806a of FIG. 38A according to some embodiments. In this example the shutter interval is divided into four sub-intervals as described above with reference to FIG. 37. It is assumed that the shutter interval lasts from t=0 to t=1. During a first sub-interval (beginning at t=0), the aperture of ambient-light channel 3806a is exposed to column area 3832a of the object-space pixel 3824, and intensity C00 for column area 3832a is measured. During a second sub-interval (beginning at t=0.25), the aperture of ambient-light channel 3806a is exposed to column area 3832b of object-space pixel 3824, and intensity C01 for column area 3832b is measured. During a third sub-interval (beginning at t=0.5), the aperture of ambient-light channel 3806a is exposed to column area 3832c of object-space pixel 3824, and intensity C02 for column area 3832c is measured. During a fourth sub-interval (beginning at t=0.75), the aperture of ambient-light sensor channel 3806a is exposed to column area 3832d of object-space pixel 3824, and intensity C03 for column area 3832d is measured. Thus, using temporal subdivision of a shutter interval, ambient-light sensor channel 3806a can successively sample each column area of object-space pixel 3824, providing four intensity values. As described above with reference to FIG. 33B, ambient-light sensor channel 3806b can traverse object-space pixel 3824 in the same manner as shown in FIG. 38B, with an offset of one shutter interval (or some other integer number of shutter intervals) to produce four intensity values, and likewise for ambient-light sensor channels 3806c and 3806d. Applying the computational logic of FIG. 38A and Eqs. (3a)-(3d) separately to the four intensity values of each column area provides a total of sixteen subpixel samples using four ambient-light sensor channels. Thus, a combination of spatial and temporal subdivision of object-space pixels can provide an ambient-light image with enhanced resolution in both scanning and non-scanning directions. While the example shown here increases resolution by a factor of four in each direction, other embodiments may provide greater or lesser enhancement as desired.

It will be appreciated that the examples of spatial and temporal subdivision described herein are illustrative. The particular number, shapes, and sizes of apertures assigned to particular ambient-light sensor channels can be varied, and any enhancement factor can be achieved (subject to physical constraints such as photosensor size and the minimum size of an aperture that can be fabricated). Thus, spatial resolution in the scanning and/or non-scanning directions can be enhanced to a desired degree, and enhancement in the scanning and non-scanning directions need not be equal. Enhancement of spatial resolution as described herein can be applied for any type of ambient-light sensor channel, regardless of what optical filters are used.

3.4. Static Ranging/Imaging Systems

Rotating ranging/imaging systems as described above can be implemented using multispectral sensor arrays such as sensor array 200, sensor array 400, or sensor array 500, where sensor channels of different types are arranged along a row that is scanned across the field of view. Other examples of sensor arrays described above (e.g., sensor array 600, sensor array 900) provide 2D arrays of identical multispectral and/or hybrid sensor channels (or pixels). While such arrays can be used in a rotating system, rotation or other scanning motion is not required for a 2D array of multispectral or hybrid pixels to image a two-dimensional field of view. Accordingly, some embodiments provide static (or "solid-state") ranging/imaging systems in which the sensor array does not move in order to perform an imaging operation. It is to be understood that static ranging/imaging system may be mobile. For instance, one or more static ranging/imaging systems may be mounted on a vehicle.

Figure 39:
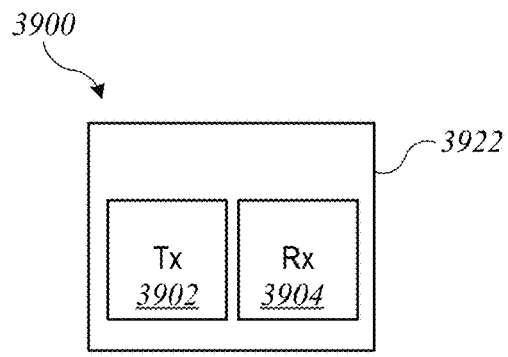
FIG. 39 shows an example of a static imaging/LIDAR system according to one or more embodiments.

FIG. 39 is a side view showing a simplified example of the structure of a static imaging/LIDAR system 3900 according to some embodiments. Imaging/LIDAR system 3900, which is an example of a static ranging/imaging system, can include a housing 3922, which holds emitter module (Tx) 3902 and light sensor module (Rx) 3904. Housing 3922 can be mounted on a vehicle or in any other location where a ranging/imaging sensor is desirable.

Figure 40:
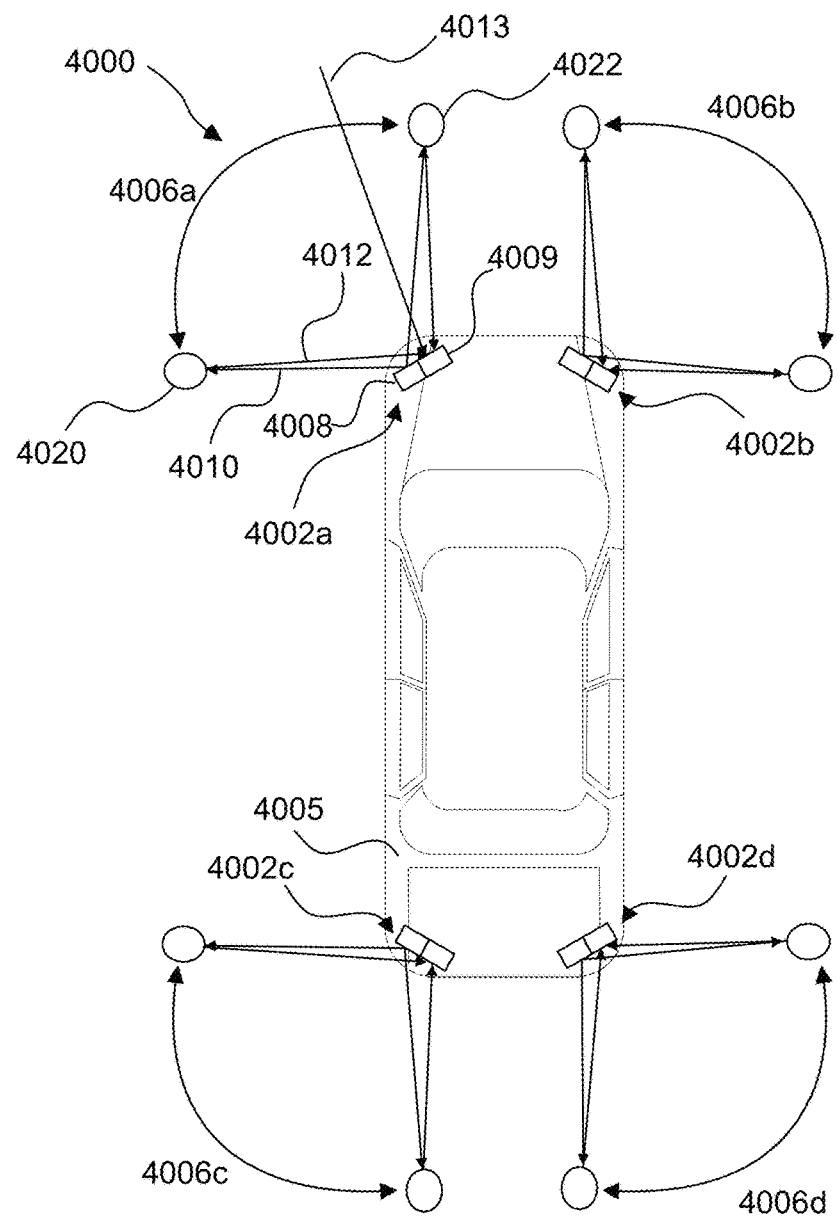
FIG. 40 shows an example automotive application of static imaging/LIDAR systems according to one or more embodiments.
Figure 41:
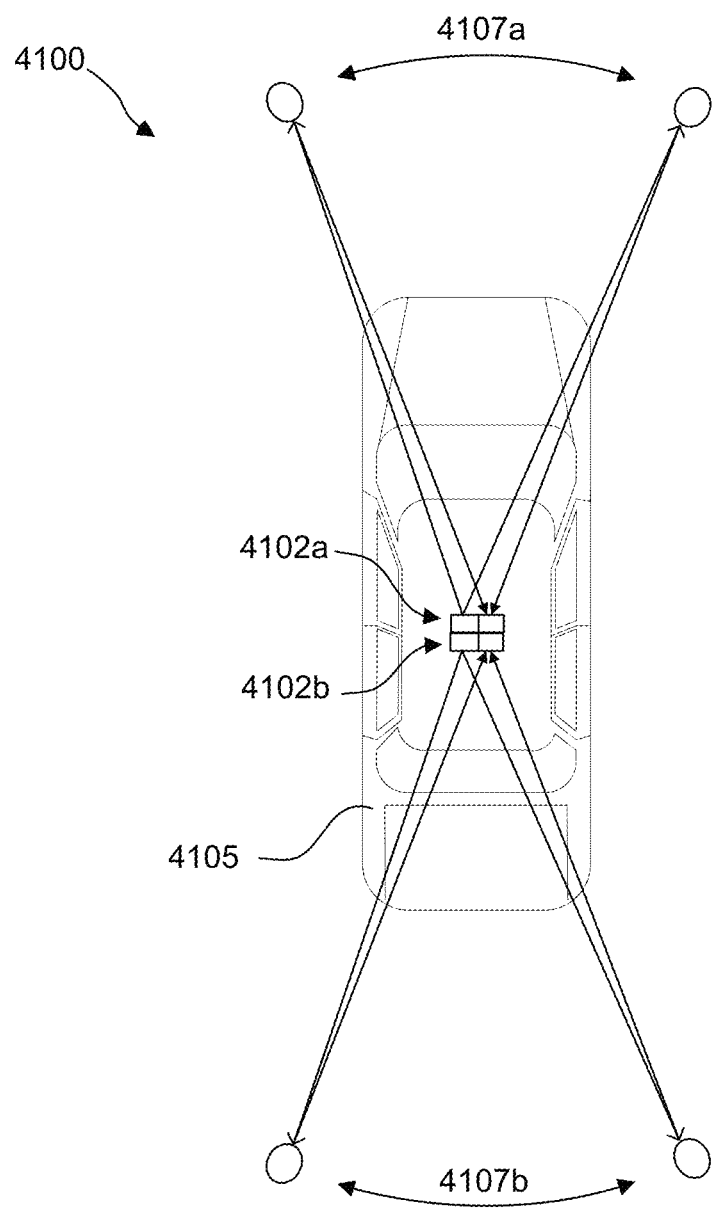
FIG. 41 shows another example automotive application of static imaging/LIDAR systems according to one or more embodiments.

FIGS. 40 and 41 are simple illustrations of exemplary implementations of vehicle-mounted static electronic ranging/imaging systems according to various embodiments. Specifically, FIG. 40 illustrates an implementation 4000 where static ranging/imaging systems 4002a-d are implemented at the outer regions of a road vehicle 4005, such as an automobile; and FIG. 41 illustrates an implementation 4100 where static ranging/imaging systems 4102a-b are implemented on top of a road vehicle 4105. In each implementation, the number of LIDAR systems, the placement of the LIDAR systems, and the fields of view of each LIDAR system can be chosen to obtain a majority of, if not the entirety of, a 360 degree field of view of the environment surrounding the vehicle. Automotive implementations for the LIDAR systems are chosen herein merely for the sake of illustration and the sensors described herein may be employed in other types of vehicles, e.g., boats, aircraft, trains, etc., as well as in a variety of other applications where 3D depth images are useful, such as any of the applications mentioned above with reference to FIG. 32. It should also be understood that static and rotating ranging/imaging systems can be used together and that some ranging/imaging systems may be configured for selectable operation in static or rotating mode.

With reference to FIG. 40, static ranging/imaging systems 4002a-d can be mounted at the outer regions of a vehicle, near the front and back fenders. Static ranging/imaging systems 4002a-d can each be positioned at a respective corner of vehicle 4005 so that they are positioned near the outermost corners of vehicle 4005. That way, static ranging/imaging systems 4002a-d can better measure the distance of vehicle 4005 from objects in the field at areas 4006a-d. Each static ranging/imaging system can face a different direction (possibly with partially and/or non-overlapping fields of views between units) so as to capture a composite field of view that is larger than each unit is capable of capturing on its own. Objects within the scene can reflect portions of light pulses 4010 that are emitted from LIDAR Tx module 4008. One or more reflected portions 4012 of light pulses 4010 then travel back to static ranging/imaging system 4002a and can be received by Rx module 4009, which can be disposed in the same housing as Tx module 4008. Rx module 4009 can include a multispectral sensor array (e.g., as described above) that receives ambient light as well as reflected light from LIDAR Tx module 4008.

In some embodiments, each of static ranging/imaging systems 4002a-d can image its entire field of view (shown as areas 4006a-d, respectively) at one time. In other embodiments, static ranging/imaging systems 4002a-d can electronically scan a scene to capture images of the scene. As used herein, "electronic scanning" refers to collecting data for different portions of a scene at different times without physical movement (e.g., reorientation) of the sensor array; electronic scanning is thus distinguished from the rotating/spinning operations described above. Electronic scanning can be implemented, e.g., by activating different portions of a LIDAR emitter array and corresponding subsets of the LIDAR sensor channels at different times, or by other means, such as chip-based beam steering techniques, e.g., by using microchips that employ one or more MEMS based reflectors, such as a digital micromirror (DMD) device, a digital light processing (DLP) device, or the like to steer light from Tx module 4008 such that it reflects onto different portions of the sensor array at different times. Thus, static ranging/imaging system 4002a can electronically scan between points 4020 and 4022 to capture objects in the field at area 4006a, and likewise for systems 4002b-d and areas 4006b-d.

Although FIG. 40 illustrates four static ranging/imaging systems mounted at the four corners of a vehicle, embodiments are not limited to such configurations. Other embodiments can have fewer or more static ranging/imaging systems mounted on other regions of a vehicle. For instance, static ranging/imaging systems can be mounted on a roof of a vehicle, as shown in FIG. 41. In such embodiments, static ranging/imaging systems 4102a-b can have a higher vantage point to better observe areas 4107a-b around vehicle 4105.

As mentioned, the number of static ranging/imaging systems, the placement of the static ranging/imaging systems, and the fields of view of each static ranging/imaging system can be chosen to obtain a majority of, if not the entirety of, a 360 degree field of view of the environment surrounding the vehicle. Accordingly, each static ranging/imaging system 4002a-d can be designed to have a field of view of approximately 90 degrees so that when all four systems 4020a-d are implemented, a substantial majority of a 360 degree field of view around vehicle 4005 can be observed. In embodiments where each static ranging/imaging system 4002a-d has less than a 90 degree field of view, such as a 45 degree field of view, one or more additional static ranging/imaging systems can be implemented so as to extend the field of view to achieve a combined field of view greater than that of a single static ranging/imaging system.

Figure 42:
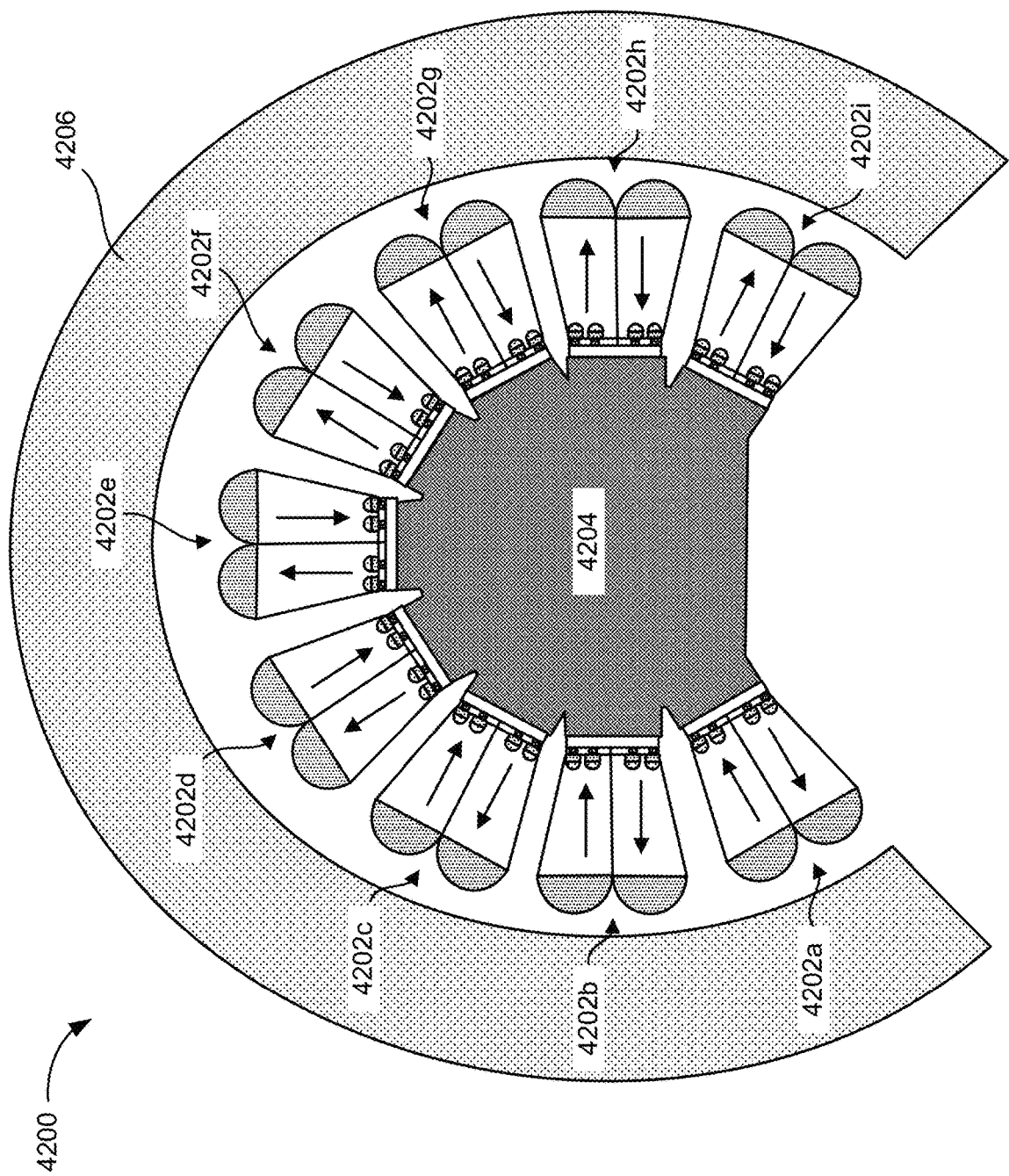
FIG. 42 shows an example of a static imaging/LIDAR system with expanded field of view according to one or more embodiments.

FIG. 42 is a simplified top-down illustration of an exemplary static ranging/imaging system 4200 that includes more than one set of emission and detection systems to achieve an expanded field of view, according to some embodiments of the present disclosure. As shown in FIG. 42, static ranging/imaging system 4200 can include sets of emission and detection systems 420a-i mounted on a central support structure 4204, where each set of emission and detection systems includes a respective light emission system, e.g., light transmission system 1510 of FIG. and light detection system, e.g. light detection system 1540 of FIG. 15. Each set can be arranged radially outward from the center of support structure 4204 and the sets be positioned side-by-side so that their fields of view can abut one another to form a combined field of view 4206 that is a multitude times larger than a field of view for any single set of emission and detection systems alone. The multiple emission detection systems may all be synchronized and controlled by a common LIDAR controller such that the end user interacts with what appears to be a single system. In addition, the individual emission detection systems may all be aligned to a fixed pixel grid so that the data simulate a wider field of view, higher resolution system operating on a fixed field of view grid.

Figure 43:
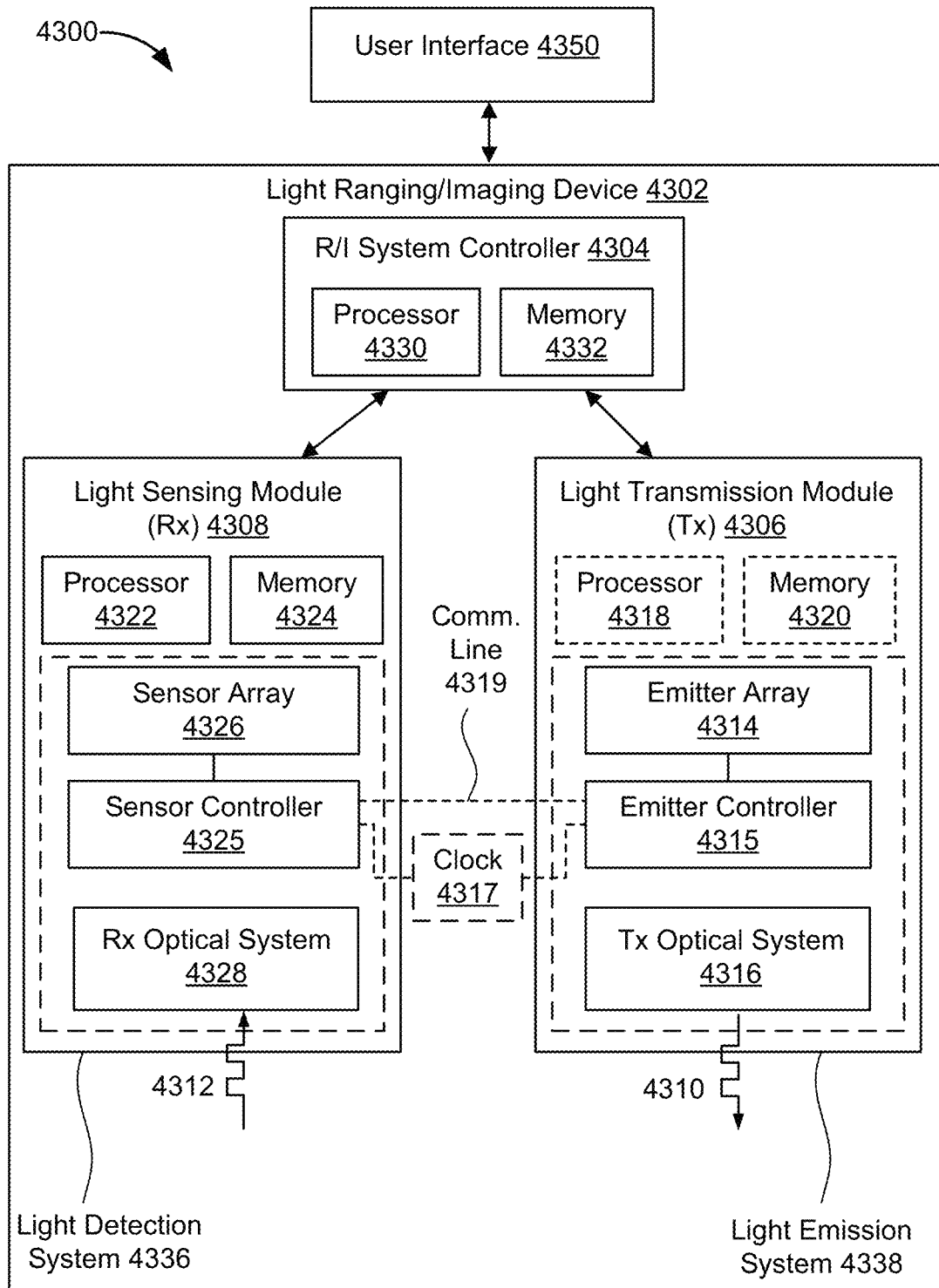
FIG. 43 illustrates a block diagram of a static imaging/LIDAR system according to one or more embodiments.

FIG. 43 illustrates a block diagram of an exemplary static ranging/imaging system 4300 according to some embodiments of the present disclosure. Static ranging/imaging system 4300 can include a light ranging/imaging device 4302 and a user interface 4350. Light ranging/imaging device 4302 can include a ranging/imaging system controller 4304, a light transmission (Tx) module 4306 and a light sensing (Rx) module 4308. Ranging data can be generated by light ranging/imaging device 4302 by transmitting one or more light pulses 4310 from the light transmission module 4306 to objects in a field of view surrounding light ranging/imaging device 4302. Reflected portions 4312 of the transmitted light are then detected by light sensing module 4308 after some delay time. Based on the delay time, the distance to the reflecting surface can be determined. Other ranging methods can be employed as well, e.g. continuous wave, photodemodulation, Doppler, and the like. Spectral image data can be generated by light ranging/imaging device 4302 by operating ambient-light sensor channels included in sensor array 4308 in a photon-counting mode.

Light transmission module 4306 includes an emitter array 4314, which can be a one-dimensional or two-dimensional array of emitters, and a Tx optical system 4316, which when taken together with emitter array 4314 can form a light emission system 4338 similar to light transmission system 1510 of FIG. 15. Tx module 4306 can further include an optional processor 4318 and memory 4320, although in some embodiments these computing resources can be incorporated into ranging/imaging system controller 4304. In some embodiments, a pulse coding technique can be used, e.g., Barker codes and the like. In such cases, memory 4320 can store pulse-codes that indicate when light should be transmitted. In some embodiments, the pulse-codes are stored as a sequence of integers stored in memory.

Light sensing module 4308 can include a sensor array 4326, which can be, e.g., any of the 2D multispectral sensor arrays described above, such as sensor array 600 or sensor array 900.

In some embodiments, light ranging/imaging device 4302 can be operated in an electronic scanning mode, in which at least a LIDAR image of a scene is captured by activating only a subset of emitters at a time and by reading out only a corresponding subset of LIDAR sensor channels simultaneous with the firing of the emitters. Different subsets of emitters can be activated at different times with corresponding subsets of LIDAR channels being read out simultaneously; all emitters can be eventually activated and all the LIDAR channels in the sensor array can be read out through one emission cycle. As an example, an emitter array can emit light by activating one column at a time and in sequential order from left to right for each emission cycle while the sensor array can be configured to read out the corresponding LIDAR channels in a corresponding sequence. Ambient light channels can be read out synchronously with the LIDAR channels corresponding to the same multispectral pixels or in some other manner (e.g., all ambient-light channels can be read out at the same time).

To facilitate electronic scanning, some embodiments of static ranging/imaging systems can include one or more components to synchronize the emitting and sensing of light. In some embodiments, light detection system 4336 can include a sensor controller 4325 coupled to sensor array 4326 and configured to control the operation of sensor array 4326. Sensor controller 4325 can be any suitable component or group of components capable of selecting one or more photosensors to sense light, such as an ASIC, microcontroller, FPGA, or any other suitable processor coupled to a selecting circuit, e.g., a multiplexer. Likewise, light emission system 4338 can include an emitter controller 4315 coupled to emitter array 4314 and configured to control the operation of sensor array 4326. Emitter controller 4315 can also be any suitable processor mentioned above for sensor controller 4325 and include one or more driving components for operating emitter array 4314.

In some embodiments, sensor controller 4325 and emitter controller 4315 are synchronized such that the sequence of light emissions in emitter array 4314 are synchronized with the sequence of reading out photosensors (for all sensor types or just the LIDAR channels) in sensor array 4326. As an example, both sensor controller 4325 and emitter controller 4315 can be coupled to a clock 4317 so that both controllers can operate based on the same timing scheme. Clock 4317 can be an electrical component that generates a specific signal that oscillates between a high and low state at a certain speed for coordinating actions of digital circuits. Optionally, sensor controller 4325 and emitter controller 4315 can include their own clock circuits for coordinating their own actions. In such embodiments, sensor controller 4325 and emitter controller 4315 can be communicatively coupled together via a communication line 4319 such that sensor controller 4325 can synchronize its clock with emitter controller 4315. That way, sensor controller 4325 and emitter controller 4315 can operate sensor array 4326 and emitter array 4314, respectively, in synchronization to effectuate image capture.

In some further embodiments, instead of, or in addition to, sensor controller 4325 and emitter controller 4315, ranging/imaging system controller 4304 can be configured to synchronize the operation of light sensing module 4308 and light transmission module 4306 such that the sequence of light emissions by emitter array 4314 are synchronized with the sequence of sensing light by sensor array 4326. For instance, ranging/imaging system controller 4304 can instruct emitter array 4314 of light transmission module 4306 to emit light by activating one column at a time and in sequential order from left to right for each emission cycle, and correspondingly instruct sensor array 4326 in light sensing module 4308 to sense light one column at a time and in the same sequential order. In such embodiments, ranging/ imaging system controller 4304 can have its own clock signal on which it bases its sequencing instructions to light sensing module 4308 and light transmission module 4306. It is to be appreciated that other forms of sequencing for light detection are envisioned and that such sequences are not limiting. Further, the collection of (intensity) data for ambient-light sensor channels for a given multispectral pixel can be but need not be timed to coincide with operation of the LIDAR sensor channel for that multispectral pixel.

Light ranging/imaging system 4300 can also include other components, which can be similar to corresponding components in FIG. 32. Signal processing by processor 4322 and memory 4324 can be similar to processing operations described above with reference to FIG. 32. User interface 4350 and operations thereof can be similar to the user interface described above with reference to FIG. 32. Further, any of the ranging/imaging systems described herein can interact with other systems (e.g., a vehicle control unit) rather than directly (or indirectly) with a user; such systems can control operations of the ranging/imaging system by exchanging appropriate control instructions, data, or other signals with ranging/imaging system controller 4304.

3.5. Operation of Static Ranging/Imaging System

As described above, imaging operations with static ranging/imaging system 4300 can be performed in various modes. In one mode, referred to as "full frame" mode, all sensor channels in the array (or all sensor channels of a given type) can be operated concurrently. In another mode, referred to as "electronic scanning" mode, different subsets of channels may be operated at different times. For example, as described above, Tx module 4306 can be operated to emit light that is reflected onto different portions of the sensor array in Rx module 4308 at different times, e.g., by activating different emitters within Tx module 4306 or by using the same emitters in combination with MEMS-based beam steering components (e.g., MEMS mirror galvanometers, sometimes referred to as "galvos") to control the direction of the emitted light. Different subsets of the LIDAR sensor channels can be selectively activated when light is being aimed (e.g., by selective emission and/or steering) toward those channels.

Particular ambient-light sensor channels (or particular ambient-light photosensors in multispectral or hybrid sensor channels) can also be operated in either full-frame or electronic scanning modes. In full-frame mode, all ambient-light sensor channels can be activated at the same time, or sensor channels of different types can be activated at different times. In electronic scanning mode, different subsets of ambient-light sensor channels corresponding to different areas within the sensor array can be activated at different times. For instance, the ambient-light sensor channels corresponding to a particular group of multispectral pixels may be activated when the corresponding subset of LIDAR sensor channels is activated, or the ambient-light sensor channels corresponding to a particular group of multispectral pixels may be activated at a time when the corresponding subset of LIDAR sensor channels is not active.

In some embodiments, the operating mode for LIDAR and/or ambient-light sensor channels may be selectable. Further, the LIDAR and ambient-light sensor channels can be operated in different modes. For instance, the LIDAR channels may operate in an electronic scanning mode while the ambient-light sensor channels are operated in full-frame mode to capture one spectral image for each scanning period.

In any of these and other operating modes, data can be gathered for each sensor type for each multispectral pixel in the sensor array. Buffering can be used to collect data from different channels or sensor types that correspond to the same multispectral pixel. Thus, as with the rotating ranging/imaging systems described above, an image comprising a set of multispectral image pixels across a field of view can be obtained.

4. Processing of Multispectral Images

As described above, both rotating and static ranging/imaging systems can produce multispectral images of a field of view. A multispectral image can include an array of multispectral image pixels (which can be a rectilinear array) and can include, for each image pixel, depth information extracted from one or more LIDAR sensor channels as well as information extracted from ambient light sensors, such as intensity values for various bands within the light spectrum (including visible, infrared and ultraviolet light), intensity of polarization-filtered light, and/or other measurements as described above. Multispectral imaging provides a rich data set for a given location within a region being imaged. For instance, for sensor array 400 of FIG. 4, the data set for a given image pixel can include: distance to the imaged object (i.e., any object that happens to be visible in the particular direction associated with the image pixel), color characteristics of the imaged object across the visible and near-IR spectrum (e.g., intensity or amount of light collected within different wavelength bands), polarization characteristics, and absorption characteristics. Other combinations of per-pixel image data are also possible, depending on the particular combination of sensor channel types included in the sensor array.

Figure 44:
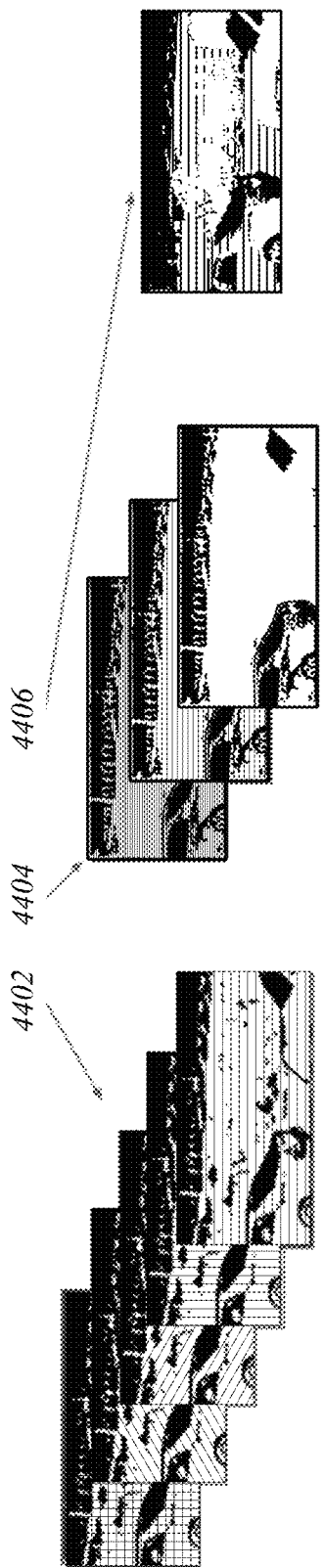
FIG. 44 shows an example of hyperspectral images that can be acquired using a multispectral ranging/imaging sensor array according to one or more embodiments.

By way of example, FIG. 44 shows an example of multispectral image data that can be acquired for a region 4402, using any of the rotating or static multispectral ranging/imaging systems described above (or other similar systems). Image group 4402 includes spectral images acquired at different wavelength bands. Image group 4404 includes polarization images (intensity of light having a particular polarization direction). Image group 4406 represents depth images based on data provided by the LIDAR sensor channels.

The images in image groups 4402, 4404, 4406 can be inherently registered with each other, due to the fixed spatial arrangement of the different sensor types. In the case of sensor arrays in rotating ranging/imaging systems, the array can be arranged and operated such that all of the sensors in a given row image the same area in turn (e.g., as described above), providing trivial (or inherent) registration. In the case of 2D multispectral sensor arrays in static ranging/imaging systems, the image pixel can be defined based on the area occupied by each group of sensors of different types. For instance, in sensor array 600 of FIG. 6, each hybrid sensor channel 602 can correspond to an image pixel, and in sensor array 900, each multispectral pixel 1020 (shown in FIG. 10) can correspond to an image pixel. In these examples, different sensor types may sample different locations within the multispectral image pixel due to (small) spatial offsets between the sensors. In some embodiments, this offset can be ignored, and the data can be treated as if all sensors were located at the center of the image pixel. Alternatively, offset compensation can be applied if desired, e.g., by interpolating from nearby sensor locations to the geometric center of each image pixel.

In some embodiments, the sensor-array ASIC can stream pixel data to another system component (or another device) as it is acquired, and all image processing can be performed by the other system component. In other embodiments, the sensor array ASIC can include an "onboard" data buffer capable of accumulating data for different image pixels (including a single channel per pixel or multiple channels per pixel). Depending on implementation the onboard data buffer can hold data for any number of multispectral image pixels, from just one or two pixels up to the full image size. The buffered pixel data can be used to reconstruct a "local image" of the scene (which may be a 1D or 2D image and may be smaller than the full image size), and the processor in the sensor array ASIC or external to the sensor array can perform various image processing operations on the local image, including both per-pixel analysis and local or full scene inference. The size of the onboard data buffer can be varied as desired, depending on how much data is accumulated and what functionality is desired. Thus, image processing and image analysis operations can be performed on-chip or off-chip as desired.

In some embodiments, multispectral image analysis can include training an automated classifier using machine learning algorithms and a training set of images that include known (and labeled) objects. The machine learning algorithms can include artificial neural networks or other classifiers (e.g., classifiers based on classical statistical techniques). Once trained, one or more automated classifiers can be deployed either within the sensor array ASIC (e.g., in a machine-learning coprocessor) or in a client system that receives data from the sensor array ASIC.

A variety of image-processing and image-analysis operations can be performed on a multispectral image. Examples will now be described.

4.1. Per-Pixel Analysis of Multispectral Image Pixels

Figure 45:
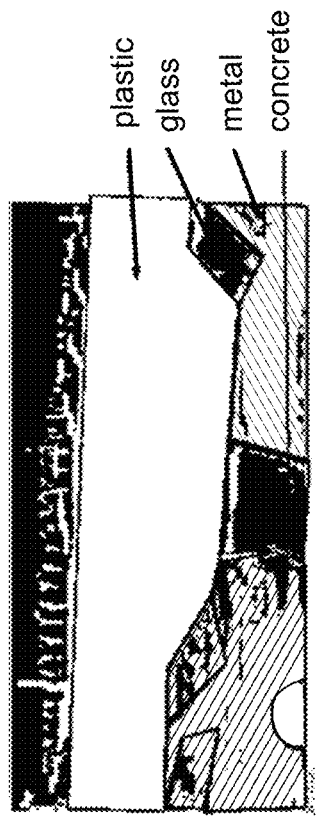
FIG. 45 shows an example of an image that has been annotated to identify materials contained therein.

In some embodiments, a rich per-image-pixel data set can enable sophisticated analysis, such as identifying materials in an image. By way of illustration, FIG. 45 shows an example of an image that has been annotated to identify materials contained therein. In some instances, different materials may have similar color to a human eye (e.g., a green car and a green bush), but the materials may have subtly different spectral signatures, different polarization characteristics and/or absorption signatures that make them distinguishable based on per-image-pixel analysis. Combining spectral response information from multiple ambient-light channels (including any absorption-band channels) with the depth channel data can enable classification of hard, soft, and diffuse objects such as rock, plants, asphalt, metal, glass, water, skin, fur, clothing, and various gases and particulates like methane, carbon dioxide, black carbon, etc. Multispectral pixel information could also be used to classify different narrow and broad spectrum light sources to provide other environmental cues, such as what type of illumination is present based on spectral patterns of the pixels. Such classification can be performed per-pixel and in real time. In some embodiments, an artificial neural network or other machine-learning system (which can be implemented on-sensor or off-sensor as desired) can be trained to classify materials from multispectral image data based on a combination of depth characteristics, color characteristics, polarization characteristics, and/or absorption characteristics; hand-annotated images can be used as training input. Once trained, the machine-learning system can make real-time identifications of what types of objects are present in the environment and where.

As another example, real time polarimetric imaging can occur in the sensor processor and may combine data from a plurality of polarization channels to calculate the polarization angle and/or the degree of polarization. Polarimetry can be used, for instance, to provide real time glare removal on vehicle windshields or water surfaces, to enhance contrast in shadowed regions, to enhance imaging in the presence of haze or other atmospheric obscurants, and/or to provide real time identification and classification of water, ice, and other polarizing substances in the environment or more specifically on the road surface.

4.2. System for Scene Inference from Multispectral Images

In some embodiments, scene-level inferences can be extracted by analyzing the multispectral image data across a set of image pixels, which can include anywhere from two pixels to the entire image field of view. Scene-level inference can be performed on-chip, using an onboard data buffer in the sensor ASIC, and/or off-chip, e.g., in another system component or separate device. Many types of scene-level inferences can be implemented.

For example, identification of distinct objects in a field of view can be based on identifying changes in color, polarization, and/or distance. In some embodiments, results of a per-pixel analysis of likely material composition can be used to identify objects based in part on the likely material composition. Objects can be further assessed to determine distance, composition, and the like. Combined with the depth information from the multispectral pixels, this can provide reliable identification of what is in the image (e.g., a car, a wall, a bush, a roadway) and where. It is contemplated that machine-learning systems may be enabled to determine with high reliability what types of objects are present in the environment and where, based on multispectral image data (including depth data) acquired using ranging/imaging systems of the kind described herein. Such information has a variety of uses and applications, including but not limited to driver-assistance and/or autonomous-vehicle technology.

Other inferences can also be made. For example, in some instances, the sun or the moon may be identifiable as objects in the field of view. Using multispectral image data, the sun and the moon can be identified and distinguished from each other, which may provide cues as to time of day and/or general illumination conditions. Even if the sun or moon is not in the field of view, the different spectral properties of different light sources may provide cues as to whether the ambient illumination is dominated by natural sunlight (indicative of daytime hours or outdoor conditions) versus artificial illumination (indicative of night or indoor conditions such as a tunnel or parking garage). As another example, the xenon-based or LED headlights of modern cars can be distinguished from sodium-vapor streetlights. As yet another example, LED-based traffic signals emit relatively narrow (~50 nm) spectra of red, yellow, or green, and these spectra can be distinguished from broader spectra of objects such as stop signs, green grass, or yellow lane lines.

5. Additional Embodiments

While the invention has been described with reference to specific embodiments, those skilled in the art with access to the present disclosure will appreciate that numerous variations and modifications are possible. For instance, multispectral sensor arrays of the kind described herein can be fabricated to include any number of rows and any number of sensor channels per row. (The terms "row" and "column" are used to distinguish two dimensions of a sensor array, particularly in the context of arrays used in scanning mode, and are not intended to imply any particular spatial orientation of the array.) The particular construction of sensor channels, including channel-specific micro-optical elements can be varied. The combination of ambient-light sensing channels used in each row can be modified as desired, and in some embodiments different rows may have different combinations of ambient-light sensing channels. Further, the ambient light-sensing channels are not limited to the specific examples given above; other types of optical filters can be used to create a variety of ambient-light sensing channels that can be used to collect image data.

The term "ambient-light sensing channel" is used herein to indicate that a sensor channel measures light intensity (as opposed to timing or other ranging data). Such channels may provide useful data in the absence of intentional illumination emitted from the senor system. However, this does not preclude intentional illumination of a field of view. For instance, a white light may be directed toward the field of view (e.g., from a car's headlights or camera flash). As another example, in applications using absorption channels, light having wavelengths encompassing the absorption band can be directed toward the field of view, and absence of light in the absorption channel can indicate that a substance in the field is absorbing the light.

In addition to ambient-light sensing channel(s), a sensor array described above may include one or more LIDAR sensor channels (and/or other depth-sensing channels) that providing timing data (e.g., histograms as described above) or other data usable to derive distances to objects in the field of view. LIDAR sensor channels can operate at various wavelengths, including near infrared, shortwave infrared (e.g., 1600 nm), midwave infrared, and/or longwave infrared (e.g., up to 15 μm). Further, in some embodiments additional sensor channels (e.g., LIDAR sensor channels) can be included at locations between sensor rows, or there may be some sensor rows that do not include a LIDAR sensor channel (or other depth-sensing channel), and images from different sensor channels (or sensor types) can but need not have the same resolution. Multispectral arrays can be row-based (or "1D") arrays operable in a scanning mode to image a field of view, or they can be 2D arrays with multispectral sensor channels or multispectral pixels.

Sensor arrays of the kind described herein can be incorporated into a variety of sensing systems, including but not limited to combined imaging/LIDAR systems as described above. Combined imaging/LIDAR systems can be implemented using rotating and/or static platforms as described above and can be used in any application where it is desirable to concurrently collect ambient-light and ranging data.

Systems described herein can produce multispectral image data that can include both light intensity data for various portions of the light spectrum (including visible, infrared, and ultraviolet with wide and/or narrow passbands as desired; light having various polarization states; and other examples described above) and depth information across a field of view (which can be as wide as desired, up to 360 degrees in some embodiments). Images captured by different sensor types (including ranging sensors such as LIDAR) can be inherently registered with each other as a result of the alignment of different sensor types on a sensor array. In some embodiments, this inherent registration can facilitate the generation of multispectral pixel data for an image.

Multispectral image data can be analyzed using a variety of computer-implemented algorithms operating on any portion of the data. In some embodiments, the multispectral image data can be used to generate images for display to a user, which can include directly rendering the image data and/or rendering an image of a scene (or portions thereof) based on algorithmic inferences from the data. While examples described above relate to vehicle navigation and/or driver assistance, the invention is not limited to any particular data analysis or to any particular application of multispectral image data.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to explain the principles of the invention and its practical applications to thereby enable others skilled in the art to us the invention in various embodiments and with various modifications as are suited to the particular use contemplated. Thus, although the invention has been described with reference to specific embodiments, the invention should be understood as being limited only by the following claims.

What is claimed is:

1. A ranging and imaging system comprising:
a device that includes a sensor array, the sensor array having a plurality of sensor channels including one or more LIDAR sensor channels and one or more ambient-light sensor channels, wherein the sensor channels are arranged in a plurality of sensor rows, each sensor row including:
at least one LIDAR sensor channel; and
a set of one or more ambient-light sensor channels, wherein each ambient-light sensor channel includes:
a channel input aperture;
a photosensor; and
a channel-specific optical filter that selectively passes light having a channel-specific property to the photosensor, and
a bulk optic module disposed in front of the sensor array and configured to direct light onto the sensor array to form an image of a field of view, the image including ambient-light intensity from the ambient-light sensor channels and depth information from the LIDAR sensor channels.

2. The ranging and imaging system of claim 1 wherein the LIDAR sensor channels and the ambient-light sensor channels are arranged in a focal plane of the bulk optic module and displaced laterally from each other.

3. The ranging and imaging system of claim 1 wherein the sensor channels of the plurality of sensor channels have non-overlapping fields of view in a far field.

4. The ranging and imaging system of claim 1 wherein the sensor array is formed in a single integrated circuit.

5. The ranging and imaging system of claim 1 further comprising:
a controller to operate the sensor array to generate image data for a field of view.

6. The ranging and imaging system of claim 1 wherein the set of one or more ambient-light sensor channels in each sensor row includes a first ambient-light sensor channel that is sensitive to a visible-light portion of the electromagnetic spectrum.

7. The ranging and imaging system of claim 1 wherein the set of one or more ambient-light sensor channels in each sensor row includes:
a first ambient-light sensor channel that is sensitive to red light;
a second ambient-light sensor channel that is sensitive to green light; and a third ambient-light sensor channel that is sensitive to blue light.

8. The ranging and imaging system of claim 1 wherein at least some of the ambient-light sensor channels further include a channel-specific micro-optic element having a prescription that is based at least in part on the channel-specific optical filter.

9. The ranging and imaging system of claim 1 further comprising:
a plurality of channel-specific micro-optic elements, each channel-specific micro-optic element being disposed in front of a different one of the sensor channels and having an optical prescription that is different for different sensor channels.

10. The ranging and imaging system of claim 9 wherein the optical prescription for a particular one of the channel-specific micro-optic elements is based at least in part on an optical property of the bulk optic module.

11. The ranging and imaging system of claim 9 wherein the bulk optic module exhibits chromatic aberration and wherein the optical prescription for at least some of the sensor channels is based in part on the channel-specific optical filter and in part on the chromatic aberration of the bulk optic module.

12. The ranging and imaging system of claim 9 wherein the bulk optic module has a curved focal plane and wherein the optical prescription of each of the channel-specific micro-optic elements compensates for an offset between a location of the aperture and a corresponding location on the curved focal plane.

13. The ranging and imaging system of claim 12 wherein the optical prescription of each channel-specific micro-optic element is a function of a radial distance in an aperture plane from an optical axis of the bulk optic module to the corresponding aperture.

14. The ranging and imaging system of claim 12 wherein the channel-specific micro-optic elements disposed in front of different apertures have optical prescriptions with different focusing powers.

15. The ranging and imaging system of claim 12 wherein the channel-specific micro-optic elements disposed in front of different channels have different standoff distances from the aperture plane.

16. The ranging and imaging system of claim 1 wherein each of the ambient-light sensor channels and the LIDAR sensor channels includes one or more single-photon avalanche diodes (SPADs).

* * * * *